(12) United States Patent
Sugizaki

(10) Patent No.: US 11,776,976 B2
(45) Date of Patent: Oct. 3, 2023

(54) ELECTROMAGNETIC WAVE PROCESSING DEVICE

(71) Applicant: SONY SEMICONDUCTOR SOLUTIONS CORPORATION, Kanagawa (JP)

(72) Inventor: Taro Sugizaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 275 days.

(21) Appl. No.: 16/770,914

(22) PCT Filed: Dec. 7, 2018

(86) PCT No.: PCT/JP2018/045037
§ 371 (c)(1),
(2) Date: Jun. 8, 2020

(87) PCT Pub. No.: WO2019/124114
PCT Pub. Date: Jun. 27, 2019

(65) Prior Publication Data
US 2020/0335540 A1 Oct. 22, 2020

(30) Foreign Application Priority Data
Dec. 21, 2017 (JP) ................ 2017-244942

(51) Int. Cl.
*H01L 27/146* (2006.01)
(52) U.S. Cl.
CPC ............ *H01L 27/14621* (2013.01); *H01L 27/14625* (2013.01); *H01L 27/14627* (2013.01)
(58) Field of Classification Search
CPC ......... H01L 27/14621; H01L 27/14625; H01L 27/14627; H01L 27/14623;
(Continued)

(56) References Cited

U.S. PATENT DOCUMENTS

| 2008/0159658 | A1 | 7/2008 | Yun |
| 2008/0170143 | A1 | 7/2008 | Yoshida |
| 2008/0251873 | A1* | 10/2008 | Kasano ............ H01L 27/14621 257/E31.127 |

(Continued)

FOREIGN PATENT DOCUMENTS

| CN | 101211946 A | 7/2008 |
| CN | 101271914 A | 9/2008 |

(Continued)

OTHER PUBLICATIONS

International Search Report and Written Opinion of PCT Application No. PCT/JP2018/045037, dated Mar. 5, 2019, 10 pages of ISRWO.

*Primary Examiner* — Julia Slutsker
(74) *Attorney, Agent, or Firm* — CHIP LAW GROUP

(57) ABSTRACT

The present technology relates to an electromagnetic wave processing device that enables suppression of a ripple. Provided are a photoelectric conversion element, a narrow band filter stacked on a light incident surface side of the photoelectric conversion element and configured to transmit an electromagnetic wave having a desired wavelength, and interlayer films respectively formed above and below the narrow band filter, and the narrow band filter is formed in a shape with a level difference. The level difference is formed for each photoelectric conversion element. Alternatively, the level difference is formed between the photoelectric conversion elements and in the interlayer film. The present technology can be applied to an imaging element or a sensor using a plasmon filter or a Fabry-Perot interferometer.

12 Claims, 68 Drawing Sheets

(58) Field of Classification Search
CPC ......... H01L 27/14605; H01L 27/14629; H01L 27/1464; H01L 31/02327; G02B 5/008; G02B 5/201
See application file for complete search history.

(56) References Cited

U.S. PATENT DOCUMENTS

| | | | |
|---|---|---|---|
| 2008/0251874 A1 | 10/2008 | Ishibe | |
| 2010/0244168 A1* | 9/2010 | Shiozawa | H01L 27/14621 257/E31.127 |
| 2013/0032915 A1 | 2/2013 | Tonotani et al. | |
| 2013/0154041 A1* | 6/2013 | Kokubun | H01L 27/14685 257/E31.127 |
| 2013/0327928 A1* | 12/2013 | Leach | G01J 1/0407 156/280 |
| 2014/0084404 A1 | 3/2014 | Fukunaga | |
| 2014/0146207 A1* | 5/2014 | Yokogawa | H04N 5/378 257/432 |
| 2015/0206912 A1 | 7/2015 | Kanamori et al. | |
| 2016/0161331 A1* | 6/2016 | Liu | A61B 5/1455 250/237 G |
| 2016/0197108 A1* | 7/2016 | Natori | H01L 27/1462 257/432 |
| 2017/0084653 A1* | 3/2017 | Nakata | H01L 27/14621 |
| 2017/0110493 A1* | 4/2017 | Yokogawa | H01L 27/14629 |

FOREIGN PATENT DOCUMENTS

| | | |
|---|---|---|
| CN | 102916023 A | 2/2013 |
| CN | 103733340 A | 4/2014 |
| CN | 108463887 A | 8/2018 |
| EP | 2738810 A1 | 6/2014 |
| EP | 3407386 A1 | 11/2018 |
| JP | 2007-227643 A | 9/2007 |
| JP | 2008-177191 A | 7/2008 |
| JP | 2008-235689 A | 10/2008 |
| JP | 2009-257919 A | 11/2009 |
| JP | 2009-302096 A | 12/2009 |
| JP | 2010-165718 A | 7/2010 |
| JP | 2013-030626 A | 2/2013 |
| JP | 2013-038091 A | 2/2013 |
| JP | 2013-131553 A | 7/2013 |
| JP | 2014-64196 A | 4/2014 |
| JP | 2014-190966 A | 10/2014 |
| KR | 10-0819706 B1 | 4/2008 |
| KR | 10-2008-0086414 A | 9/2008 |
| KR | 10-2013-0016075 A | 2/2013 |
| KR | 10-2014-0053948 A | 5/2014 |
| TW | 201308585 A | 2/2013 |
| WO | 2013/015117 A1 | 1/2013 |
| WO | 2015/015722 A1 | 2/2015 |
| WO | 2017/126329 A1 | 7/2017 |

* cited by examiner

FIG. 22A
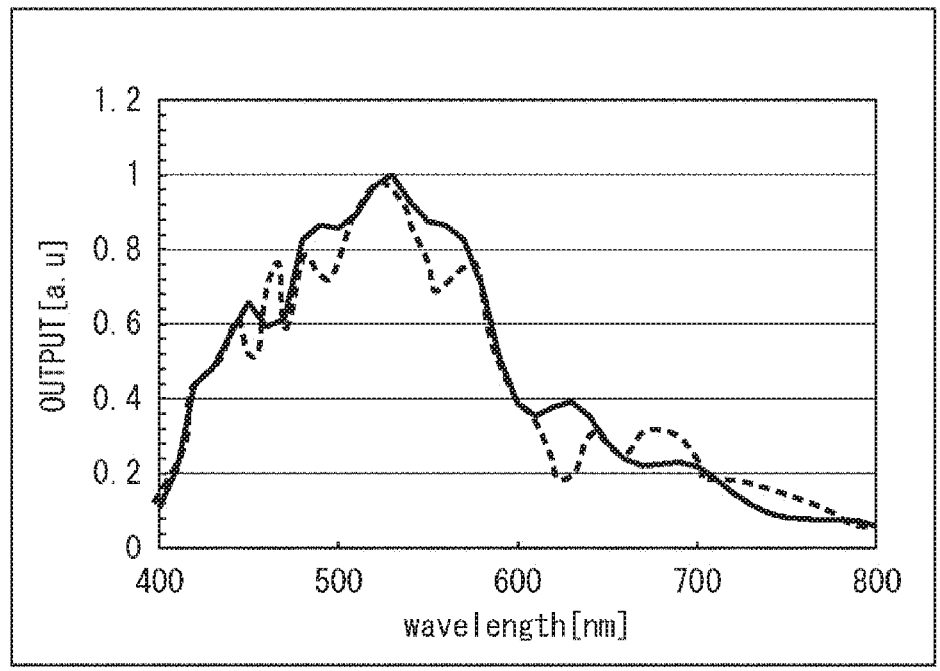
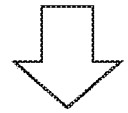
FIG. 22B
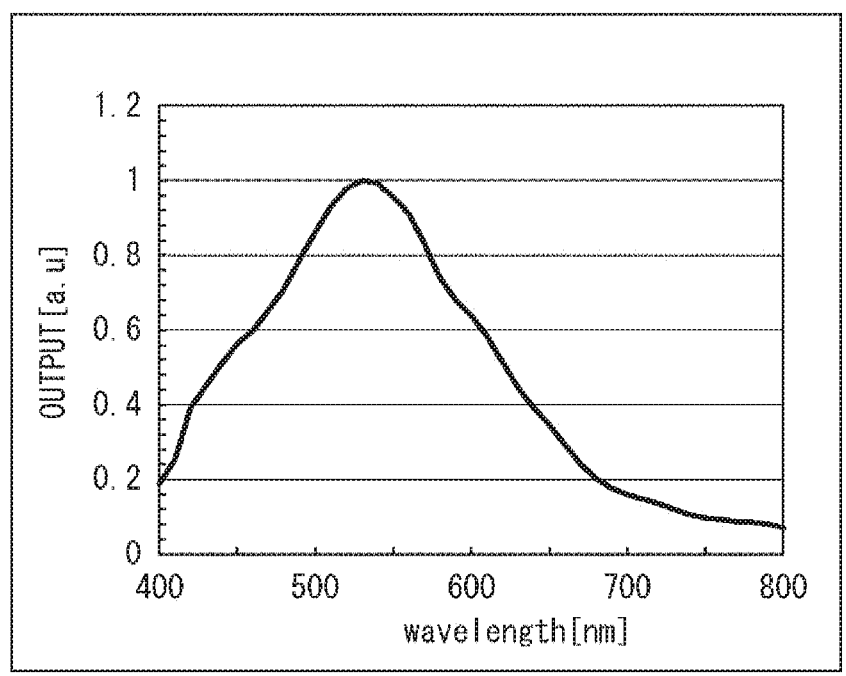

| F VALUE | MAXIMUM INCIDENCE ANGLE |
|---|---|
| 1 | 26.57 |
| 1.4 | 19.65 |
| 2 | 14.04 |
| 2.8 | 10.12 |
| 4 | 7.13 |
| 5.6 | 5.10 |
| 8 | 3.58 |
| 11 | 2.60 |
| 16 | 1.79 |

ELECTROMAGNETIC WAVE PROCESSING DEVICE

CROSS REFERENCE TO RELATED APPLICATIONS

This application is a U.S. National Phase of International Patent Application No. PCT/JP2018/045037 filed on Dec. 7, 2018, which claims priority benefit of Japanese Patent Application No. JP 2017-244942 filed in the Japan Patent Office on Dec. 21, 2017. Each of the above-referenced applications is hereby incorporated herein by reference in its entirety.

TECHNICAL FIELD

The present technology relates to an electromagnetic wave processing device, and relates to, for example, an electromagnetic wave processing device suitable for use in detecting light in a narrow wavelength band.

BACKGROUND ART

Conventionally, an imaging element for detecting light (hereinafter also referred to as narrow band light) in a predetermined narrow wavelength band (narrow band) using a plasmon filter has been proposed (for example, see Patent Document 1).

CITATION LIST

Patent Document

Patent Document 1: Japanese Patent Application Laid-Open No. 2010-165718

SUMMARY OF THE INVENTION

Problems to be Solved by the Invention

A metal-made conductive thin film is formed on the plasmon filter. Since the conductive thin film has high reflectance, the conductive thin film can easily reflect light having a wavelength other than a transmission band. For this reason, there is a possibility that incident light is reflected multiple times, and a spectrum ripple characteristic is deteriorated.

The present technology has been made in view of such a situation, and enables prevention of deterioration of ripple characteristics.

Solutions to Problems

A first electromagnetic wave processing device according to one aspect of the present technology includes a photoelectric conversion element, a narrow band filter stacked on a light incident surface side of the photoelectric conversion element and configured to transmit an electromagnetic wave having a desired wavelength, and interlayer films respectively formed above and below the narrow band filter, in which the narrow band filter is formed in a shape with a level difference.

A second electromagnetic wave processing device according to one aspect of the present technology includes a photoelectric conversion element, a narrow band filter stacked on a light incident surface side of the photoelectric conversion element and configured to transmit an electromagnetic wave having a desired wavelength, an interlayer film formed between the photoelectric conversion element and the narrow band filter, and a waveguide formed in the interlayer film.

A third electromagnetic wave processing device according to one aspect of the present technology includes a photoelectric conversion element, a narrow band filter stacked on a light incident surface side of the photoelectric conversion element and configured to transmit an electromagnetic wave having a desired wavelength, an interlayer film formed between the photoelectric conversion element and the narrow band filter, and a lens formed in the interlayer film.

A fourth electromagnetic wave processing device according to one aspect of the present technology includes a photoelectric conversion element, a narrow band filter stacked on a light incident surface side of the photoelectric conversion element and configured to transmit an electromagnetic wave having a desired wavelength, an interlayer film formed between the photoelectric conversion element and the narrow band filter, and a metal wall formed between the photoelectric conversion element and the narrow band filter, and in the interlayer film between the photoelectric conversion elements.

A fifth electromagnetic wave processing device according to one aspect of the present technology includes a photoelectric conversion element, a narrow band filter stacked on a light incident surface side of the photoelectric conversion element and configured to transmit an electromagnetic wave having a desired wavelength, and an interlayer film formed on a light incident side of the narrow band filter, in which an uneven shape is formed in at least one surface of the light incident surface side of the photoelectric conversion element, a surface facing the light incident surface, and an interface of the interlayer film.

In the first electromagnetic wave processing device according to one aspect of the present technology, a photoelectric conversion element, a narrow band filter stacked on a light incident surface side of the photoelectric conversion element and configured to transmit an electromagnetic wave having a desired wavelength, and interlayer films respectively formed above and below the narrow band filter are provided, and the narrow band filter is formed in a shape with a level difference.

In the second electromagnetic wave processing device according to one aspect of the present technology, a photoelectric conversion element, a narrow band filter stacked on a light incident surface side of the photoelectric conversion element and configured to transmit an electromagnetic wave having a desired wavelength, an interlayer film formed between the photoelectric conversion element and the narrow band filter, and a waveguide formed in the interlayer film are provided.

In the third electromagnetic wave processing device according to one aspect of the present technology, a photoelectric conversion element, a narrow band filter stacked on a light incident surface side of the photoelectric conversion element and configured to transmit an electromagnetic wave having a desired wavelength, an interlayer film formed between the photoelectric conversion element and the narrow band filter, and a lens formed in the interlayer film are provided.

In the fourth electromagnetic wave processing device according to one aspect of the present technology, a photoelectric conversion element, a narrow band filter stacked on a light incident surface side of the photoelectric conversion element and configured to transmit an electromagnetic wave having a desired wavelength, an interlayer film formed between the photoelectric conversion element and the narrow band filter, and a metal wall formed between the photoelectric conversion element and the narrow band filter, and in the interlayer film between the photoelectric conversion elements are provided.

In the fifth electromagnetic wave processing device according to one aspect of the present technology, a photoelectric conversion element, a narrow band filter stacked on a light incident surface side of the photoelectric conversion element and configured to transmit an electromagnetic wave having a desired wavelength, and an interlayer film formed on a light incident side of the narrow band filter are provided, and an uneven shape is formed in at least one surface of the light incident surface side of the photoelectric conversion element, a surface facing the light incident surface, and an interface of the interlayer film.

Effects of the Invention

According to one aspect of the present technology, deterioration of ripple characteristics can be prevented.

Note that the effects described here are not necessarily limited, and any of effects described in the present disclosure may be exhibited.

BRIEF DESCRIPTION OF DRAWINGS

FIGS. 22A and 22B are views for describing suppression of a ripple.

MODE FOR CARRYING OUT THE INVENTION

Hereinafter, modes for implementing the present technology (hereinafter referred to as embodiments) will be described.

Configuration Example of Imaging Device

Figure 1:
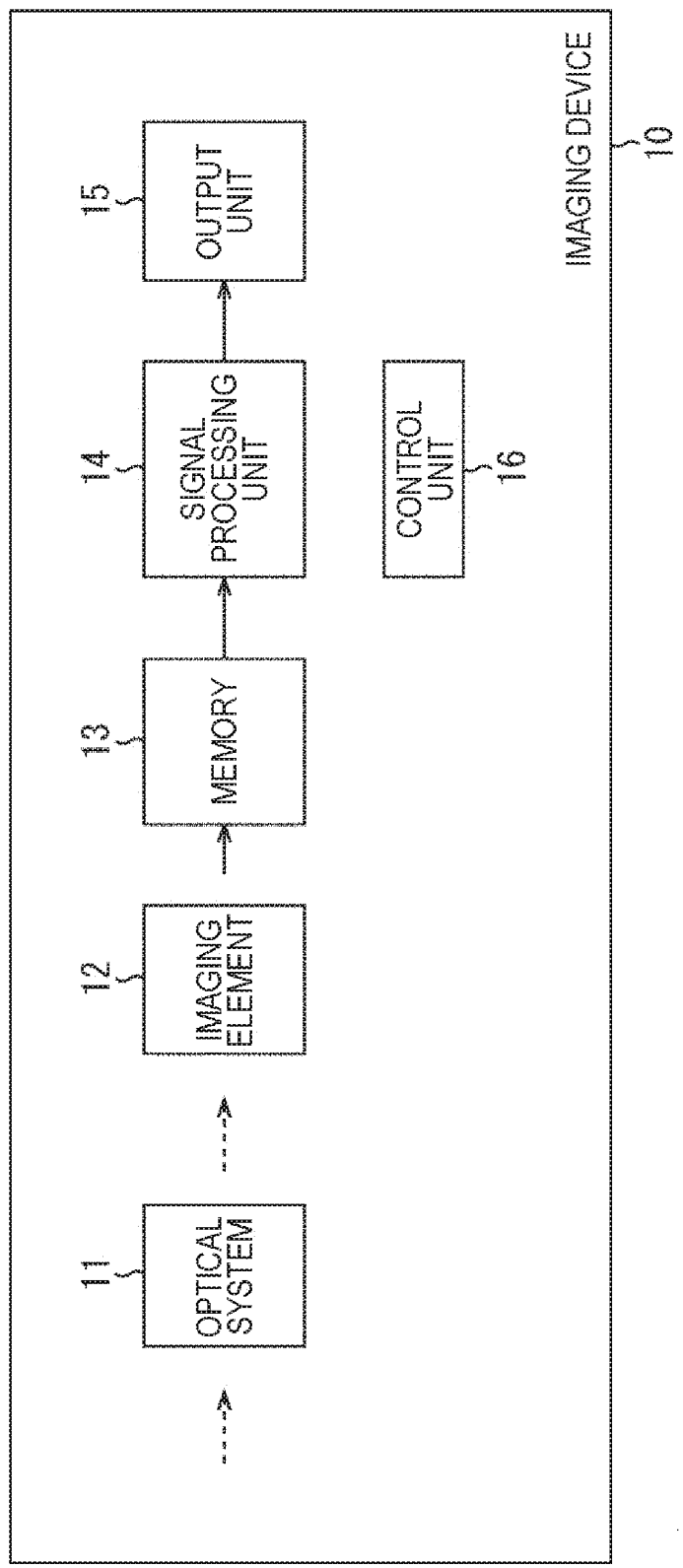
FIG. 1 is a block diagram illustrating an embodiment of an imaging device to which the present technology is applied.

FIG. 1 is a block diagram illustrating an embodiment of an imaging device that is a type of electronic devices to which the present technology is applied.

An imaging device 10 in FIG. 1 is, for example, a digital camera capable of capturing both of a still image and a moving image. Furthermore, the imaging device 10 includes, for example, a multispectral camera capable of detecting light (multispectrum) in four or more wavelength bands (four or more bands) larger than three primary colors or three wavelength bands (three bands) of conventional red (R), green (G), and blue (B), or yellow (Y), magenta (M), and cyan (C) based on a color-matching function.

The imaging device 10 includes an optical system 11, an imaging element 12, a memory 13, a signal processing unit 14, an output unit 15, and a control unit 16.

The optical system 11 includes, for example, a zoom lens, a focus lens, a diaphragm, and the like (not illustrated), and allows external light to enter the imaging element 12. Furthermore, the optical system 11 is provided with various filters such as a polarizing filter as needed.

The imaging element 12 includes a complementary metal oxide semiconductor (CMOS) image sensor, for example. The imaging element 12 receives incident light from the optical system 11, performs photoelectric conversion, and outputs image data corresponding to the incident light.

The memory 13 temporarily stores image data output by the imaging element 12.

The signal processing unit 14 performs signal processing (for example, processing such as noise removal and white balance adjustment) using the image data stored in the memory 13 and supplies the processed image data to the output unit 15.

The output unit 15 outputs the image data from the signal processing unit 14. For example, the output unit 15 includes a display (not illustrated) configured by a liquid crystal or the like, and displays a spectrum (image) corresponding to the image data from the signal processing unit 14 as a so-called through image. For example, the output unit 15 includes a driver (not illustrated) for driving a recording medium such as a semiconductor memory, a magnetic disk, or an optical disk, and records the image data from the signal processing unit 14 on the recording medium. For example, the output unit 15 functions as a communication interface that performs communication with an external device (not illustrated), and transmits the image data from the signal processing unit 14 to the external device by wireless or wired means.

The control unit 16 controls each unit of the imaging device 10 according to a user operation or the like.

Configuration Example of Circuit of Imaging Element

Figure 2:
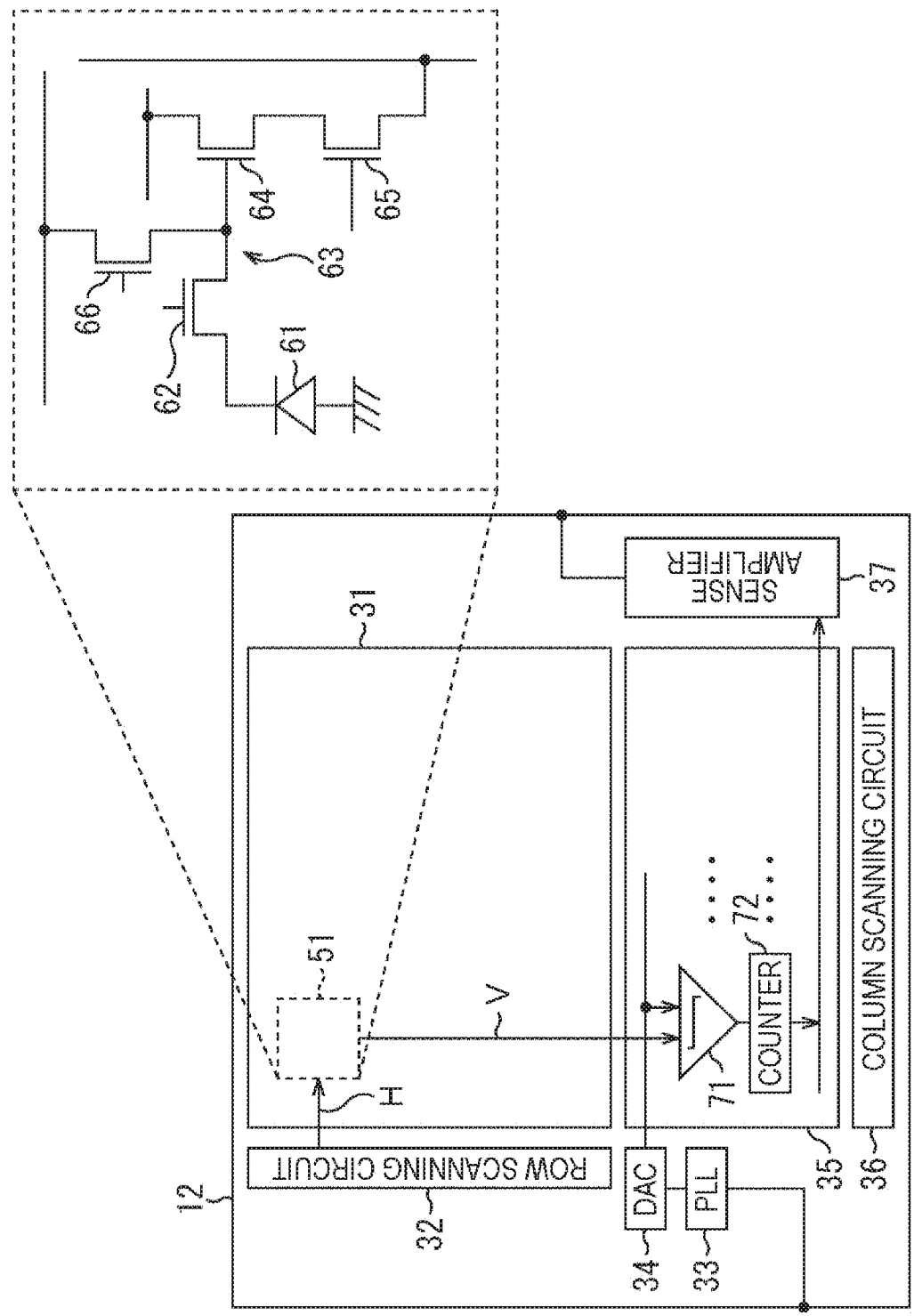
FIG. 2 is a block diagram illustrating a configuration example of a circuit of an imaging element.

FIG. 2 is a block diagram illustrating a configuration example of a circuit of the imaging element 12 in FIG. 1.

The imaging element 12 includes a pixel array unit 31, a row scanning circuit 32, a phase locked loop (PLL) 33, a digital analog converter (DAC) 34, a column analog digital converter (ADC) circuit 35, a column scanning circuit 36, and a sense amplifier 37.

In the pixel array unit 31, a plurality of pixels 51 is two-dimensionally arrayed.

Each of the pixels 51 is arranged at a point where a horizontal signal line H connected to the row scanning circuit 32 and a vertical signal line V connected to the column ADC circuit 35 intersect, and includes a photodiode 61 for performing photoelectric conversion and several types of transistors for reading stored signals. That is, the pixel 51 includes a photodiode 61, a transfer transistor 62, a floating diffusion 63, an amplification transistor 64, a selection transistor 65, and a reset transistor 66, as illustrated in an enlarged manner on the right side in FIG. 2.

A charge stored in the photodiode 61 is transferred to the floating diffusion 63 via the transfer transistor 62. The floating diffusion 63 is connected to a gate of the amplification transistor 64. When the pixel 51 is selected for reading a signal, the selection transistor 65 is turned on from the row scanning circuit 32 via the horizontal signal line H, and the amplification transistor 64 is source-follower driven, so that the signal of the selected pixel 51 is read out to the vertical signal line V as a pixel signal corresponding to a stored charge amount of the charge stored in the photodiode 61. Furthermore, the pixel signal is reset by turning on the reset transistor 66.

The row scanning circuit 32 sequentially outputs, for each row, drive signals for driving (for example, transferring, selecting, resetting, or the like) the pixels 51 of the pixel array unit 31.

The PLL 33 generates and outputs a clock signal having a predetermined frequency required for driving each unit of the imaging element 12 on the basis of a clock signal supplied from the outside.

The DAC 34 generates and outputs a ramp signal having a shape (substantially sawtooth shape) in which a voltage is returned to a predetermined voltage value after dropping at a fixed gradient from the predetermined voltage value.

The column ADC circuit 35 includes comparators 71 and counters 72 by the number corresponding to columns of the pixels 51 of the pixel array unit 31, and extracts a signal level by a correlated double sampling (CDS) operation from the pixel signal output from the pixel 51 and outputs pixel data. That is, the comparator 71 compares the ramp signal supplied from the DAC 34 with the pixel signal (luminance value) output from the pixel 51, and supplies a resultant comparison result signal to the counter 72. Then, the counter 72 counts the counter clock signal having a predetermined frequency according to the comparison result signal output from the comparator 71, so that the pixel signal is A/D converted.

The column scanning circuit 36 sequentially supplies a signal for outputting the pixel data to the counter 72 of the column ADC circuit 35 at predetermined timing.

The sense amplifier 37 amplifies the pixel data supplied from the column ADC circuit 35 and outputs the amplified pixel data to the outside of the imaging element 12.

<Configuration of Imaging Element>

Figure 3:
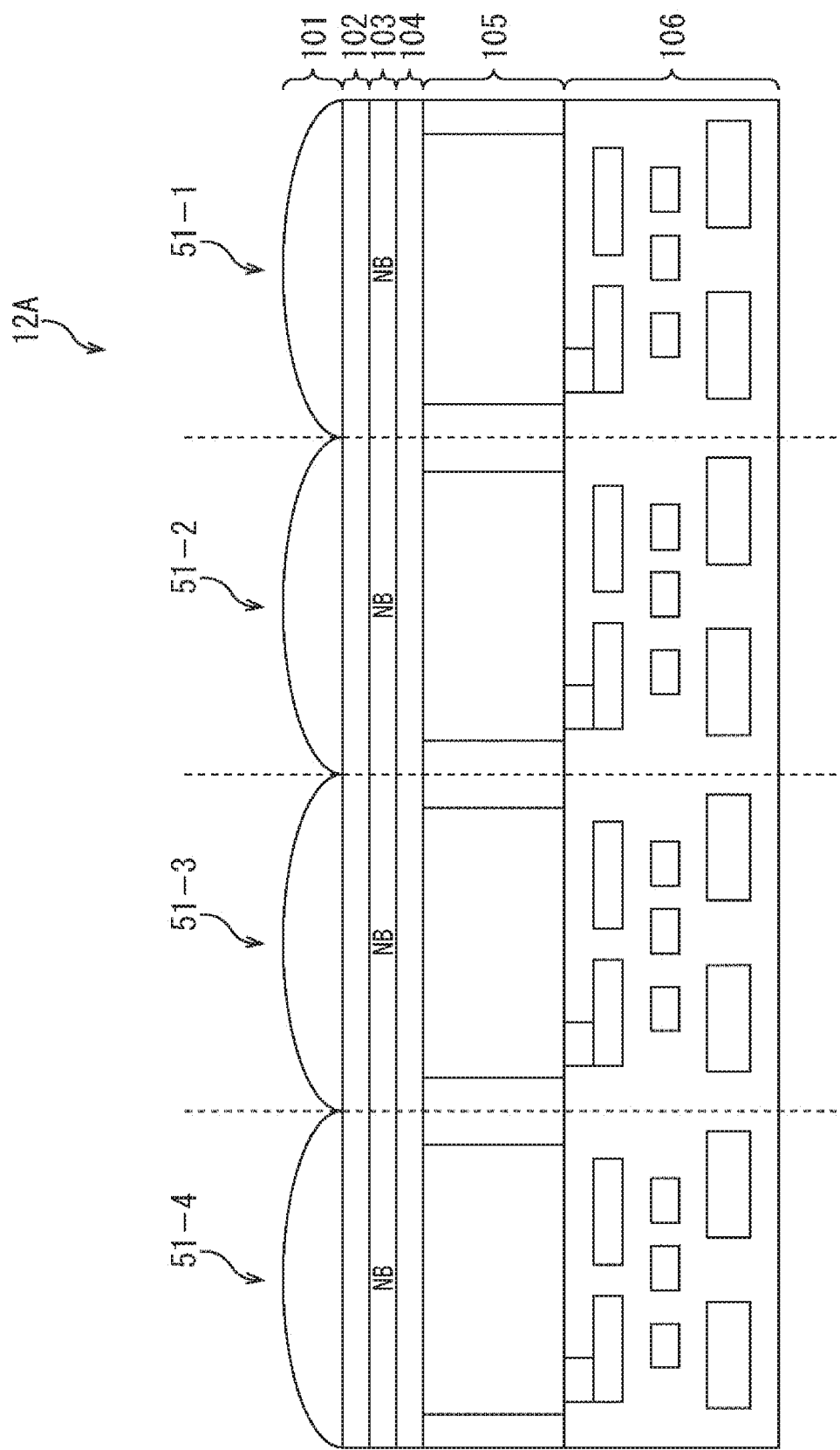
FIG. 3 is a cross-sectional view schematically illustrating a configuration example of a first embodiment of the imaging element.

FIG. 3 schematically illustrates a configuration example of a cross section of the imaging element 12 in FIG. 1. FIG. 3 illustrates a cross section of four pixels 51-1 to 51-4 of the imaging element 12. Note that, hereinafter, the pixels 51-1 to 51-4 are simply referred to as pixels 51 in a case where there is no necessity to individually distinguish the pixels 51-1 to 51-4.

In each pixel 51, an on-chip microlens 101, an interlayer film 102, a narrow band filter layer 103, an interlayer film 104, a photoelectric conversion element layer 105, and a wiring layer 106 are stacked in order from the top. That is, the imaging element 12 includes a back-illuminated CMOS image sensor in which the photoelectric conversion element layer 105 is arranged on a light incident side with respect to the wiring layer 106.

The on-chip microlens 101 is an optical element for condensing light on the photoelectric conversion element layer 105 of each pixel 51.

The interlayer films 102 and 104 include a dielectric such as SiO2. As will be described below, dielectric constants of the interlayer films 102 and 104 are desirably as low as possible.

In the narrow band filter layer 103, a narrow band filter NB that is an optical filter that transmits narrow band light in a predetermined narrow wavelength band (narrow band) is provided in each pixel 51. For example, a plasmon filter using surface plasmons, which is a type of metal thin film filters using a metal-made thin film such as aluminum, is used as the narrow band filter NB. Furthermore, a transmission band of the narrow band filter NB is set for each pixel 51. Types (number of bands) of the transmission band of the narrow band filter NB is arbitrary, and are set to four or more, for example.

Here, the narrow band refers to, for example, a wavelength band narrower than transmission bands of color filters of the three primary colors or the conventional red (R), green (G), and blue (B), or yellow (Y), magenta (M), and cyan (C), the conventional red (R), green (G), or blue (B) based on a color-matching function. Furthermore, hereinafter, a pixel that receives narrow band light transmitted through the narrow band filter NB is referred to as a multispectral pixel or an MS pixel.

The photoelectric conversion element layer 105 includes the photodiode 61 and the like in FIG. 2, for example, and receives the light (narrow band light) transmitted through the narrow band filter layer 103 (narrow band filter NB) and converts the received light into charges. Furthermore, the photoelectric conversion element layer 105 is configured such that the pixels 51 are electrically separated by an element separation layer.

The wiring layer 106 is provided with wiring for reading the charge stored in the photoelectric conversion element layer 105, and the like.

<Plasmon Filter>

Next, a plasmon filter that can be used as the narrow band filter NB will be described with reference to FIGS. 4, 5, 6, 7, 8, 9, 10A, 10B, 11, 12A, 12B, 13, 14, and 15.

Figure 4:
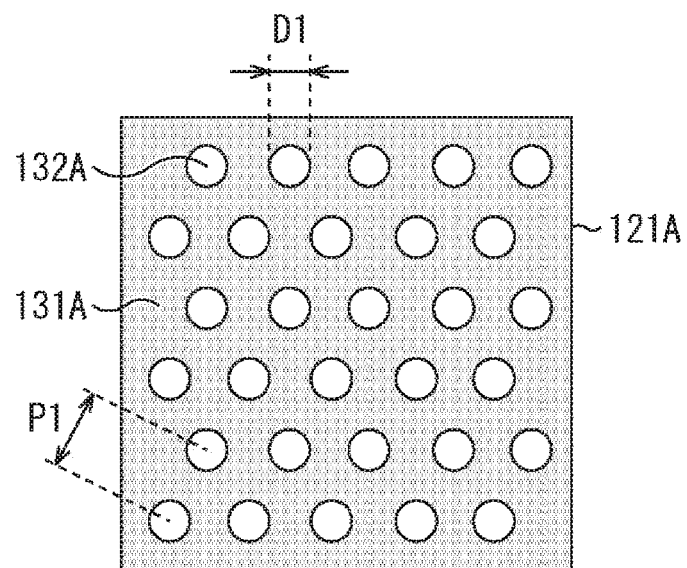
FIG. 4 is a view illustrating a configuration example of a plasmon filter having a hole array structure.

FIG. 4 illustrates a configuration example of a plasmon filter 121A having a hole array structure.

The plasmon filter 121A is configured by a plasmon resonator in which holes 132A are arranged in a honeycomb manner in a metal-made thin film (hereinafter, referred to as a conductive thin film) 131A.

Each hole 132A penetrates the conductive thin film 131A and functions as a waveguide tube. Generally, a waveguide tube has a cutoff frequency and a cutoff wavelength determined according to a shape such as a side length and a diameter, and has a property that light having a frequency equal to or lower than the cutoff frequency (a wavelength equal to or larger than the cutoff wavelength) does not propagate. The cutoff wavelength of the hole 132A mainly depends on an opening diameter D1, and the cutoff wavelength becomes shorter as the opening diameter D1 is smaller. Note that the opening diameter D1 is set to a value smaller than the wavelength of light to be transmitted.

Meanwhile, when light enters the conductive thin film 131A having the holes 132A periodically formed with a short period equal to or smaller than the wavelength of the light, a phenomenon in which the light having the wavelength longer than the cutoff wavelength of the hole 132A is transmitted occurs. This phenomenon is called an abnormal plasmon transmission phenomenon. This phenomenon occurs when surface plasmons are excited at a boundary between the conductive thin film 131A and the interlayer film 102 thereon.

Here, conditions for generating the abnormal plasmon transmission phenomenon (surface plasmon resonance) will be described with reference to FIG. 5.

Figure 5:
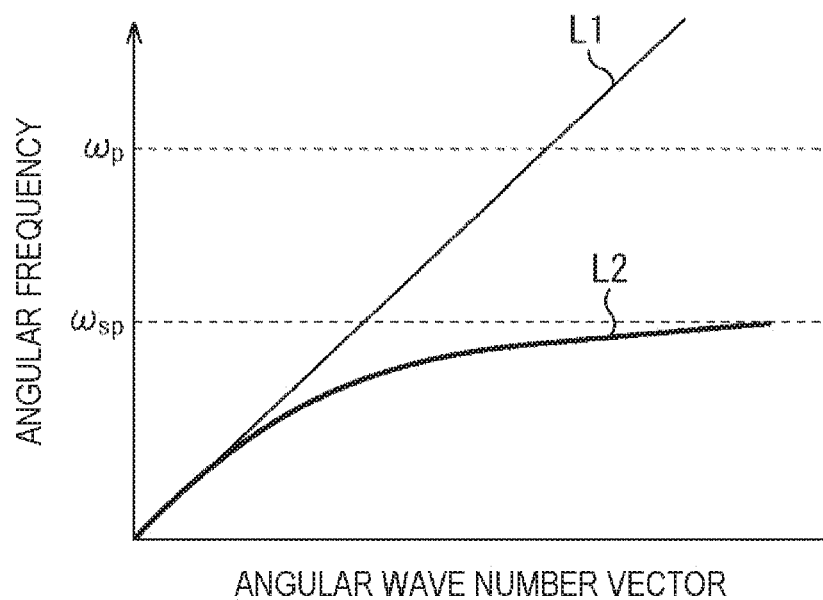
FIG. 5 is a graph illustrating a dispersion relationship of surface plasmons.

FIG. 5 is a graph illustrating a dispersion relationship of surface plasmons. The horizontal axis of the graph represents an angular wave number vector k, and a vertical axis represents an angular frequency ω. $ω_p$ represents a plasma frequency of the conductive thin film 131A. $ω_{sp}$ represents a surface plasma frequency at the boundary surface between the interlayer film 102 and the conductive thin film 131A, and is expressed by the following expression (1).

[Math. 1]

$$\omega_{sp} = \frac{\omega_p}{\sqrt{1+\varepsilon_d}} \tag{1}$$

$\varepsilon_d$ represents a dielectric constant of the dielectric configuring the interlayer film 102.

The surface plasma frequency $ω_{sp}$ becomes higher as the plasma frequency $ω_p$ becomes higher according to the expression (1). Furthermore, the surface plasma frequency $ω_{sp}$ becomes higher as the dielectric constant $\varepsilon_d$ becomes smaller.

A line L1 represents a light dispersion relationship (light line) and is expressed by the following expression (2).

[Math. 2]

$$\omega = \frac{c}{\sqrt{\varepsilon_d}} k \tag{2}$$

c represents a light speed.

A line L2 represents a dispersion relationship of the surface plasmons, and is expressed by the following expression (3).

[Math. 3]

$$\omega = ck\sqrt{\frac{\varepsilon_m + \varepsilon_d}{\varepsilon_m \varepsilon_d}} \tag{3}$$

$\varepsilon_m$ represents a dielectric constant of the conductive thin film 131A.

The dispersion relationship of the surface plasmons represented by the line L2 asymptotically approaches the light line represented by the line L1 in a range where the angular wave number vector k is small, and asymptotically approaches the surface plasma frequency $ω_{sp}$ as the angular wave number vector k becomes large.

Then, when the following expression (4) holds, the abnormal plasmon transmission phenomenon occurs.

[Math. 4]

$$\text{Re}\left[\frac{\omega_{sp}}{c}\sqrt{\frac{\varepsilon_m \varepsilon_d}{\varepsilon_m + \varepsilon_d}}\right] = \left|\frac{2\pi}{\lambda}\sin\theta + iG_x + jG_y\right| \tag{4}$$

λ represents a wavelength of incident light. θ represents an incidence angle of the incident light. $G_x$ and $G_y$ are expressed by the following expression (5).

$$|G_x|=|G_y|=2\Pi/a_0 \tag{5}$$

$a_0$ represents a lattice constant of the hole array structure including the holes 132A of the conductive thin film 131A.

The left side of the expression (4) indicates the angular wave number vector of the surface plasmon, and the right side indicates the angular wave number vector of a hole array period of the conductive thin film 131A. Therefore, when the angular wave number vector of the surface plasmon becomes equal to the angular wave number vector of the hole array period of the conductive thin film 131A, the abnormal plasmon transmission phenomenon occurs. Then, the value of λ at this time is a plasmon resonance wavelength (a transmission wavelength of the plasmon filter 121A).

Note that the angular wave number vector of the surface plasmon on the left side of the expression (4) is determined according to the dielectric constant $\varepsilon_m$ of the conductive thin film 131A and the dielectric constant $\varepsilon_d$ of the interlayer film 102. Meanwhile, the angular wave number vector of the hole array period on the right side is determined according to the incidence angle θ of light and a pitch (hole pitch) P1 between adjacent holes 132A of the conductive thin film 131A. Therefore, the resonance wavelength and a resonance frequency of the plasmon are determined according to the dielectric constant $\varepsilon_m$ of the conductive thin film 131A, the dielectric constant $\varepsilon_d$ of the interlayer film 102, the incidence angle θ of light, and the hole pitch P1. Note that, in a case where the incidence angle of light is 0°, the resonance wavelength and the resonance frequency of the plasmon are determined according to the dielectric constant $\varepsilon_m$ of the conductive thin film 131A, the dielectric constant $\varepsilon_d$ of the interlayer film 102, and the hole pitch P1.

Therefore, a transmission band (plasmon resonance wavelength) of the plasmon filter 121A changes depending on the material and film thickness of the conductive thin film 131A, the material and film thickness of the interlayer film 102, and a hole array pattern period (for example, the opening diameter D1 and the hole pitch P1 of the hole 132A), and the like. In particular, in a case where the materials and film thicknesses of the conductive thin film 131A and the interlayer film 102 are determined, the transmission band of the plasmon filter 121A changes depending on the hole array pattern period, particularly, the hole pitch P1. That is, the transmission band of the plasmon filter 121A shifts to a shorter wavelength side as the hole pitch P1 becomes narrower, and the transmission band of the plasmon filter 121A shifts to a longer wavelength side as the hole pitch P1 becomes wider.

Figure 6:
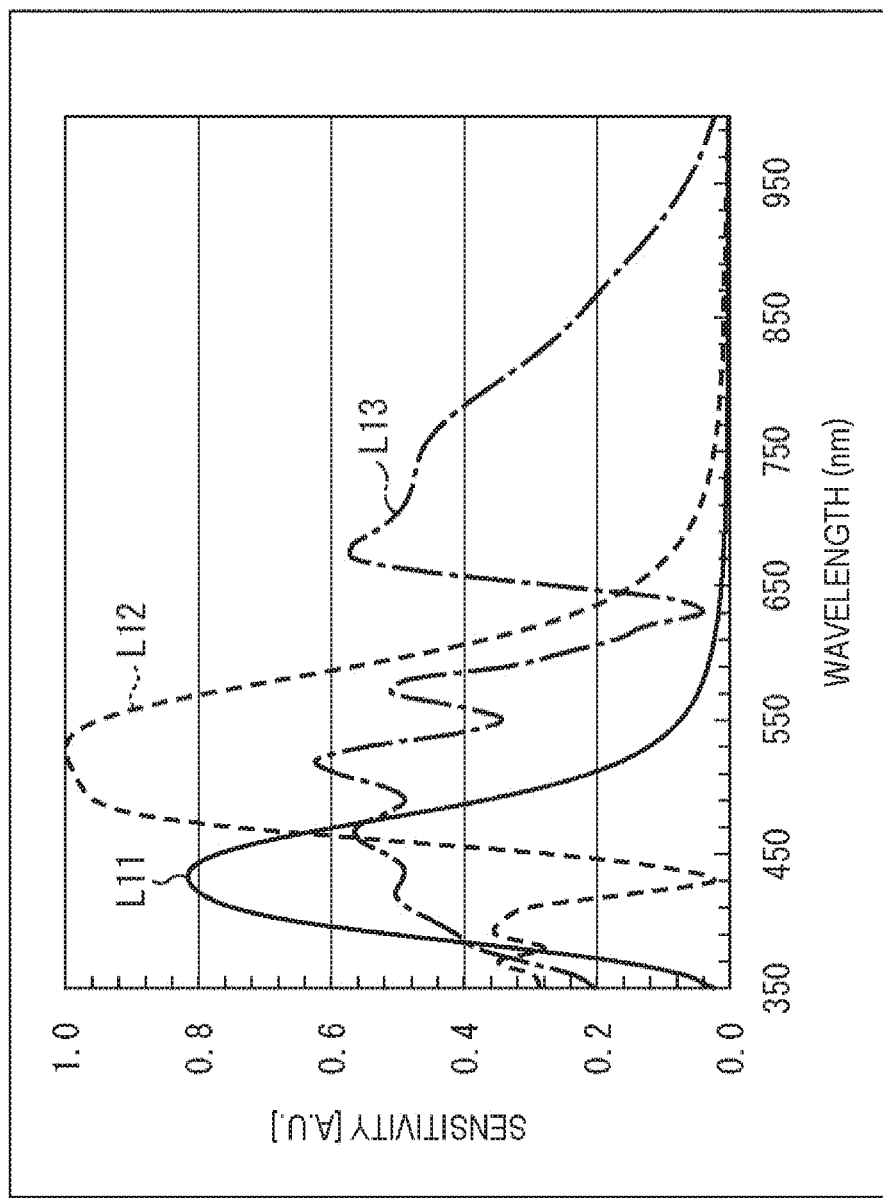
FIG. 6 is a graph illustrating a first example of spectral characteristics of the plasmon filter having a hole array structure.

FIG. 6 is a graph illustrating an example of spectral characteristics of the plasmon filter 121A in a case where the hole pitch P1 is changed. The horizontal axis of the graph represents the wavelength (the unit is nm), and the vertical axis represents sensitivity (the unit is arbitrary unit). A line L11 represents a spectral characteristic in a case where the hole pitch P1 is set to 250 nm, a line L12 represents a spectral characteristic in a case where the hole pitch P1 is set to 325 nm, and a line L13 represents a spectral characteristic in a case where the hole pitch P1 is set to 500 nm.

In the case where the hole pitch P1 is set to 250 nm, the plasmon filter 121A mainly transmits light in a blue wavelength band. In the case where the hole pitch P1 is set to 325 nm, the plasmon filter 121A mainly transmits light in a green wavelength band. In the case where the hole pitch P1 is set to 500 nm, the plasmon filter 121A mainly transmits light in a red wavelength band. Note that, in the case where the hole pitch P1 is set to 500 nm, the plasmon filter 121A also transmits light in a lower wavelength band than red according to a waveguide mode to be described below.

Figure 7:
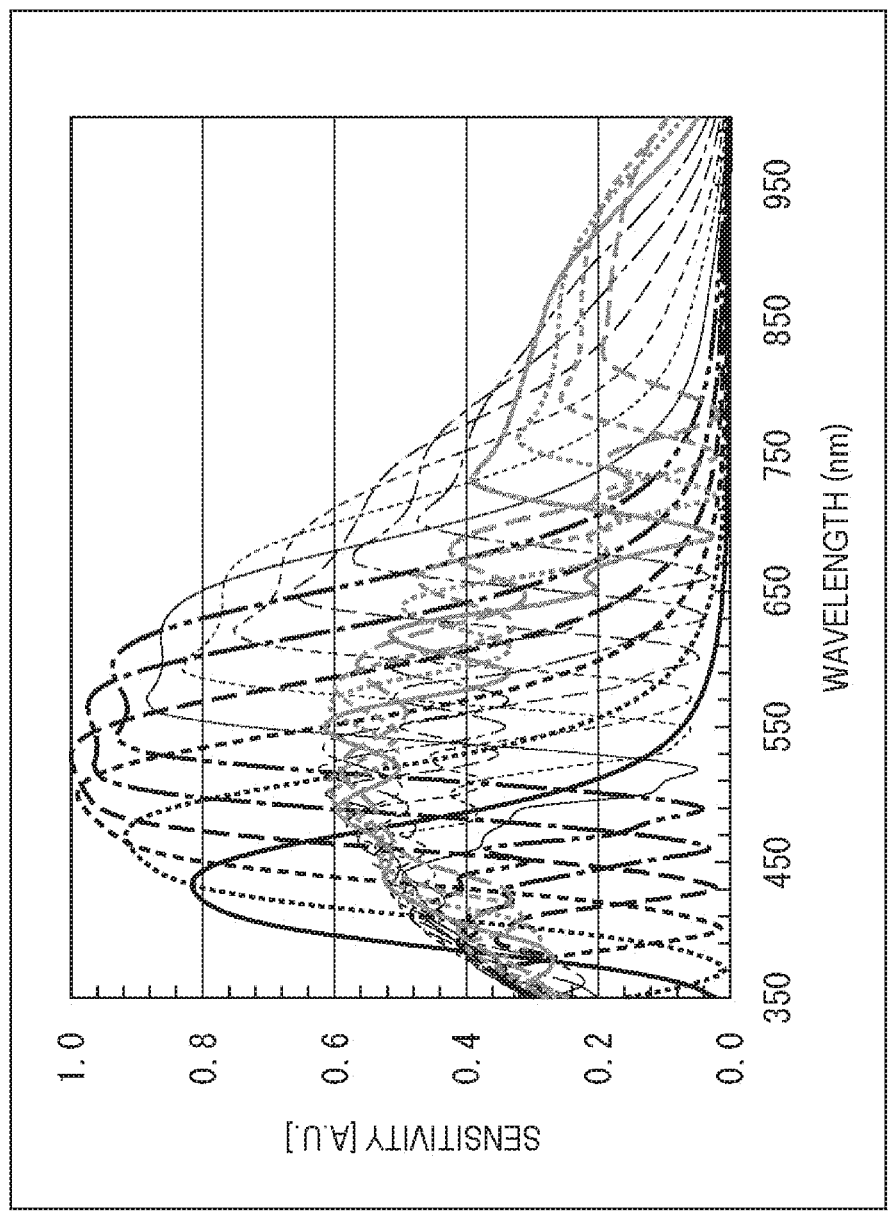
FIG. 7 is a graph illustrating a second example of spectral characteristics of the plasmon filter having a hole array structure.

FIG. 7 is a graph illustrating another example of spectral characteristics of the plasmon filter 121A in a case where the hole pitch P1 is changed. The horizontal axis of the graph represents the wavelength (the unit is nm), and the vertical axis represents sensitivity (the unit is arbitrary unit). This example illustrates an example of spectral characteristics of sixteen types of plasmon filters 121A in a case where the hole pitch P1 is changed at intervals of 25 nm from 250 nm to 625 nm.

Note that transmittance of the plasmon filter 121A is mainly determined according to the opening diameter D1 of the hole 132A. The transmittance becomes higher while the color mixture is more likely to occur as the opening diameter D1 becomes larger. Generally, it is desirable to set the opening diameter D1 such that an opening ratio becomes 50% to 60% of the hole pitch P1.

Furthermore, each hole 132A of the plasmon filter 121A functions as a waveguide tube, as described above. Therefore, in the spectral characteristics, there are some cases where not only a wavelength component transmitted by surface plasmon resonance (a wavelength component in a plasmon mode) but also a wavelength component transmitted through the hole 132A (waveguide tube) (a wavelength component in a waveguide mode) becomes large, depending on a pattern of the hole array of the plasmon filter 121A.

Figure 8:
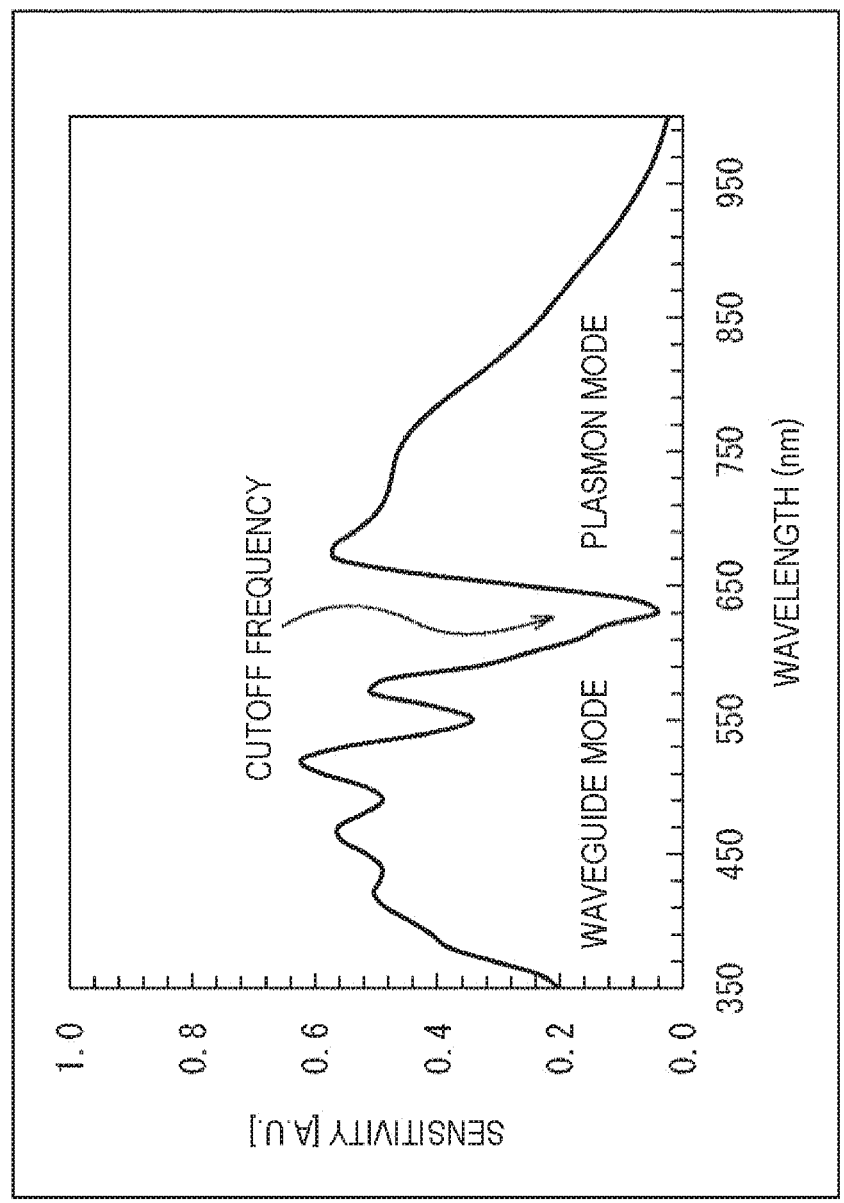
FIG. 8 is a graph illustrating a plasmon mode and a waveguide mode.

FIG. 8 illustrates spectral characteristics of the plasmon filter 121A in a case where the hole pitch P1 is set to 500 nm, similarly to the spectral characteristics represented by the line L13 in FIG. 6. In this example, a longer wavelength side than the cutoff wavelength around 630 nm is a wavelength component in the plasmon mode, and a shorter wavelength side than the cutoff wavelength is a waveguide component in the waveguide mode.

As described above, the cutoff wavelength mainly depends on the opening diameter D1 of the hole 132A, and the cutoff wavelength becomes shorter as the opening diameter D1 is smaller. Then, wavelength resolution characteristics of the plasmon filter 121A are improved as a difference between the cutoff wavelength and a peak wavelength in the plasmon mode is made larger.

Furthermore, as described above, the surface plasma frequency $\omega_{sp}$ of the conductive thin film 131A becomes higher as the plasma frequency $\omega_p$ of the conductive thin film 131A becomes higher. Furthermore, the surface plasma frequency $\omega_{sp}$ becomes higher as the dielectric constant $\varepsilon_d$ of the interlayer film 102 becomes smaller. Then, the plasmon resonance frequency can be set to be higher as the surface plasma frequency $\omega_{sp}$ becomes higher, and the transmission band (plasmon resonance wavelength) of the plasmon filter 121A can be set to a shorter wavelength band.

Therefore, use of a metal having a smaller plasma frequency $\omega_p$ for the conductive thin film 131A enables setting of a shorter wavelength band as the transmission band of the plasmon filter 121A. For example, aluminum, silver, gold, or the like is suitable. Note that copper or the like can be used in a case where the transmission band is set to a long wavelength band such as infrared light.

Furthermore, use of a dielectric having a smaller dielectric constant $\varepsilon_d$ for the interlayer film 102 enables setting of a shorter wavelength band as the transmission band of the plasmon filter 121A. For example, SiO2, SiN, Low-K, SiC, TiO2, ZnS, MgF2, or the like is suitable.

Figure 9:
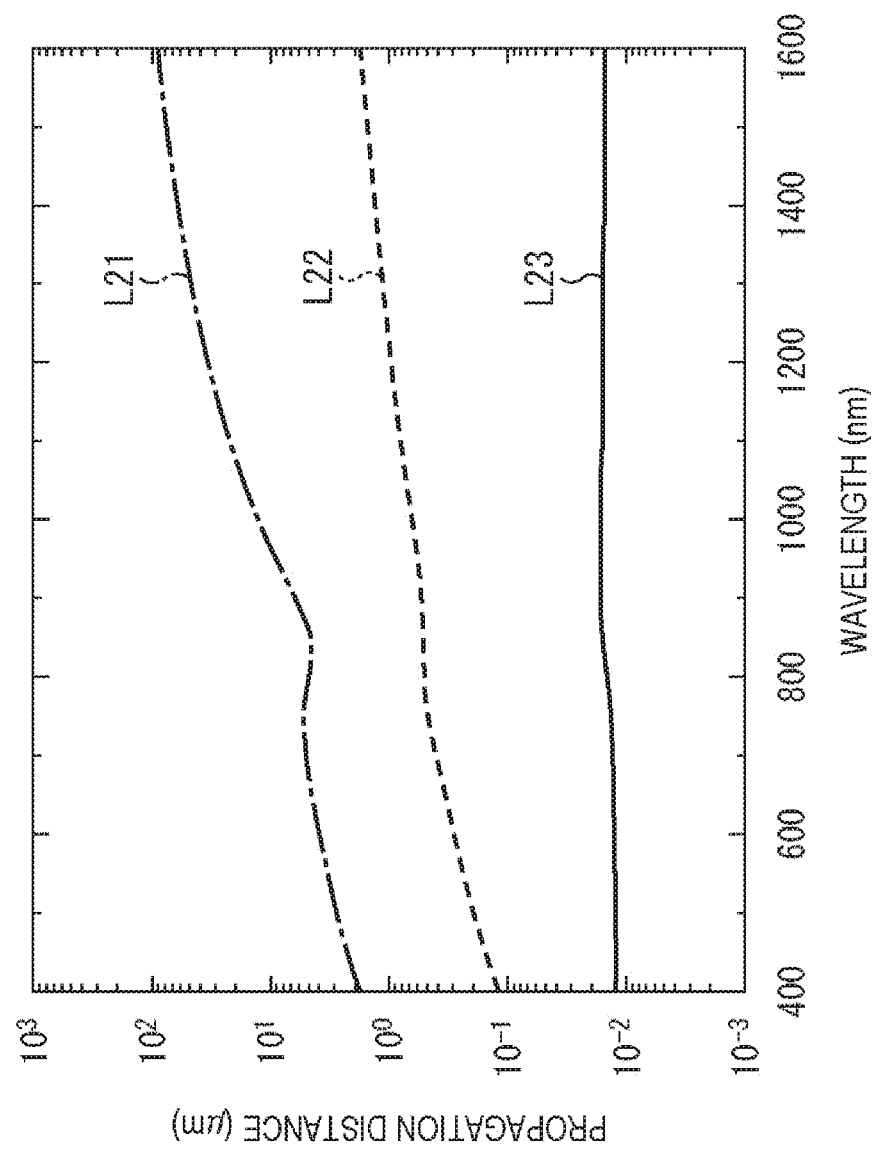
FIG. 9 is a graph illustrating an example of propagation characteristics of surface plasmons.

Furthermore, FIG. 9 is a graph illustrating propagation characteristics of the surface plasmons at an interface between the conductive thin film 131A and the interlayer film 102 in a case where aluminum is used for the conductive thin film 131A and SiO2 is used for the interlayer film 102. The horizontal axis of the graph represents the wavelength (the unit is nm), and the vertical axis represents a propagation distance (the unit is µm). Furthermore, a line L21 represents a propagation characteristic in an interface direction, a line L22 represents a propagation characteristic in a depth direction of the interlayer film 102 (a direction perpendicular to the interface), and a line L23 represents a propagation characteristic in the depth direction of the conductive thin film 131A (the direction perpendicular to the interface).

A propagation distance $\Lambda_{SPP}(\lambda)$ of the surface plasmon in the depth direction is expressed by the following expression (6).

[Math. 5]

$$\Lambda_{SPP}(\lambda) \equiv \frac{4\pi k_{SPP}}{\lambda} = \frac{4\pi}{\lambda} \text{Im}\left[\sqrt{\frac{\varepsilon_m \varepsilon_d}{\varepsilon_m + \varepsilon_d}}\right] \qquad (6)$$

$k_{SPP}$ represents an absorption coefficient of a substance through which the surface plasmon propagates. $\varepsilon_m(\lambda)$ represents the dielectric constant of the conductive thin film 131A with respect to light having a wavelength $\Lambda$. $\varepsilon_d(\lambda)$ represents the dielectric constant of the interlayer film 102 with respect to the light having the wavelength $\Lambda$.

Therefore, as illustrated in FIG. 9, the surface plasmon with respect to the light having the wavelength of 400 nm propagates from the surface of the interlayer film 102 containing SiO2 to about 100 nm in the depth direction. Therefore, by setting the thickness of the interlayer film 102 to 100 nm or more, an influence of a substance stacked on a surface of the interlayer film 102, the surface being opposite to the conductive thin film 131A, on the surface plasmons at the interface between the interlayer film 102 and the conductive thin film 131A can be prevented.

Furthermore, the surface plasmon with respect to the light having the wavelength of 400 nm propagates from the surface of the conductive thin film 131A containing aluminum to about 10 nm in the depth direction. Therefore, by setting the thickness of the conductive thin film 131A to 10 nm or more, an influence of the interlayer film 104 on the surface plasmons at the interface between the interlayer film 102 and the conductive thin film 131A can be prevented.

Other Examples of Plasmon Filter

Next, other examples of the plasmon filter will be described with reference to FIGS. 10, 10B, 11, 12A, 12B, 13, 14, and 15.

Figure 10A:
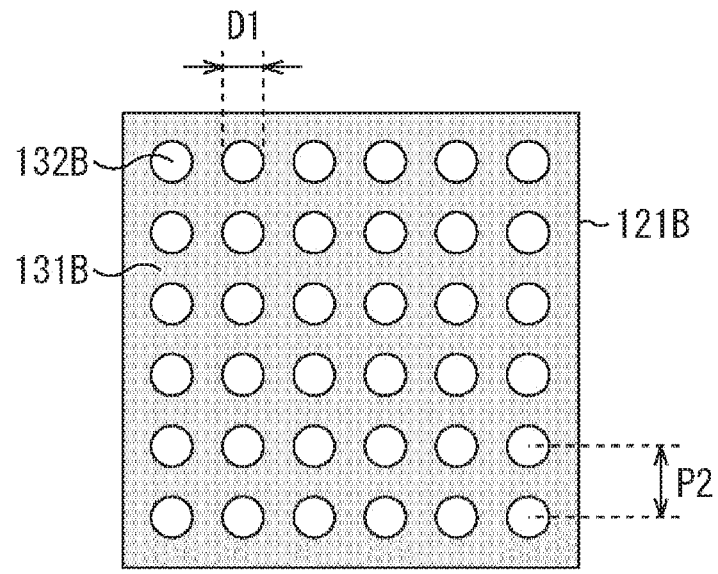
FIGS. 10A and 10B are views illustrating other configuration examples of the plasmon filter having a hole array structure.

A plasmon filter 121B in FIG. 10A is configured by a plasmon resonator in which holes 132B are arranged in an orthogonal matrix in a conductive thin film 131B. In the plasmon filter 121B, the transmission band changes depending on a pitch P2 between adjacent holes 132B, for example.

Furthermore, in the plasmon resonator, not all the holes need to penetrate the conductive thin film. Even if some holes are configured as non-through holes that do not penetrate the conductive thin film, the plasmon resonator functions as a filter.

Figure 10B:
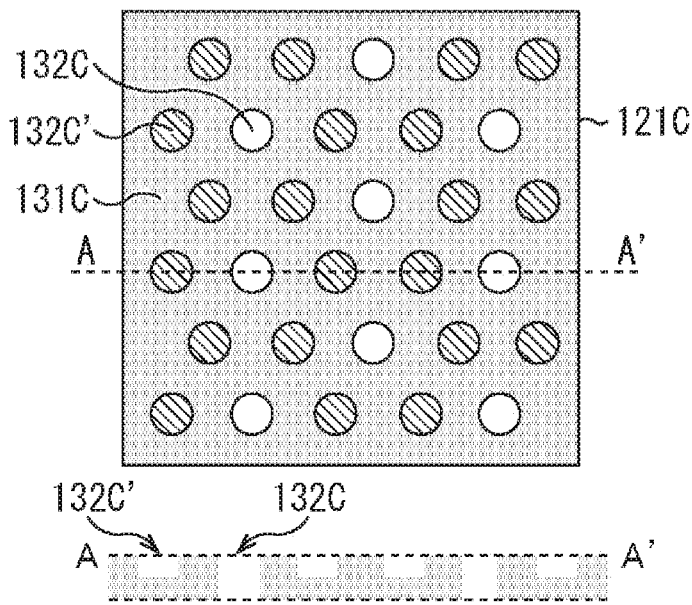

For example, FIG. 10B illustrates a plan view and a cross-sectional view (taken along line A-A' in the plan view) of a plasmon filter 121C configured by a plasmon resonator in which holes 132C configured as through holes and holes 132C' configured as non-through holes are arranged in a honeycomb manner in a conductive thin film 131C. That is, the holes 132C configured as through holes and the holes 132C' configured as non-through holes are periodically arranged in the plasmon filter 121C.

Moreover, although a single-layer plasmon resonator is basically used as the plasmon filter, the plasmon filter may be configured by a two-layer plasmon resonator, for example.

Figure 11:
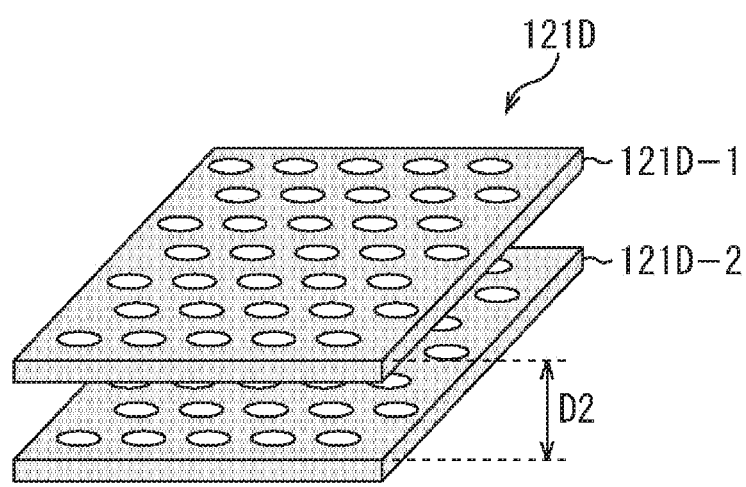
FIG. 11 is a view illustrating a configuration example of a plasmon filter having a two-layer array structure.

For example, a plasmon filter 121D illustrated in FIG. 11 includes a two-layer plasmon filter 121D-1 and plasmon filter 121D-2. The plasmon filter 121D-1 and the plasmon filter 121D-2 have a structure in which holes are arranged in a honeycomb manner, similarly to the plasmon resonator configuring the plasmon filter 121A in FIG. 4.

Furthermore, a distance D2 between the plasmon filter 121D-1 and the plasmon filter 121D-2 is favorably set to about ¼ of a peak wavelength of the transmission band. Furthermore, the distance D2 is more favorably equal to or less than ½ of the peak wavelength of the transmission band in consideration of the degree of freedom in design.

Note that the holes may be arranged in patterns similar to each other in a two-layer plasmon resonator structure, for example, other than the structure like the plasmon filter 121D in which the holes are arranged in the same pattern in the plasmon filter 121D-1 and the plasmon filter 121D-2. Furthermore, holes and dots may be arranged in a pattern in which a hole array structure and a dot array structure (to be described below) are inverted in the two-layer plasmon resonator structure. Moreover, a three or more multilayer structure can be adopted although the plasmon filter 121D has the two-layer structure.

Furthermore, in the above description, the configuration example of the plasmon filter using the plasmon resonator having the hole array structure has been described. However, a plasmon resonator having a dot array structure may be adopted as the plasmon filter.

A plasmon filter having a dot array structure will be described with reference to FIGS. 12A and 12B.

Figure 12:
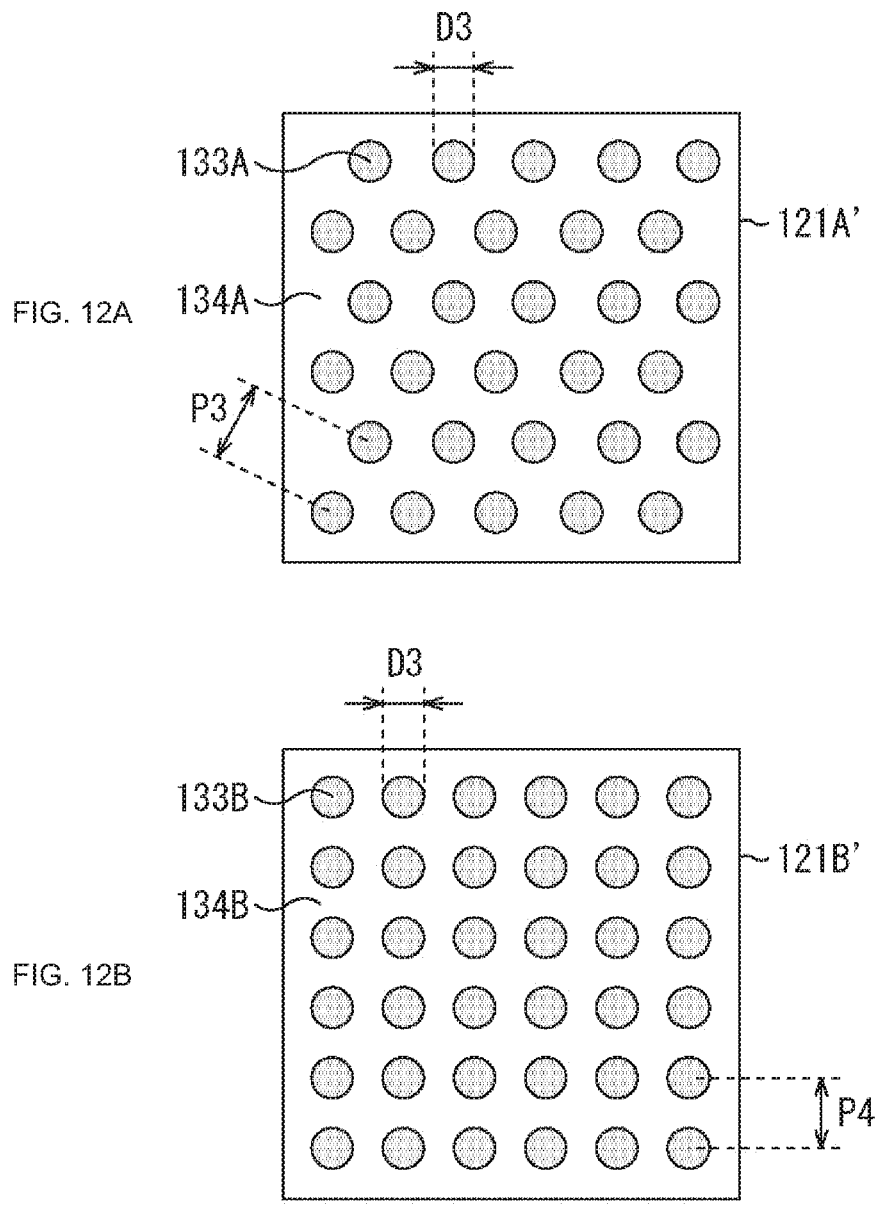
FIGS. 12A and 12B are views illustrating configuration examples of a plasmon filter having a dot array structure.

A plasmon filter 121A' in FIG. 12A has a negative-positive inverted structure with respect to the plasmon resonator of the plasmon filter 121A in FIG. 4, that is, configured by a plasmon resonator in which dots 133A are arranged in a honeycomb manner in a dielectric layer 134A. The dielectric layer 134A is added between the dots 133A.

The plasmon filter 121A' is used as a complementary color filter to absorb light in a predetermined wavelength band. The wavelength band (hereinafter referred to as absorption band) of light absorbed by the plasmon filter 121A' changes depending on a pitch between adjacent dots 133A (hereinafter referred to as a dot pitch) P3, or the like. Furthermore, a diameter D3 of the dot 133A is adjusted according to the dot pitch P3.

A plasmon filter 121B' in FIG. 12B has a negative-positive inverted structure with respect to the plasmon resonator of the plasmon filter 121B in FIG. 10A, that is, a plasmon resonator structure in which dots 133B are arranged in a straight matrix in a dielectric layer 134B. The dielectric layer 134B is added between the dots 133B.

The absorption band of the plasmon filter 121B' changes depending on a dot pitch P4 between adjacent dots 133B, or the like. Furthermore, a diameter D3 of the dot 133B is adjusted according to the dot pitch P4.

Figure 13:
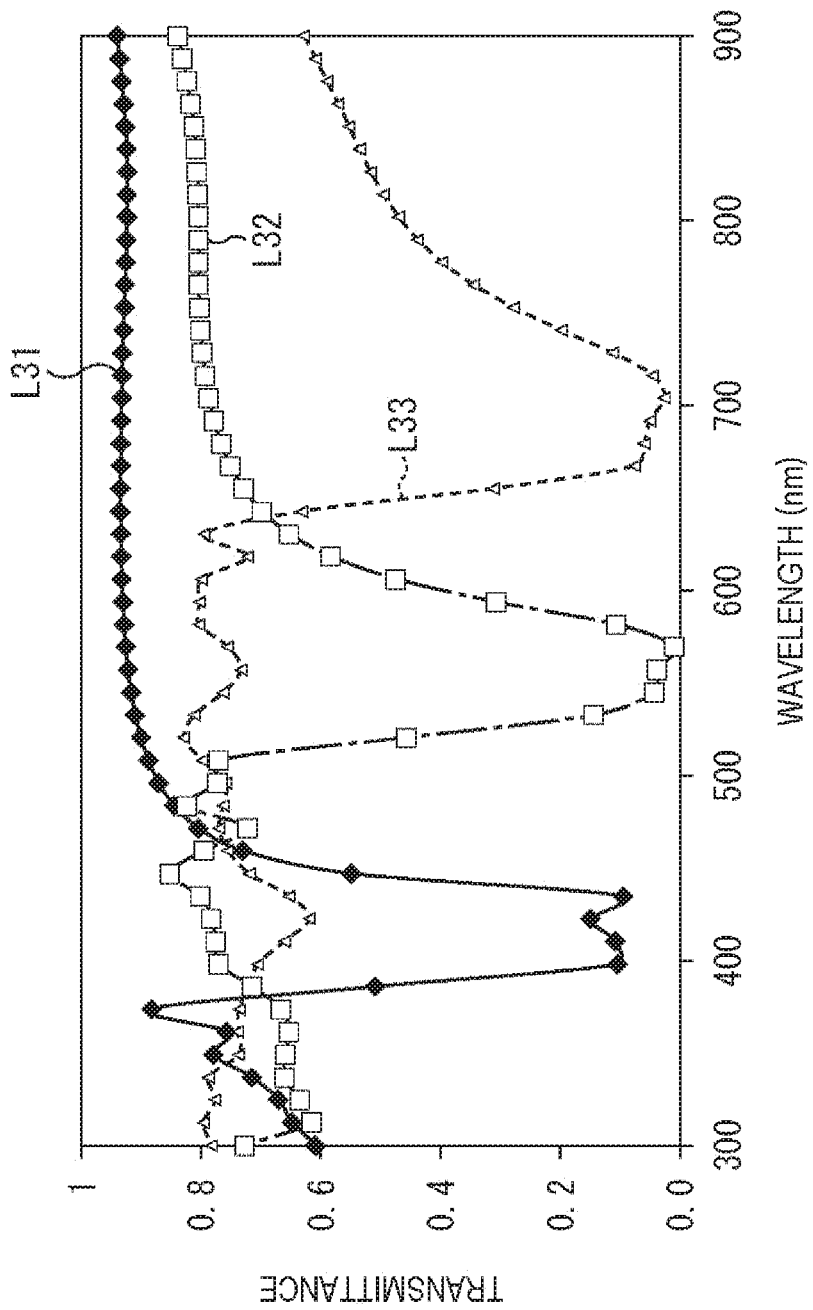
FIG. 13 is a graph illustrating an example of spectral characteristics of the plasmon filter having a dot array structure.

FIG. 13 is a graph illustrating an example of spectral characteristics in a case where the dot pitch P3 of the plasmon filter 121A' in FIG. 12A is changed. The horizontal axis of the graph represents the wavelength (the unit is nm), and the vertical axis represents the transmittance. A line L31 represents a spectral characteristic in a case where the dot pitch P3 is set to 300 nm, a line L32 represents a spectral characteristic in a case where the dot pitch P3 is set to 400 nm, and a line L33 represents a spectral characteristic in a case where the dot pitch P3 is set to 500 nm.

As illustrated in FIG. 13, the absorption band of the plasmon filter 121A' shifts to a shorter wavelength side as the dot pitch P3 becomes narrower, and the absorption band of the plasmon filter 121A' shifts to a longer wavelength side as the dot pitch P3 becomes wider.

Note that, in any of the plasmon filters having the hole array structure and the dot array structure, the transmission band or the absorption band can be adjusted by simply adjusting the pitch in a planar direction of the holes or dots. Therefore, for example, the transmission band or the absorption band can be individually set for each pixel by simply adjusting the pitch of holes or dots in a lithography process, and multi-coloring of the filter can be implemented with fewer steps.

Furthermore, the thickness of the plasmon filter is about 100 to 500 nm, which is nearly similar to an organic material-based color filter, and process affinity is good.

Figure 14:
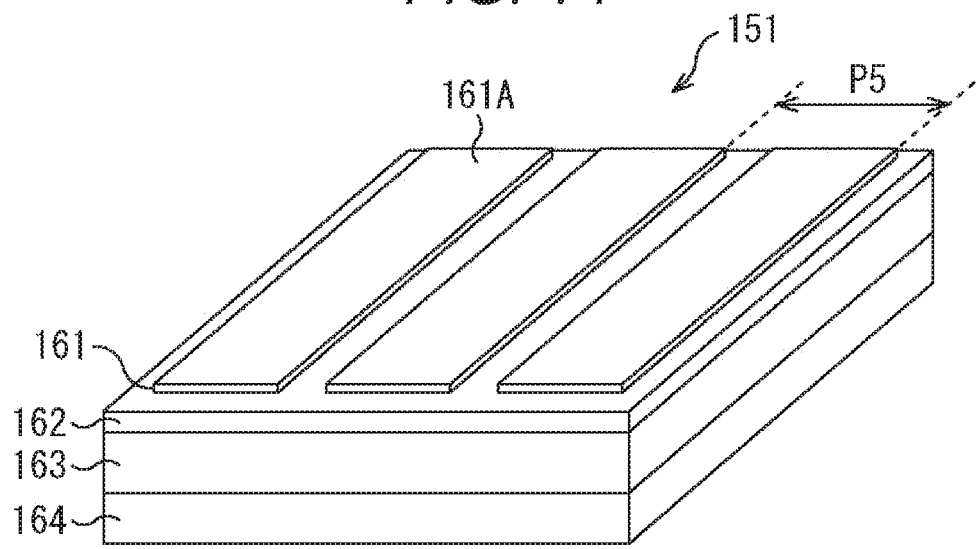
FIG. 14 is a view illustrating a configuration example of a plasmon filter using GMR.

Furthermore, a plasmon filter 151 using guided mode resonant (GMR) illustrated in FIG. 14 can be used as the narrow band filter NB.

In the plasmon filter 151, a conductive layer 161, a SiO2 film 162, a SiN film 163, and a SiO2 substrate 164 are stacked in order from the top. The conductive layer 161 is included in, for example, the narrow band filter layer 103 in FIG. 3, and the SiO2 film 162, the SiN film 163, and the SiO2 substrate 164 are included in, for example, the interlayer film 104 in FIG. 3.

On the conductive layer 161, rectangular conductive thin films 161A containing, for example, aluminum are arranged at a predetermined pitch P5 in such a manner that long sides of the conductive thin films 161A are adjacent to each other. Then, the transmission band of the plasmon filter 151 changes depending on the pitch P5 or the like.

Figure 15:
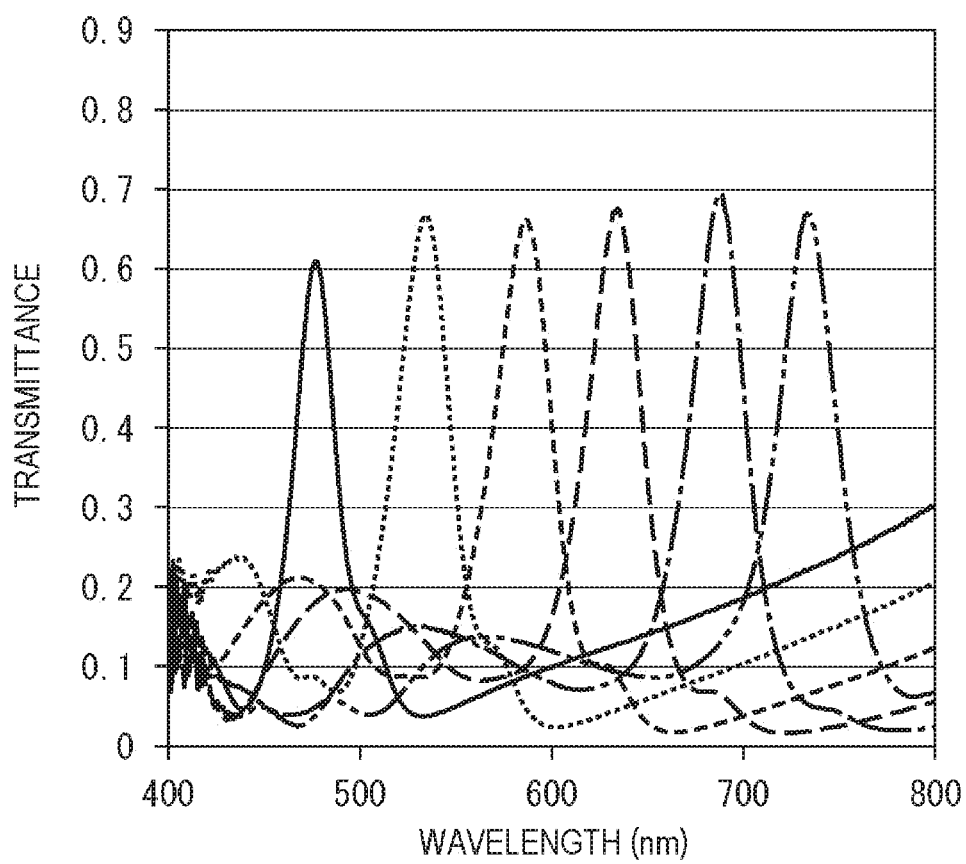
FIG. 15 is a graph illustrating an example of spectral characteristics of the plasmon filter using GMR.

FIG. 15 is a graph illustrating an example of spectral characteristics of the plasmon filter 151 in a case where the hole pitch P5 is changed. The horizontal axis of the graph represents the wavelength (the unit is nm), and the vertical axis represents the transmittance. This example illustrates an example of spectral characteristics in a case where the pitch P5 is changed into six types at intervals of 40 nm from 280 nm to 480 nm, and a slit width between the adjacent conductive thin films 161A is set to ¼ of the pitch P5. Furthermore, a waveform having the shortest peak wavelength of the transmission band represents the spectral characteristic of the case where the pitch P5 is set to 280 nm, and the peak wavelength becomes longer as the pitch P5 becomes wider. That is, the transmission band of the plasmon filter 151 shifts to a shorter wavelength side as the pitch P5 becomes narrower, and the transmission band of the plasmon filter 151 shifts to a longer wavelength side as the pitch P5 becomes wider.

The plasmon filter 151 using GMR also has good affinity for an organic material-based color filter, similarly to the above-described plasmon filters having the hole array structure and the dot array structure.

As the plasmon filter, for example, a filter having a shape called a bull's eye (hereinafter, referred to as a bullseye structure) can be applied, other than the hole array structure, the dot array structure, and the structure using GMR. The bullseye structure is a name given because the structure resembles a dart target or a bow and arrow target.

Figure 16A:
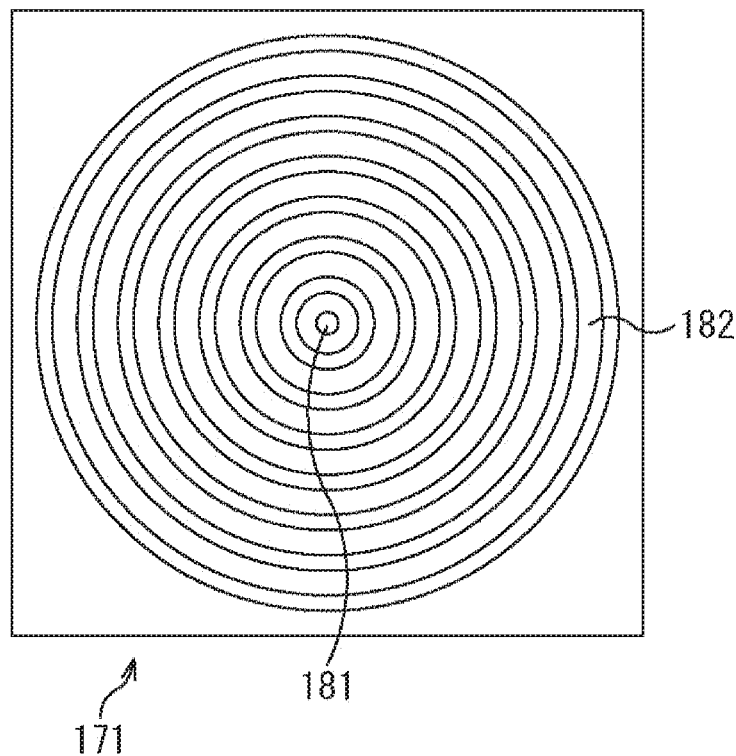
FIGS. 16A and 16B are views illustrating configuration examples of a plasmon filter having a bullseye structure.
Figure 16B:
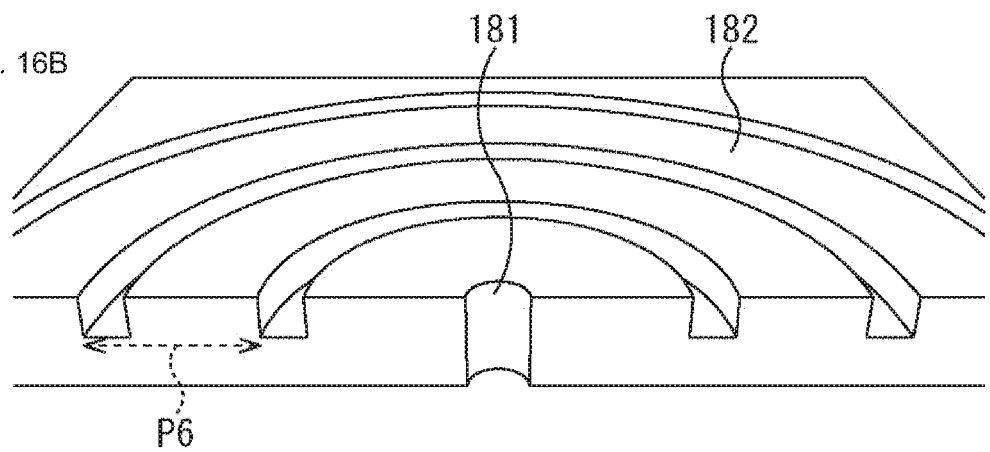

As illustrated in FIG. 16A, a plasmon filter 171 having the bullseye structure has a through hole 181 in the center, and includes a plurality of protrusions 182 concentrically formed around the through hole 181. That is, the plasmon filter 171 having the bullseye structure has a shape to which a metal diffraction grating structure that causes plasmon resonance is applied.

The plasmon filter 171 having the bullseye structure has similar characteristics to the plasmon filter 151 using GMR.

That is, in a case where the distance between the protrusions 182 is a pitch P6, the transmission band of the plasmon filter 171 shifts to a shorter wavelength side as the pitch P6 becomes narrower, and the transmission band of the plasmon filter 171 shifts to a longer wavelength side as the pitch P6 becomes wider.

As a filter that transmits light of a specific wavelength, there is a Fabry-Perot interferometer. A Fabry-Perot interferometer can be used as the narrow band filter to which the present technology is applied, instead of a plasmon filter.

Figure 17:
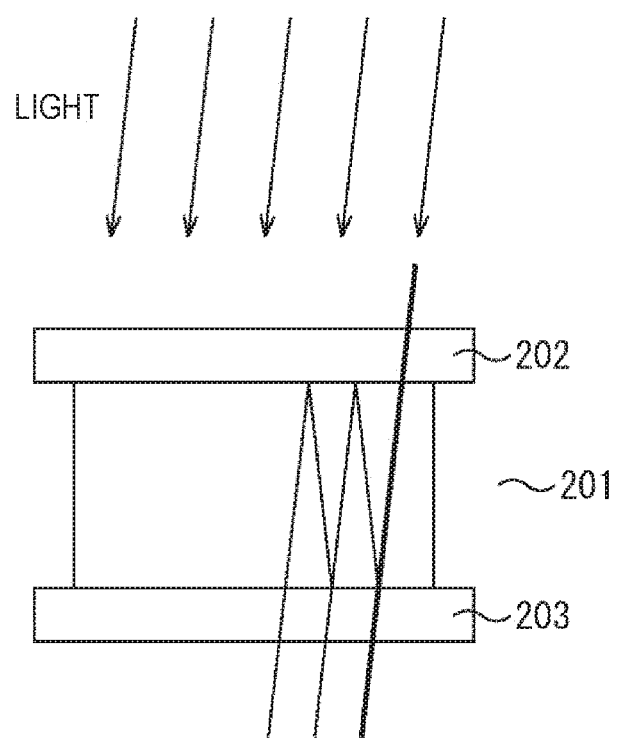
FIG. 17 is a view for describing a Fabry-Perot interferometer.

A Fabry-Perot interferometer 201 is an optical device including two semi-transparent mirrors 202 and 203, and having the two semi-transparent mirrors 202 and 203 arranged to face each other in parallel, as illustrated in FIG. 17. The semi-transparent mirrors 202 and 203 are finished with a reflective surface having high reflectance and slight transmittance.

Light incident on one side of the Fabry-Perot interferometers 201 (upper side in FIG. 17) reflects and reciprocates between the two reflective surfaces many times and interferes with each other. The light transmitted through the semi-transparent mirror 203 becomes interference light having a considerable length due to the light that has reciprocated many times with a certain optical path difference. Therefore, if the Fabry-Perot interferometer 201 is used as a spectroscope, a very high resolution can be obtained.

That is, a wavelength to be analyzed by the Fabry-Perot interferometer 201, of the incident light, can be selected by the Fabry-Perot interferometer 201, and the selected light can be received by the photodiode 61, similarly to the above-described plasmon filter 121 (151).

The examples of the narrow band filter NB applicable to an imaging device to which the present technology is applied include the above-described plasmon filters having, for example, the hole array structure, the dot array structure, the GMR, and the bullseye structure, and the Fabry-Perot interferometer.

The following description will be given using the case where the narrow band filter NB is the plasmon filter 121 having the hole array structure. However, the plasmon filter having, for example, the dot array structure, the GMR, or the bullseye structure, or the Fabry-Perot interferometer can be applied, and the description will be continued on the assumption that the plasmon filter 121 can be appropriately replaced with the plasmon filter having, for example, the dot array structure, the GMR, or the bullseye structure, or the Fabry-Perot interferometer.

<Influence Due to Reflection>

A metal-made conductive thin film is formed on the plasmon filter 121. Since the conductive thin film has high reflectance, the conductive thin film can easily reflect light having a wavelength other than a transmission band. For this reason, there is a possibility that incident light is reflected multiple times, and a spectrum ripple characteristic is deteriorated. This possibility will be described with reference to FIG. 18. The following description will be given by reference to a more simplified configuration example of the pixel 51 than the configuration example illustrated in FIG. 3.

Figure 18:
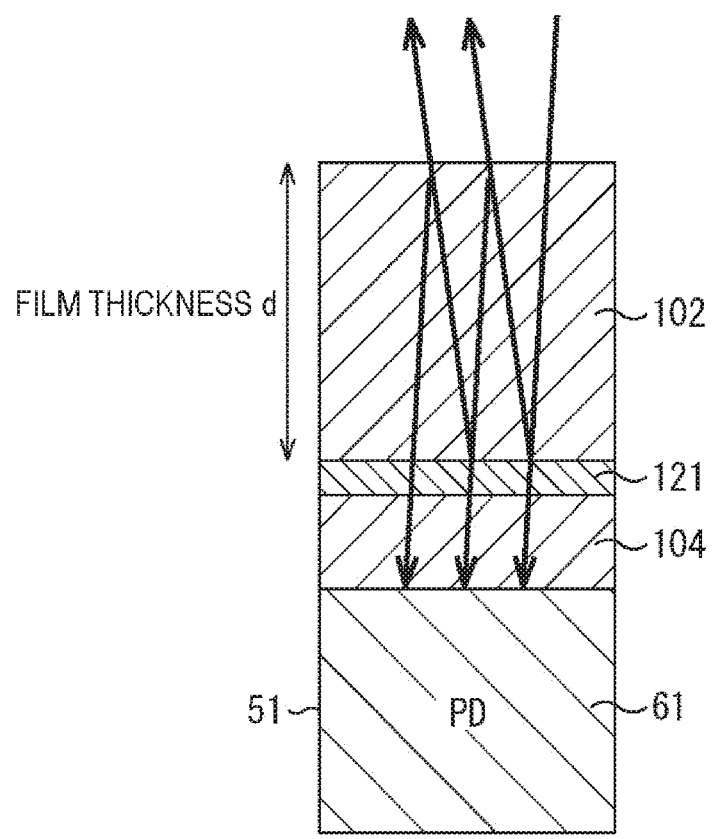
FIG. 18 is a view illustrating a configuration of a pixel including a plasmon filter.

FIG. 18 is a diagram for describing that there is a possibility of deterioration of ripple characteristics in the pixel 51. In the pixel illustrated in FIG. 18, the interlayer film 102, the plasmon filter 121, the interlayer film 104, and the photodiode 61 are stacked in order from the top. The plasmon filter 121 configures the narrow band filter layer 103 in FIG. 3, and the photodiode 61 represents one photoelectric conversion element included in the photoelectric conversion element layer 105.

The arrows in FIG. 18 represent incident light and reflected light. The plasmon filter 121 easily reflects the incident light because a metal is exposed on the surface. Part of the incident light is reflected by the plasmon filter 121, and part of the reflected light is reflected again at the interface of the interlayer film 102 and reaches the plasmon filter 121 again. Part of the reflected light having entered the plasmon filter 121 again is reflected by the plasmon filter 121 again.

Thus, there is a possibility that reflection is repeated at the interface between the plasmon filter 121 and the interlayer film 102. Such multiple reflection becomes a cause of deterioration of ripple characteristics. For example, when such multiple reflection occurs in a state where phases of incident lights are easily aligned, a peak and a trough of a waveform due to an interference tend to appear, and the ripple characteristics deteriorate.

Here, a refractive index of the interlayer film 102 is n and a film thickness is d. For simplification of description, a case where light is incident at an incidence angle of θ degrees is assumed. An optical path difference between the incident light and the first reflected light at the plasmon filter 121 is the optical path difference=2×n×d×cos θ. That is, the optical path difference becomes a value obtained by multiplying 2, the refractive index n, the film thickness d, and cos θ.

Here, in a case where the interlayer film 102 is a stacked film having a plurality of different refractive indexes, a refractive index $n_a v_g$ of the interlayer film 102 can be expressed by a weighted average of the film thicknesses. For example, in the case of a stacked film including a to x layers, the average refractive index $n_a v_g$ can be expressed as:

$$n_{avg} = (n_a \times d_a + n_b \times d_b + n_c \times d_c + \ldots + n_x \times d_x)/(d_a + d_b + d_c + \ldots + d_x)$$

where refractive indexes of the films are $n_a$ to $n_x$, and the film thicknesses of the films are $d_a$ to $d_x$.

In the case where the interlayer film 102 is the stacked film having a plurality of different refractive indexes, the above-described refractive index $n_{avg}$ is used in calculation as the refractive index n.

Condition 1

When the optical path difference becomes an integral multiple of the wavelength, the incident light and the reflected light intensify each other. That is, $$2nd \cdot \cos \theta = m\lambda$$

m is an arbitrary integer and λ represents the wavelength. This expression is defined as condition 1. When light having a wavelength that satisfies the condition 1 is incident, the influence of multiple reflection is considered to increase.

The above-described Fabry-Perot interferometer 201 (FIG. 17) extracts the wavelength λ satisfying the condition 1 as a desired wavelength λ.

In a case of forming the plasmon filter 121, an unintended Fabry-Perot interference occurs, so that the interference appears as ripples in the spectral characteristics, and the spectral characteristics may deteriorate.

Figure 19:
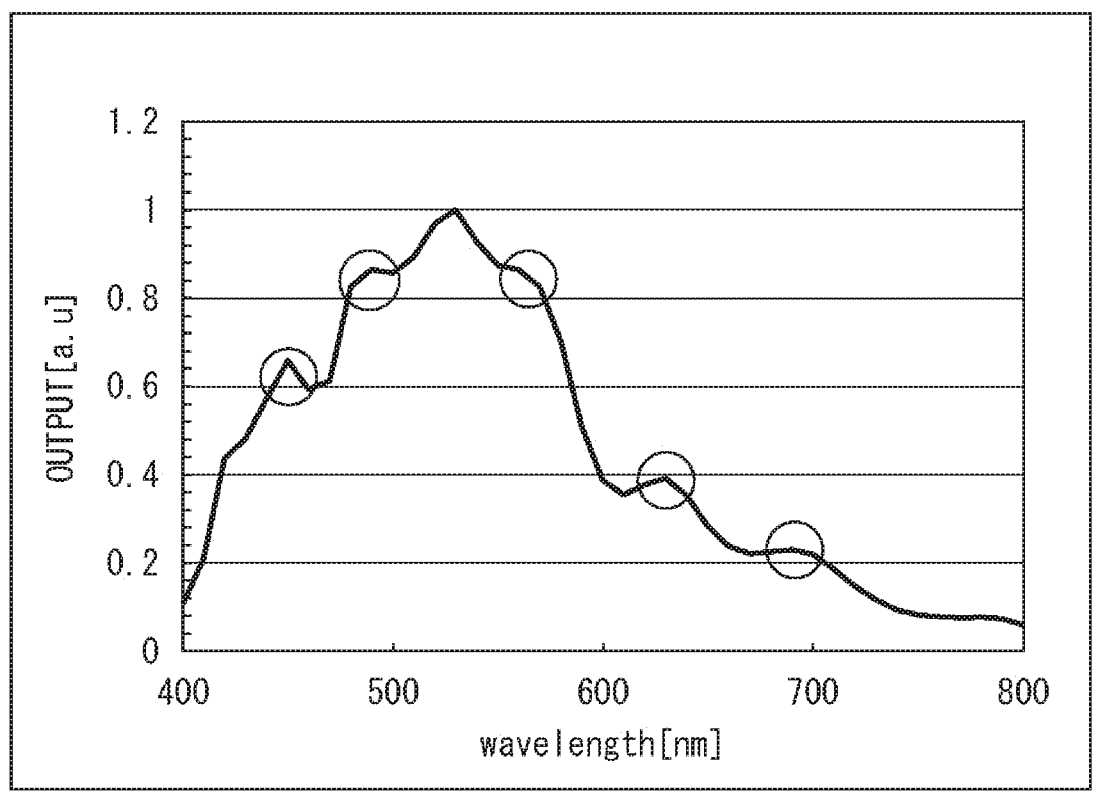
FIG. 19 is a graph for describing occurrence of a ripple.

FIG. 19 illustrates an example of a result of measurement of an output value from the photodiode 61 when light having a predetermined wavelength is incident as incident light on the pixel 51 illustrated in FIG. 18. In the graph illustrated in FIG. 19, the horizontal axis represents the wavelength of the incident light, and the vertical axis represents the output value.

As described above, since the plasmon filter 121 is a filter having a function to transmit the light having a predetermined wavelength, the graph has a peak value at the predetermined wavelength.

In FIG. 19, portions surrounded by circles indicate portions where ripples appear in the spectral characteristics as a result of multiple reflection. As described above, the light having a predetermined wavelength is reflected multiple times, appears as a ripple, and may deteriorate the spectral characteristics.

As described above, the wavelength of light that may appear as ripples is the wavelength that satisfies the condition 1. By using the above point, occurrence of ripples can be prevented by causing lights to interfere and weaken each other so as not to satisfy the condition 1.

The condition 1 includes the refractive index n, the film thickness d, the incidence angle θ, and the wavelength λ of the interlayer film 102. To prevent occurrence of the Fabry-Perot interference in light at the predetermined wavelength λ, it can be seen that, for example, the film thickness d may be changed.

Therefore, a configuration of the pixel 51 that prevents deterioration of the spectral characteristics by changing the film thickness d will be described below.

Pixel in First Embodiment

Figure 20:
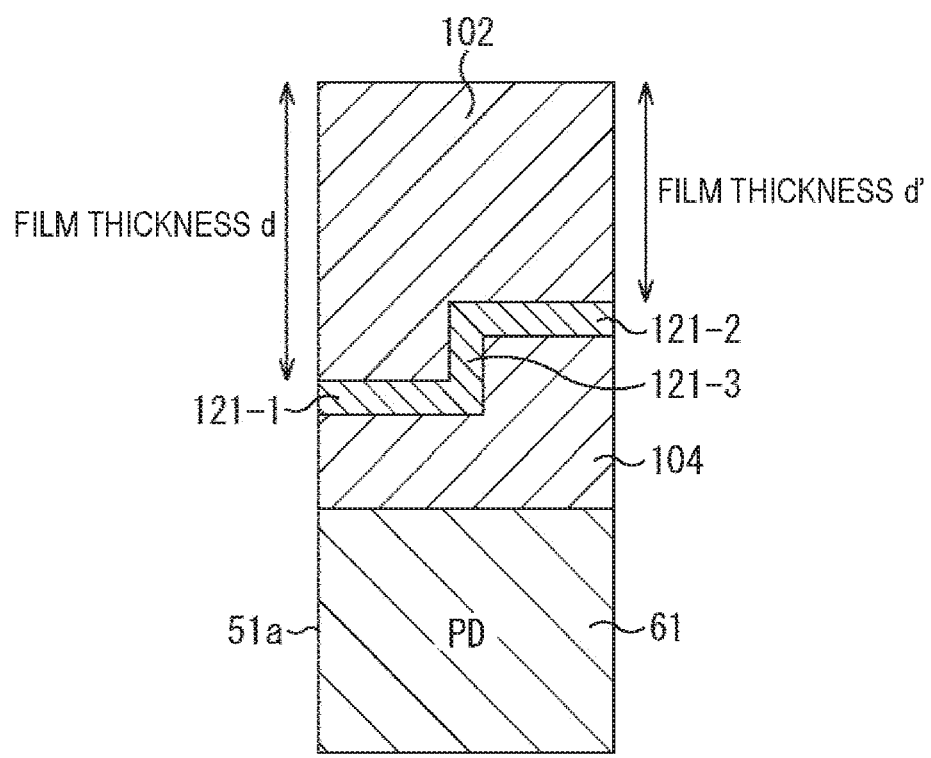
FIG. 20 is a view illustrating a configuration of a pixel in the first embodiment.

FIG. 20 is a diagram illustrating a configuration of a pixel 51a in a first embodiment. The pixel 51a illustrated in FIG. 20 includes plasmon filters 121 having different heights within the pixel.

Here, the plasmon filter 121 will be described by dividing the plasmon filter 121 into a plasmon filter 121-1, a plasmon filter 121-2, and a plasmon filter 121-3.

The plasmon filter 121-1 and the plasmon filter 121-2 are formed at different positions. The plasmon filter 121-1 and the plasmon filter 121-2 are formed at positions where depths from an interface of an interlayer film 102, that is, film thicknesses are different.

The plasmon filter 121-1 is formed at a position where the film thickness of the interlayer film 102 is a film thickness d. The plasmon filter 121-2 is formed at a position where the film thickness of the interlayer film 102 is a film thickness d'. The film thickness d and the film thickness d' satisfy a relationship of the film thickness d>the film thickness d'.

That is, the plasmon filter 121-1 is formed at the position deeper from the interface of the interlayer film 102 than the plasmon filter 121-2.

The plasmon filter 121-3 is formed in a vertical direction (depth direction) connecting one end of the plasmon filter 121-1 and one end of the plasmon filter 121-2.

Note that the position of the plasmon filter 121 has been described using the film thickness of the interlayer film 102 as a reference. However, the position of the plasmon filter 121 may be set using the film thickness of an interlayer film 104, in other words, a distance from an interface of a photodiode 61 using the interface of the photodiode 61 as a reference.

Furthermore, the interlayer film 102 may be a single layer or a multilayer. In the case where the interlayer film 102 is multilayer, the film thicknesses of the multilayer are the film thickness d and the film thickness d'. Furthermore, in a case of the pixel 51a including a color filter, the thickness of the color filter is also included in the film thickness d and the film thickness d'.

The film thickness d and the film thickness d' are the interface of the interlayer film 102, and this interface can be a boundary between the interlayer film 102 and an air layer or a boundary between the interlayer film 102 and an on-chip microlens 101 (FIG. 3).

In the pixel 51a including the plasmon filters 121 formed at different positions, occurrence of ripples and deterioration of characteristics can be prevented, as described above, which will be described.

Figure 21:
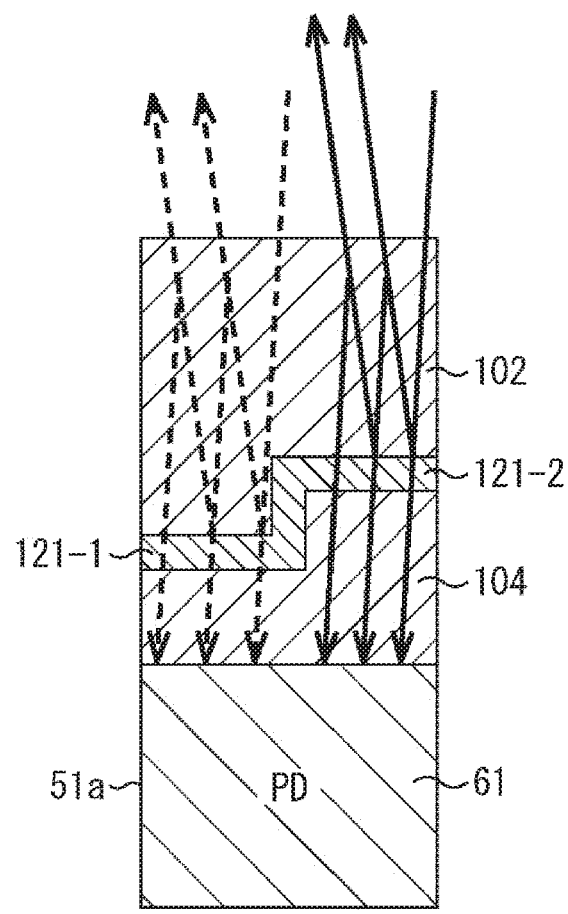
FIG. 21 is a view for describing suppression of a ripple.

FIG. 21 is a diagram illustrating incident light and reflected light of when light enters the pixel 51a by the arrows, as in FIG. 18. In FIG. 21, the arrows illustrated by the dotted lines represent the incident light and the reflected light on the plasmon filter 121-1 side, and the arrows illustrated by the solid lines represent the incident light and the reflected light on the plasmon filter 121-2 side.

FIG. 22A is a graph by a dotted line, illustrating results of measurement of output values from the photodiode 61 when light having a predetermined wavelength enters, as incident light, the pixel 51a provided with the plasmon filter 121 at the position of the plasmon filter 121-1, and a graph by a solid line, illustrating results of measurement of output values from the photodiode 61 when light having a predetermined wavelength enters, as incident light, the pixel 51a provided with the plasmon filter 121 at the position of the plasmon filter 121-2. In the graph illustrated in FIGS. 22A and 22B, the horizontal axis represents the wavelength of the incident light, and the vertical axis represents an output value.

As illustrated in FIG. 22A, since the plasmon filter 121-1 and the plasmon filter 121-2 have the same wavelength to be extracted, values at the same wavelength, for example, at around 550 nm in FIGS. 22A and 22B, are peak values. In FIG. 22A, the peak value of the graph by the dotted line and the peak value of the graph by the solid line are substantially the same value.

Referring to the graph by the dotted line and the graph by the solid line in FIG. 22A, occurrence of ripples can read. That is, as described above, the pixel 51a that receives light using only the plasmon filter 121-1 or the plasmon filter 121-2 has a possibility of occurrence of ripples. However, as illustrated in FIG. 22B, according to the pixel 51a illustrated in FIG. 21, an output in which occurrence of ripples is suppressed can be obtained.

According to the pixel 51A illustrated in FIG. 21, the plasmon filter 121-1 and the plasmon filter 121-2 having different depths from the interface of the interlayer film 102 are provided in the same pixel. Therefore, the spectral characteristics can be obtained from the respective plasmon filters 121, as illustrated in FIG. 22A, and as an output value, the output value having the spectral characteristics obtained by adding the two spectral characteristics can be obtained.

With the plasmon filter 121-1 and the plasmon filter 121-2, the reflected light from the plasmon filter 121-1 and the reflected light from the plasmon filter 121-2 interfere with each other, thereby reducing intensification of only a specific wavelength and suppressing occurrence of ripples.

To reduce intensification of a specific wavelength as described above, the film thickness d and the film thickness d' are set under the following condition. That is, the wavelength of a ripple to be suppressed is set, and the film thickness d and the film thickness d' are set according to the following condition (condition 2) in accordance with the wavelength of the ripple to be suppressed.

Condition 2

As illustrated in FIG. 20, the condition 2 is expressed as follows when the film thickness of the interlayer film 102 on the plasmon filter 121-1 is the film thickness d, the film thickness of the interlayer film 102 on the plasmon filter 121-2 is the film thickness d', the refractive index of the interlayer film 102 is the refractive index n, the wavelength for suppressing ripples is a wavelength $\lambda r$, a film thickness difference of the interlayer film is (d–d'), and m is an arbitrary integer.

$$(d-d')=\lambda r(m+¼)/n$$

When the condition 2 is set in this manner, the light having the wavelength $\lambda r$ can be eliminated by an interference because the optical path difference becomes a half cycle of $\lambda r$. That is, it is only required to set the film thickness difference (d–d') to a size about ¼ of the wavelength of interest that is the wavelength at which a ripple is to be reduced.

For example, in a case where the wavelength of interest at which a ripple is to be suppressed is 600 nm and m=0, $$(d-d')=(150/n)$$

is obtained. Therefore, in a case of reducing a ripple due to light having the wavelength of 600 nm, (d–d') that is the difference between the film thickness d and the film thickness d' is designed to satisfy (150/n) nm.

By making the installation positions of the plasmon filters 121 different as described above, and by setting the difference between the installation positions ((d–d') in the above example) to the value at which a ripple is to be suppressed, the ripple can be more appropriately suppressed.

Note that, in a case where the condition 2 is $$(d-d')=\lambda r(m+½)/n,$$

lights intensify each other and ripples are emphasized. Therefore, setting of a value that satisfies this condition is avoided.

Other Configuration Examples of Pixel

Figure 23:
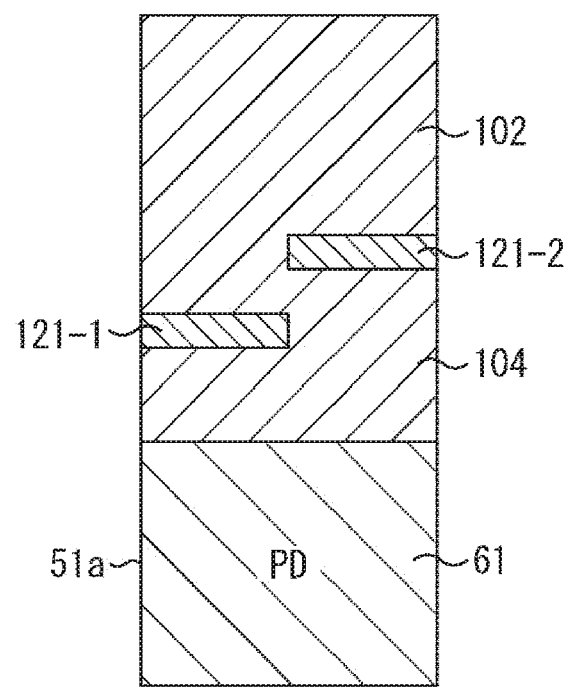
FIG. 23 is a view illustrating another configuration of the pixel in the first embodiment.

Another configuration of the pixel 51a will be described. FIG. 23 is a diagram illustrating another configuration example of the pixel 51a. Comparing the pixel 51a illustrated in FIG. 23 with the pixel 51a illustrated in FIG. 20, the pixel 51a in FIG. 23 is different in a configuration obtained by removing the plasmon filter 121-3 from the pixel 51a in FIG. 20 and is similar to the pixel 51a in FIG. 20 in other points.

As illustrated in FIG. 23, the plasmon filter 121 may include the plasmon filter 121-1 and the plasmon filter 121-2. In other words, the plasmon filters 121 (corresponding to the plasmon filters 121-1 and 121-2) are provided on a plane parallel to an incident surface, and the plasmon filter 121 in a vertical direction (corresponding to the plasmon filter 121-3) is not provided.

As illustrated in FIG. 23, in the case of the configuration in which the plasmon filter 121-3 (not illustrated in FIG. 23) in the vertical direction is not formed, a process of forming the plasmon filter 121-3 in the vertical direction can be omitted in a process of manufacturing the pixel 51a, for example.

As illustrated in FIG. 23, in the case of the configuration in which the plasmon filter 121-3 (not illustrated in FIG. 23) in the vertical direction is not formed, there may be incident light entering the photodiode 61 through a gap caused by a difference in height between the plasmon filter 121-1 and the plasmon filter 121-2 without through the plasmon filters 121.

To decrease an influence by such incident light, the plasmon filter 121-2 may be formed to be slightly large, for example, so that the plasmon filter 121-1 and the plasmon filter 121-2 have an overlapping portion.

Figure 24:
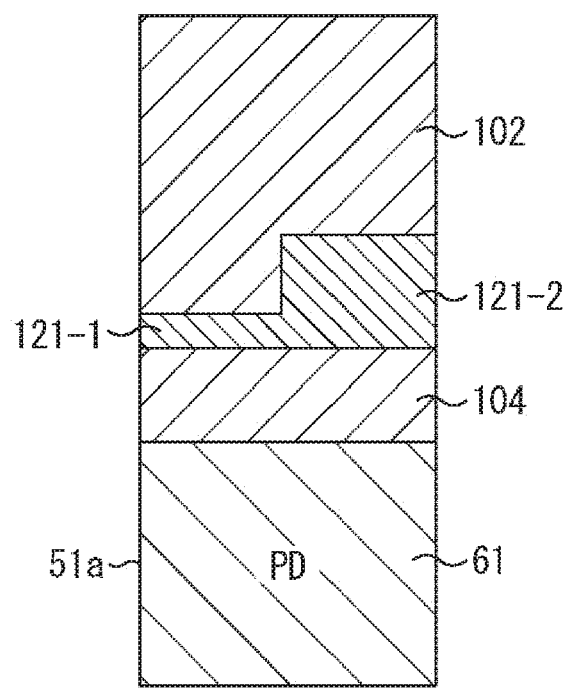
FIG. 24 is a view illustrating another configuration of the pixel in the first embodiment.

FIG. 24 is a diagram illustrating still another configuration example of the pixel 51a. Comparing the pixel 51a illustrated in FIG. 24 with the pixel 51a illustrated in FIG. 20, the pixel 51a in FIG. 24 is different in a configuration obtained by increasing the thickness of the plasmon filter 121-2 of the pixel 51a in FIG. 20 and is similar to the pixel 51a in FIG. 20 in other points.

The interface of the plasmon filter 121-1 on the photodiode 61 side and the interface of the plasmon filter 121-2 on the photodiode 61 side of the pixel 51a in FIG. 24 are the same plane. As a result, the film thickness of the plasmon filter 121-2 is formed thicker than the film thickness of the plasmon filter 121-1. In other words, the difference between the film thickness of the plasmon filter 121-1 and the film thickness of the plasmon filter 121-2 corresponds to the difference (d–d') between the film thickness d and the film thickness d' of the interlayer film 102.

Here, description has been given using the case where the difference between the film thickness of the plasmon filter 121-1 and the film thickness of the plasmon filter 121-2 corresponds to the difference (d–d') between the film thickness d and the film thickness d' of the interlayer film 102 as an example. However, in the plasmon filters 121 described above and below, the film thickness of the plasmon filter 121-1 and the film thickness of the plasmon filter 121-2 may be the same or may be different.

According to the pixel 51a illustrated in FIG. 24, the plasmon filter 121-1 and the plasmon filter 121-2 may not able to obtain the same performance because the plasmon filter 121-1 and the plasmon filter 121-2 have the different thicknesses. In other words, characteristics of light transmitted through the plasmon filter 121-1 and characteristics of light transmitted through the plasmon filter 121-2 may be different. The pixel 51a using the difference in characteristics between the plasmon filter 121-1 and the plasmon filter 121-2 can be obtained.

<Conditions Regarding Level Difference of Plasmon Filter>

As described above, in the present embodiment, the plasmon filters 121 are formed at positions having different depths from the interface of the interlayer film 102. Referring to FIG. 20 again, the plasmon filter 121-1 and the plasmon filter 121-2 are formed at different positions, and the two plasmon filters 121 are formed to have a level difference.

The level difference between the two plasmon filters 121 corresponds to (the film thickness d–the film thickness d') in FIG. 20. This level difference will be described with reference to FIGS. 25, 26A, 26B, and 27.

Figure 25:
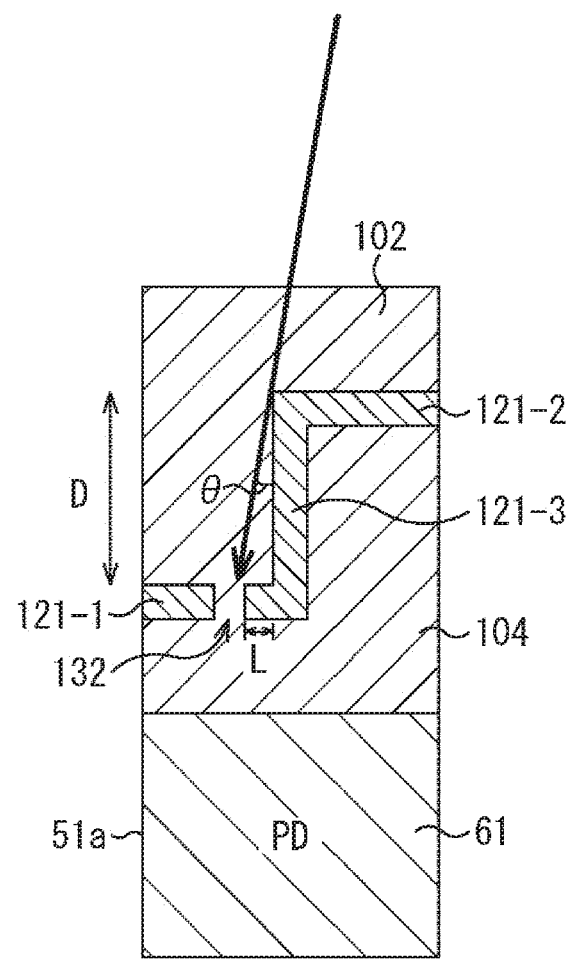
FIG. 25 is a view for describing a size of a level difference of a plasmon filter.

FIG. 25 is the same as the pixel 51a illustrated in FIG. 20, but illustrates a hole formed in the plasmon filter 121, and also illustrates a level difference portion in an enlarged manner. First, the level difference is (the film thickness d–the film thickness d') as described above. Hereinafter, the level difference will be described as a level difference D.

A minimum level difference Dmin of the level difference D is set in accordance with the shortest wavelength received by the pixel 51a. The minimum level difference Dmin is the minimum level difference required to obtain an effect in a case where the level difference D is provided in the plasmon filter 121 to suppress ripples. By setting the level difference D to be equal to or larger than the minimum level difference Dmin, a desired effect can be obtained.

For example, in a case of the pixel 51a that is assumed to receive visible light, for example, 400 nm is set as the shortest wavelength. In this case, the minimum wavelength at which ripples may occur is 400 nm.

Therefore, to reduce the ripples due to the light having the wavelength of 400 nm, 400/4n=100/n (nm) is obtained from the condition 2. In this case, the minimum level difference Dmin of the plasmon filter 121 is set to 100/n (nm).

As described above, the minimum level difference Dmin can be a value derived under the condition 2 according to the shortest wavelength received by the pixel 51a.

Meanwhile, the maximum level difference of the level difference D is determined by an influence of shadowing due to the level difference D. The maximum level difference of the level difference D is the maximum level difference at which an effect can be obtained in a case where the level difference D is provided in the plasmon filter 121 to suppress ripples. By setting the level difference D to be equal to or smaller than the maximum level difference, a desired effect can be obtained.

In a case where all of light entering (the photodiode 61 of) the pixel 51a is incident at an incidence angle of 0 degrees, the maximum level difference is not particularly limited and is set to an arbitrary level difference D. However, in practice, not all the light is incident at 0 degrees, and effects of chief ray angle (CRA), F-number light, lens aberration, and the like need to be considered. If the incidence angle of the incident light is all treated to be 0 degrees, there may be a possibility that ripples cannot be appropriately suppressed.

Therefore, the maximum level difference of the level difference D will be considered. Here, the level difference D at which shadowing does not occur in the hole 132 at an end of the plasmon filter 121 will be described. The hole 132 at the end of the plasmon filter 121 is, as illustrated in FIG. 25, a hole 132 formed at a position closest to the plasmon filter 121-3 among the holes 132 formed in the plasmon filter 121-1.

Here, the maximum level difference D is a level difference dmax, the maximum angle of the incident light is an angle θmax, and the distance from the boundary of the plasmon filter 121 to the hole 132 at the end is a distance L. At this time, the distance L can be expressed by the following expression.

$$L = d\mathrm{max} \times \tan(\theta\mathrm{max})$$

Transforming this expression, $$d\ \mathrm{max} = L / \tan(\theta\mathrm{max})$$

is obtained.

Here, the angle θmax is a value obtained from the relational expression:

$$\theta\mathrm{max} = (\mathrm{CRA} + \mathrm{an}\ F\text{-number light maximum incidence angle}) \times (\mathrm{production\ variation}).$$

Figures 26A, 26B:
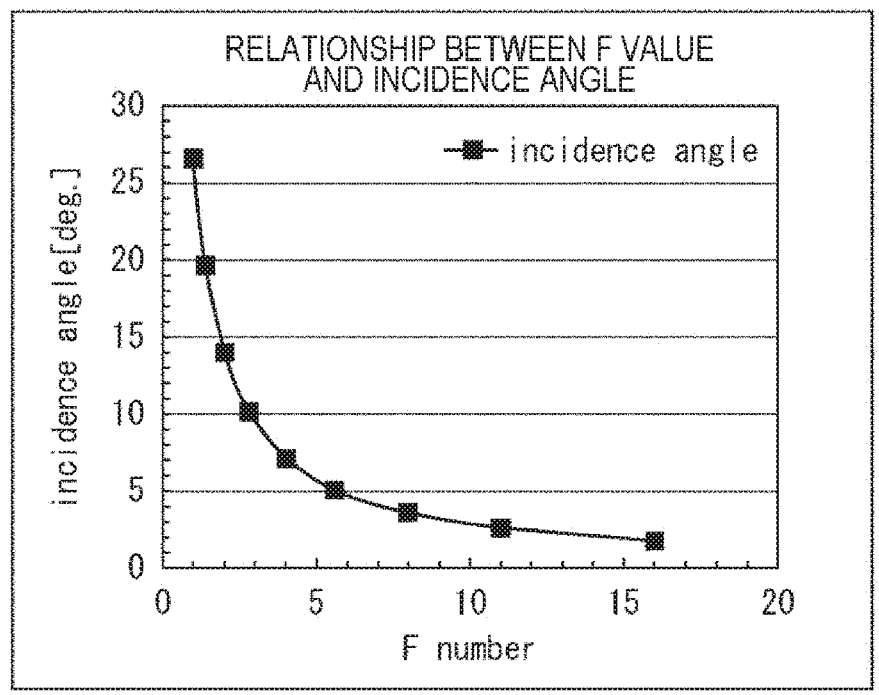
FIGS. 26A and 26B are diagrams for describing the size of the level difference of a plasmon filter.
Figure 27:
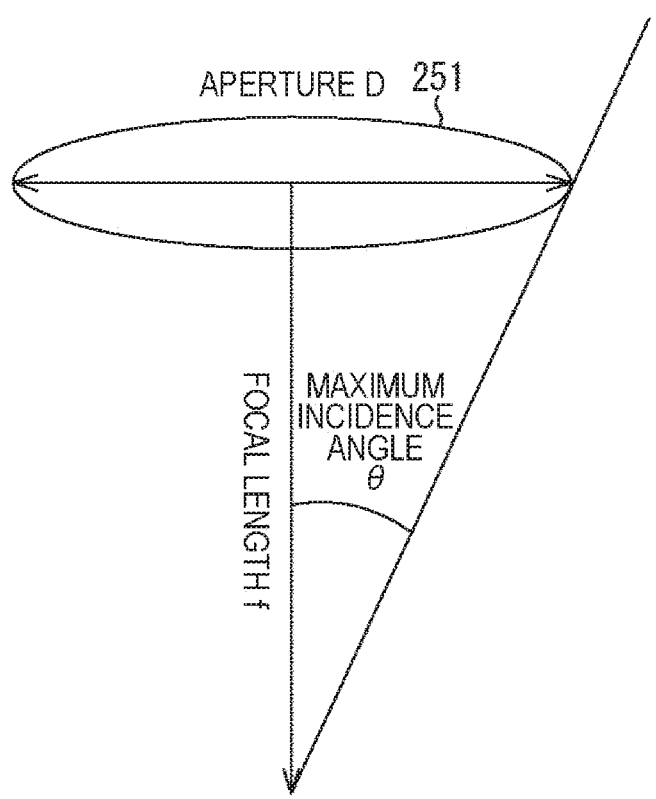
FIG. 27 is a diagram for describing the size of the level difference of a plasmon filter.

The relationship between the F number and the maximum incidence angle has a relationship as illustrated in FIGS. 26A, 26B, and 27. FIG. 26A is a graph illustrating a relationship between the F number and the maximum incidence angle, and FIG. 26B is a table of numbers extracted from the graph.

FIG. 27 is a schematic diagram illustrating a relationship between a lens 251 having an aperture D and the maximum incidence angle. Note that FIG. 27 is a schematic diagram and an actual lens may not strictly match the condition illustrated in FIG. 27 because there are some cases where the lens includes a plurality of lenses or has an aberration.

As illustrated in FIG. 27, the F number of the lens 251 having the aperture D is calculated by the following expression, where a focal length is f:

$$F\ \mathrm{number} = f / D$$

That is, the F number is a value obtained by dividing the focal length f of the lens D by an effective aperture D.

Furthermore, an angle (a one-side angle of an F number light beam) of a straight line connecting an effective aperture end and a focal position with respect to an optical axis is the angle θ (maximum incidence angle θ). The maximum incidence angle θ is calculated by the following expression.

The maximum incidence angleθ=tan$^{-1}$(D/2f)

The maximum level difference dmax between the plasmon filter 121-1 and the plasmon filter 121-2 can be obtained by the above expressions.

The level difference D between the plasmon filter 121-1 and the plasmon filter 121-2 is set to be equal to or larger than the minimum level difference Dmin and equal to or smaller than the maximum level difference dmax.

<Planar Structure of Plasmon Filter>

Figure 28:
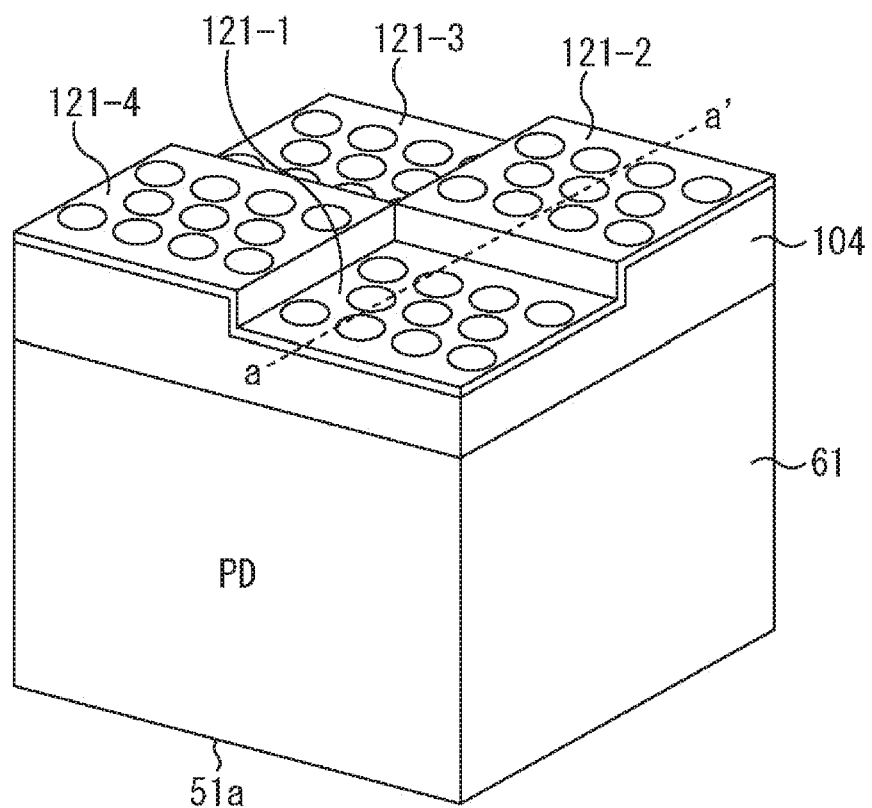
FIG. 28 is a view for describing a configuration of a plane of the plasmon filter.

FIG. 20 has illustrated a cross-sectional structure of the pixel 51*a*. FIG. 28 illustrates a planar structure of the pixel 51*a*, particularly, a planar structure of the plasmon filters 121. Description will be given. A surface of the pixel 51*a* illustrated in FIG. 28 where the plasmon filters 121 are formed is divided into 2×2 four regions, and the plasmon filters 121 are respectively formed in the regions.

In the example of the pixel 51*a* illustrated in FIG. 28, the plasmon filter 121-1 and the plasmon filter 121-3 are formed at the same height, and the plasmon filter 121-2 and a plasmon filter 121-4 are formed at the same height. The plasmon filters 121-1 and 121-3 and the plasmon filters 121-2 and 121-4 are formed at the different heights.

A cross-sectional view taken along line aa' illustrated in FIG. 28 is the cross-sectional view illustrated in FIG. 20. As described above, the incident surface of one pixel 51 is divided into 2×2 four regions, and the plasmon filter 121 is arranged in each of the four divided regions. Since such a 2×2 division has a good symmetric property, an influence of vertical, horizontal, or oblique displacement can be minimized in a photolithography process at the manufacturing, for example.

Although the plasmon filters 121-1 to 121-4 illustrated in FIG. 28 have the same area, the plasmon filters 121-1 to 121-4 may have different areas. Furthermore, the plasmon filters 121-1 to 121-4 illustrated in FIG. 28 have a square shape, but the plasmon filters 121-1 to 121-4 may have shapes other than the square shape. Here, FIGS. 29A, 29B, 29C, 29D, 29E, 30A, 30B, 30C, and 30D illustrate patterns of the shapes of the plasmon filters 121.

FIGS. 29A, 29B, 29C, 29D, 29E, 30A, 30B, 30C, and 30D are views illustrating the shapes of the plasmon filters 121 of when the pixel 51*a* is viewed from the light incident surface side. Furthermore, FIGS. 29A, 29B, 29C, 29D, and 29E illustrate patterns of the shapes of the plasmon filters 121 in a case where the plasmon filters 121 formed in one pixel 51*a* are divided into two regions, and FIGS. 30A, 30B, 30C, and 30D illustrate patterns in a case where the plasmon filters 121 are divided into other regions than two regions.

Furthermore, FIGS. 29A, 29B, 29C, 29D, 29E, 30A, 30B, 30C, and 30D illustrate cases where the plasmon filters 121 are formed at two different heights. For example, as illustrated in FIG. 20, the plasmon filter 121-1 is formed at the low position from the interface of the photodiode 61 (the deep position from the interface of the interlayer film 102), and the plasmon filter 121-2 is formed at the high position from the interface of the photodiode 61 (the shallow position from the interface of the interlayer film 102).

Furthermore, in FIGS. 29A, 29B, 29C, 29D, 29E, 30A, 30B, 30C, and 30D, the hatched portions represent the plasmon filters 121-1 formed at low positions from the interface of the photodiode 61 (deep positions from the interface of the interlayer film 102).

Figure 29C:
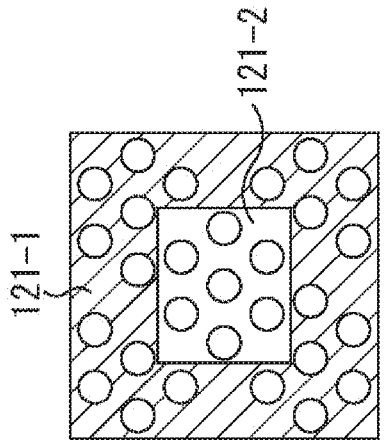
FIGS. 29A, 29B, 29C, 29D, and 29E are plan views of plasmon filters.
Figure 29B:
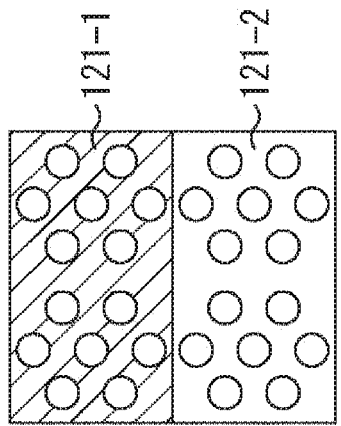
Figure 29E:
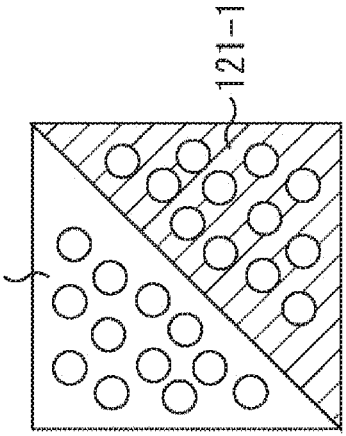
Figure 29A:
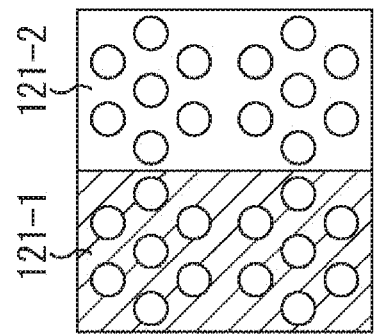

FIG. 29A illustrates a case where the plasmon filters 121 are divided in the vertical direction. In the plasmon filters 121 illustrated in FIG. 29A, the plasmon filter 121-1 is formed on the left side in FIGS. 29A, 29B, 29C, 29D, and 29E, and the plasmon filter 121-2 is formed on the right side in FIGS. 29A, 29B, 29C, 29D, and 29E. In the case of forming the plasmon filters 121 as described above, the plasmon filters 121 are resistant to a vertical shift in the photolithography process at the time of manufacturing, for example, and can minimize the influence of the vertical shift.

FIG. 29B illustrates a case where the plasmon filters 121 are divided in the horizontal direction. In the plasmon filters 121 illustrated in FIG. 29B, the plasmon filter 121-1 is formed on the upper side in FIGS. 29A, 29B, 29C, 29D, and 29E, and the plasmon filter 121-2 is formed on the lower side in FIGS. 29A, 29B, 29C, 29D, and 29E. In the case of forming the plasmon filters 121 as described above, the plasmon filters 121 are resistant to a horizontal shift in the photolithography process at the time of manufacturing, for example, and can minimize the influence of the horizontal shift.

In the pixel array unit 31, a plurality of pixels 51*a* is arranged in an array. When the plasmon filters 121 are formed in a vertically divided manner, as illustrated in FIG. 29A, the level difference portions are aligned in the vertical direction, which has an advantage of being easily made in a manufacturing process. Similarly, when the plasmon filters 121 are formed in a horizontally divided manner, as illustrated in FIG. 29B, the level difference portions are aligned in the horizontal direction, which has an advantage of being easily made in a manufacturing process.

FIG. 29C illustrates a case where the plasmon filter 121-2 at a high position is formed in a square shape in a center portion of the pixel 51*a*, and the plasmon filter 121-1 is formed at a low position around the plasmon filter 121-2. The plasmon filters 121 illustrated in FIG. 29C have a square-left shape in which the square plasmon filter 121-2 is left in the center.

Figure 29D:
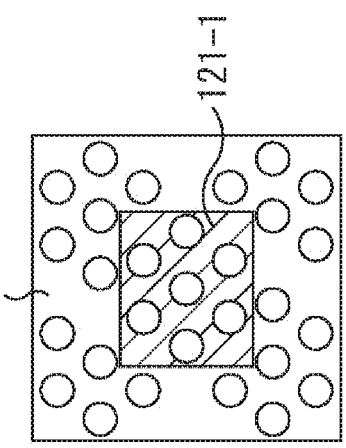

FIG. 29D illustrates a case where the plasmon filter 121-1 at a low position is formed in a square shape in a center portion of the pixel 51*a*, and the plasmon filter 121-2 is formed at a high position around the plasmon filter 121-1. The plasmon filters 121 illustrated in FIG. 29D have a square-extracted shape in which the square plasmon filter 121-1 is extracted from the center.

FIG. 29E illustrates a case where the plasmon filters 121 are divided in an oblique direction. In the plasmon filters 121 illustrated in FIG. 29E, the triangular plasmon filter 121-2 is formed on the upper left side in FIGS. 29A, 29B, 29C, 29D, and 29E, and the plasmon filter 121-1 is formed on the lower right side in FIGS. 29A, 29B, 29C, 29D, and 29E. In the case of forming the plasmon filters 121 as described above, the plasmon filters 121 are resistant to an oblique shift in the photolithography process at the time of manufacturing, for example, and can minimize the influence of the oblique shift. Furthermore, when the plasmon filters 121 are formed in an obliquely divided manner, as illustrated in FIG. 29E, the level difference portions are aligned in the oblique direction, which has an advantage of being easily made in a manufacturing process.

Figure 30B:
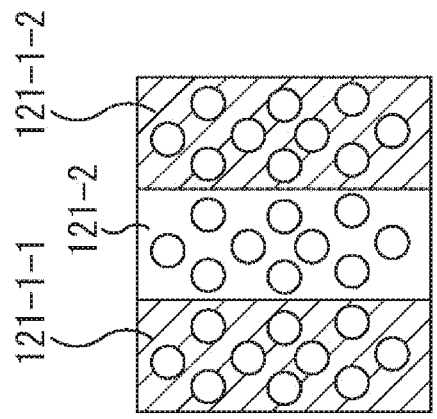
FIGS. 30A, 30B, 30C, and 30D are plan views of plasmon filters.
Figure 30D:
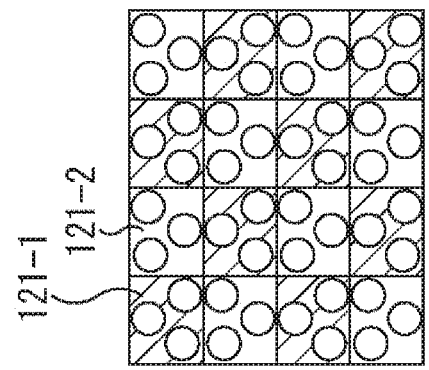
Figure 30A:
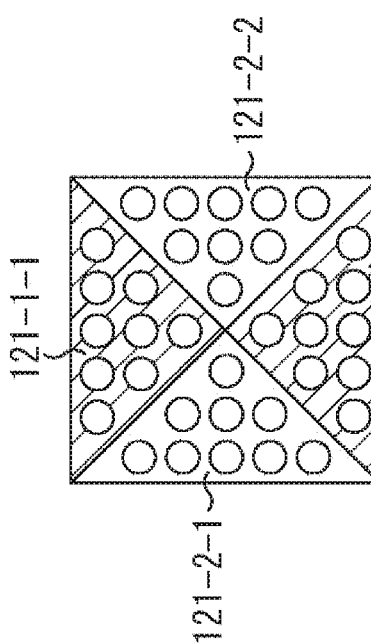

FIG. 30A illustrates a case where the plasmon filters 121 are divided into four regions. FIG. 30A illustrates a case where the plasmon filters 121 are divided into four regions in the oblique direction. Among the plasmon filters 121 illustrated in FIG. 30A, a triangular plasmon filter 121-1-1 is formed on the upper side in FIGS. 30A, 30B, 30C, and 30D, a triangular plasmon filter 121-1-2 is formed on the lower side in FIGS. 30A, 30B, 30C, and 30D, a triangular plasmon filter 121-2-1 is formed on the left side in FIGS. 30A, 30B, 30C, and 30D, and a triangular plasmon filter 121-2-2 is formed on the right side in FIGS. 30A, 30B, 30C, and 30D.

In the case of forming the plasmon filters 121 as described above, the plasmon filters 121 are resistant to an oblique shift in the photolithography process at the time of manufacturing and can minimize the influence of the oblique shift, for example, as in the plasmon filters 121 illustrated in FIG. 29E. Furthermore, when the plasmon filters 121 are formed in an obliquely divided manner, as illustrated in FIG. 30A, the level difference portions are aligned in the oblique direction, which has an advantage of being easily made in a manufacturing process.

FIG. 30B illustrates a case where the plasmon filter 121 is divided in the vertical direction, as in FIG. 29A. The plasmon filters 121 illustrated in FIG. 30B are divided into three regions, and a plasmon filter 121-1-1 is formed on the left side in FIGS. 30A, 30B, 30C, and 30D, a plasmon filter 121-2 is formed in the center in FIGS. 30A, 30B, 30C, and 30D, and a plasmon filter 121-1-2 is formed on the right side in FIGS. 30A, 30B, 30C, and 30D. In the case of forming the plasmon filters 121 as described above, the plasmon filters 121 are resistant to a vertical shift in the photolithography process at the time of manufacturing, for example, and can minimize the influence of the vertical shift.

Figure 30C:
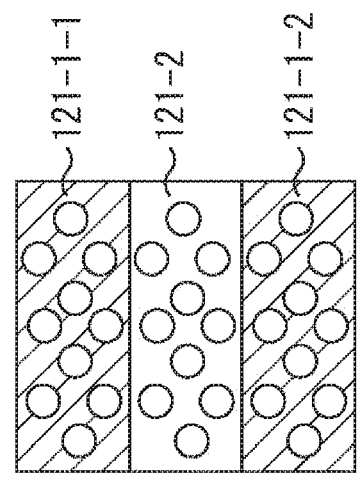

FIG. 30C illustrates a case where the plasmon filter 121 is divided in the horizontal direction, as in FIG. 29B. The plasmon filters 121 illustrated in FIG. 30B are divided into three regions, and a plasmon filter 121-1-1 is formed on the upper side in FIGS. 30A, 30B, 30C, and 30D, a plasmon filter 121-2 is formed in the center in FIGS. 30A, 30B, 30C, and 30D, and a plasmon filter 121-1-2 is formed on the lower side in FIGS. 30A, 30B, 30C, and 30D. In the case of forming the plasmon filters 121 as described above, the plasmon filters 121 are resistant to a horizontal shift in the photolithography process at the time of manufacturing, for example, and can minimize the influence of the horizontal shift.

In the case of forming the plasmon filters 121 in three regions, as illustrated in FIG. 30B or 30C, the plasmon filters 121 are more resistant to the vertical or horizontal shift and can further suppress the influence by the vertical or horizontal shift than the case of forming the plasmon filters 121 in two regions, as illustrated in FIG. 29A or 29B. Furthermore, in the case of forming the plasmon filters 121 in the vertically or horizontally divided manner, as illustrated in FIG. 30B or 30C, the level difference portions are aligned in the vertical or horizontal direction, which has an advantage of being easily made in a manufacturing process.

FIG. 30D illustrates a case where the plasmon filters 121 are divided into 4×4 sixteen regions. Among the plasmon filters 121 illustrated in FIG. 30D, the plasmon filter 121-1 formed at a low position from the interface of the photodiode 61 (a deep position from the interface of the interlayer film 102) and the plasmon filter 121-2 formed at a high position from the interface of the photodiode 61 (a shallow position from the interface of the interlayer film 102) are alternately formed in an up-down direction and in a right-left direction.

In the case of forming the plasmon filters 121 as described above, the plasmon filters 121 are resistant to the vertical, horizontal, and oblique shifts in the photolithography process at the time of manufacturing and can minimize the influence of these shifts, for example.

The divisions and shapes of the plasmon filters 121 described with reference to FIGS. 29A, 29B, 29C, 29D, 29E, 30A, 30B, 30C, and 30D are examples and unillustrated divisions and shapes may be adopted.

<Pixel Having Plurality of Level Differences>

In the above-described embodiment, the case where the level difference D has one size has been described as an example. However, measures against ripples for a plurality of wavelengths can be taken by providing level differences having a plurality of different sizes.

In the above-described pixel 51*a*, for example, in the pixel 51*a* illustrated in FIG. 20, the case where the plasmon filters 121 have one level difference (one type of size) has been described as an example. Furthermore, in the pixel 51*a* illustrated in FIG. 28, the case where the level differences are at four places but they have the same size at the four places has been described as an example.

Figure 31:
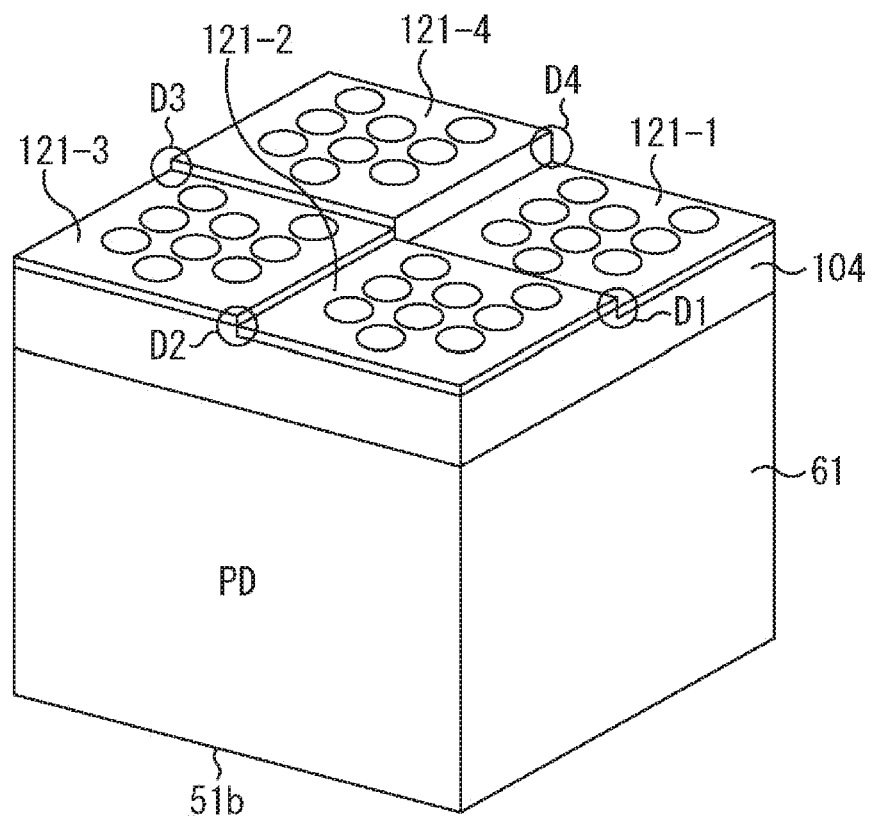
FIG. 31 is a view illustrating another configuration of the pixel in the first embodiment.

A plurality of level differences having a plurality of different sizes may be formed in one pixel 51. FIG. 31 illustrates a configuration of an example in a case where a plurality of level differences is formed in one pixel 51, and the sizes of the respective level differences are different. A pixel 51*b* illustrated in FIG. 31 includes plasmon filters 121-1 to 121-4, similarly to the pixel 51*a* illustrated in FIG. 28, and each has a square shape.

The plasmon filters 121-1 to 121-4 are formed at different heights (depths). The plasmon filter 121-1 is formed at a position closest to the interface of the photodiode 61 (lowest position). In other words, the plasmon filter 121-1 is formed at a position of a depth d1 (film thickness d1) from the interface of the interlayer film 102 (not illustrated in FIG. 31), and is formed at the deepest position in depth from the interface of the interlayer film 102.

The plasmon filter 121-2 is formed at a position second closest to the interface of the photodiode 61 (second lowest position). In other words, the plasmon filter 121-2 is formed at a position of a depth d2 (film thickness d2) from the interface of the interlayer film 102 (not illustrated in FIG. 31), and is formed at the second deepest position in depth from the interface of the interlayer film 102.

The plasmon filter 121-3 is formed at a position second separated from the interface of the photodiode 61 (second highest position). In other words, the plasmon filter 121-3 is formed at a position of a depth d3 (film thickness d3) from the interface of the interlayer film 102 (not illustrated in FIG. 31), and is formed at the third deepest position in depth from the interface of the interlayer film 102.

The plasmon filter 121-4 is formed at a position most separated from the interface of the photodiode 61 (highest position). In other words, the plasmon filter 121-4 is formed at a position of a depth d4 (film thickness d4) from the interface of the interlayer film 102 (not illustrated in FIG. 31), and is formed at the fourth deepest position (shallowest position) in depth from the interface of the interlayer film 102.

The film thicknesses d1 to d4 satisfy the following relationship.

The film thickness $d1$>the film thickness $d2$>the film thickness $d3$>the film thickness $d4$.

A level difference D1 between the plasmon filter 121-1 and the plasmon filter 121-2 is the level difference D1=(the film thickness d1−the film thickness d2).

A level difference D2 between the plasmon filter 121-2 and the plasmon filter 121-3 is the level difference D2=(the film thickness d2–the film thickness d3).

A level difference D3 between the plasmon filter 121-3 and the plasmon filter 121-4 is the level difference D3=(the film thickness d3–the film thickness d4).

A level difference D4 between the plasmon filter 121-1 and the plasmon filter 121-4 is the level difference D4=(the film thickness d1–the film thickness d4).

A level difference D5 (not illustrated) between the plasmon filter 121-1 and the plasmon filter 121-3 is the level difference D5=(the film thickness d1–the film thickness d3).

A level difference D6 (not illustrated) between the plasmon filter 121-2 and the plasmon filter 121-4 is the level difference D6=(the film thickness d2–the film thickness d4).

As described above, the surface is divided into the four regions, the plasmon filters 121 are formed in the respective regions, and the positions where the plasmon filters 121 are formed are made different, whereby six types of sizes of the level differences D1 to D6 can be produced as the sizes of level differences.

Here, the above-described condition 2 is described again. As illustrated in FIG. 20, the condition 2 is expressed as follows when the film thickness of the interlayer film 102 on the plasmon filter 121-1 is the film thickness d, the film thickness of the interlayer film 102 on the plasmon filter 121-2 is the film thickness d', the refractive index of the interlayer film 102 is the refractive index n, the wavelength for suppressing ripples is the wavelength λr, m is an arbitrary integer, the film thickness difference of the interlayer film is (d–d'), and the wavelength of a ripple to be eliminated is λr.

$$(d-d')=\lambda r(m+1/4)/n$$

The level differences D1 to D6 correspond to the film thickness difference (d–d') of the interlayer film under the condition 2. That is, in this case, six types of the film thickness difference (d–d') of the interlayer film can be produced. Therefore, six types of wavelengths (up to six conditions) can be set as the wavelengths of ripples to be eliminated.

Referring back to FIG. 19 again. In the graph illustrated in FIG. 19, the circled portions represent positions (frequencies) at which ripples have occurred, and it can be seen that ripples have occurred at five frequencies. According to the pixel 51b illustrated in FIG. 31, six types of wavelengths at which ripples are to be suppressed can be set, as described above. Therefore, the film thicknesses can be set in accordance with the five frequencies having the possibility of occurrence of ripples. Therefore, in this case, the pixel 51b capable of suppressing ripples with respect to at least five frequencies can be adopted.

As described above, the plasmon filters 121 are formed to have two or more different depths (heights) in one pixel 51, whereby a more substantial ripple suppression effect can be expected.

In the pixel 51b illustrated in FIG. 31, the example in which the plasmon filters 121-1 to 121-4 change in height in a spiral staircase has been described. However, the order of the change in height is not limited to the spiral staircase and may be any change.

Furthermore, the change in the size of the level difference may be constant or not constant. For example, the level differences D1, D2, and D3 may be designed to gradually increase at a constant rate or may be designed to gradually increase at different rates.

Furthermore, in the pixel 51b illustrated in FIG. 31, the case where a surface is divided into four regions, and the plasmon filters 121 are respectively formed in the four regions, and the level differences among the plasmon filters 121 are four levels of D1 to D4 has been described. However, another number of levels than the four levels may be adopted. That is, by dividing the surface into four or more regions and increasing the number of levels, the effect of reducing ripples can be further increased.

For example, the high and low two positions have been described in FIGS. 30A, 30B, 30C, and 30D. However, three or more levels of height can be adopted by being applied to the example in FIG. 31.

<Configuration of Plasmon Filter Among Plurality of Pixels>

In the above-described pixel 51, the example in which the plasmon filters 121 are formed in one pixel 51 at positions having different depths from the interface of the interlayer film 102 has been described. However, the plasmon filters 121 may be formed in a plurality of pixels 51 at positions having different depths from the interface of the interlayer film 102.

Figure 32:
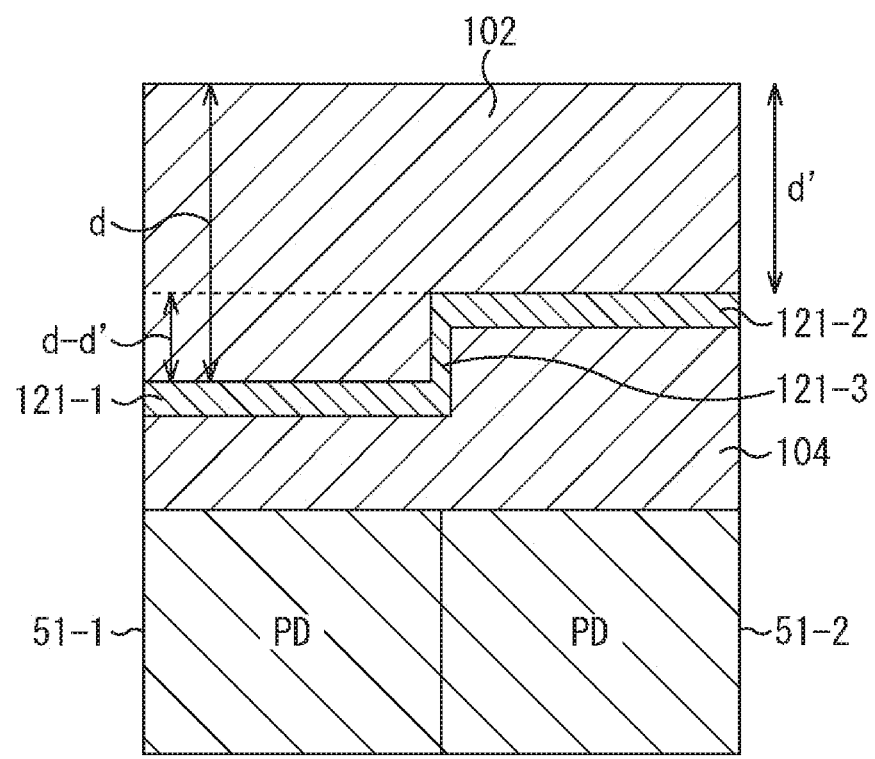
FIG. 32 is a view illustrating a configuration example of a case where the first embodiment is applied to a plurality of pixels.

FIG. 32 illustrates an example in which the plasmon filters 121 are formed at positions having different depths from the interface of the interlayer film 102, in two pixels 51. Referring to FIG. 32, a pixel 51-1 and a pixel 51-2 are arranged adjacent to each other.

In the pixel 51-1 arranged on the left side in FIG. 32, a plasmon filter 121-1 is arranged at a position of a depth d (film thickness d) from the interface of the interlayer film 102. Furthermore, in the pixel 51-2 arranged on the right side in FIG. 32, a plasmon filter 121-2 is arranged at a position of a depth d' (film thickness d') from the interface of the interlayer film 102.

The film thickness difference between the film thicknesses of the interlayer film 102 arranged on the plasmon filter 121-1 and the plasmon filter 121-2 are:

the film thickness difference=(the film thickness d–the film thickness d').

In a portion where the film thickness difference (the film thickness d–the film thickness d') is obtained, a plasmon filter 121-3 is formed. The plasmon filter 121-3 is formed at a boundary portion between the pixel 51-1 and the pixel 51-2 (between pixels).

As described above, the plasmon filters 121 may be formed at different positions between the plurality of pixels 51, in this case, two pixels. In the case of forming the plasmon filters 121 in this way, light is incident and reflected, as illustrated in FIG. 33, and ripples are reduced.

Figure 33:
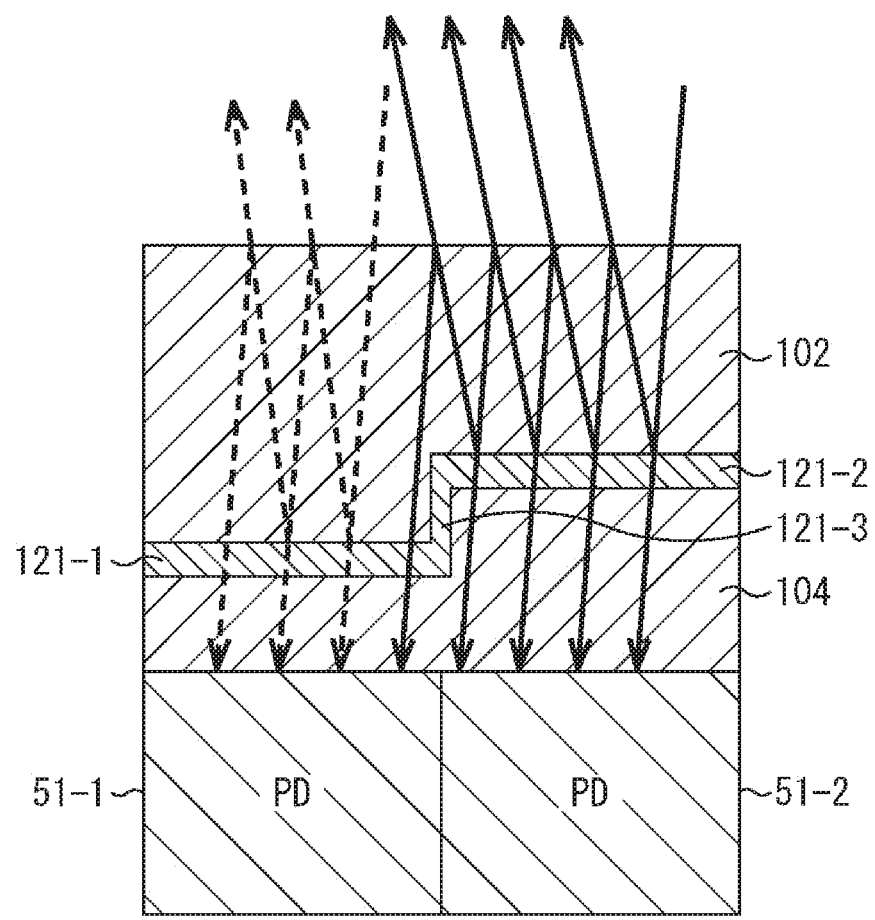
FIG. 33 is a view for describing suppression of a ripple.

Referring to FIG. 33, part of the incident light illustrated by the solid line in FIG. 33 having entered the pixel 51-2 side is repeatedly reflected between the plasmon filter 121-2 and the interface of the interlayer film 102. Part of the reflected light is incident on the adjacent pixel 51-1.

Similarly, part of the incident light illustrated by the dotted line in FIG. 33 having entered the pixel 51-1 side is repeatedly reflected between the plasmon filter 121-1 and the interface of the interlayer film 102. Part of the reflected light is incident on an adjacent pixel 51 (not illustrated).

Part of the reflected light on the pixel 51-2 side may enter the pixel 51-1 but the plasmon filter 121-1 and the plasmon filter 121-2 are formed to have a level difference. Therefore, the wavelength of the reflected light reflected by the plasmon filter 121-1 and the wavelength of the reflected light reflected by the plasmon filter 121-2 are different from each other, and the reflected lights do not intensify each other. That is, in this case, the reflected light on the pixel 51-2 side and the reflected light on the pixel 51-1 side are in the relationship of weakening each other by interfering each other. Therefore, ripples can be reduced.

In the case of forming the plasmon filters 121 at different positions between the two pixels, as illustrated in FIGS. 32 and 33, the level difference D (=the film thickness difference=(the film thickness d–the film thickness d')) is set to satisfy the condition 2, as in the case of configuring the plasmon filters 121 at different formation positions in one pixel described with reference to FIG. 21.

Here, a way of setting the level difference D between two pixels illustrated in FIG. 32 on the basis of the condition 2 will be described. The condition 2 is expressed as follows when the film thickness of the interlayer film 102 on the plasmon filter 121-1 formed in the pixel 51-1 is the film thickness d, the film thickness of the interlayer film 102 on the plasmon filter 121-2 formed in the pixel 51-2 is the film thickness d', the refractive index of the interlayer film 102 is the refractive index n, the wavelength for suppressing ripples is the wavelength λr, the film thickness difference of the interlayer film is (d–d'), and m is an arbitrary integer.

$$(d-d')=\lambda r(m+\frac{1}{4})/n$$

When the condition 2 is set in this manner, the light having the wavelength λr can be eliminated by an interference because the optical path difference becomes a half cycle of λr. For example, in the case where a wavelength of interest for suppressing ripples is 600 nm and m=0, $$(d-d')=(150/n)$$

is obtained. Therefore, in a case of reducing a ripple due to light having the wavelength of 600 nm, (d–d') that is the difference between the film thickness d and the film thickness d' is designed to satisfy (150/n) nm.

By making the positions where the plasmon filters 121 are formed different, and by setting the difference between the formation positions, in the above example, the film thickness difference (d–d'), to the value at which a ripple is to be suppressed, the ripple can be more appropriately suppressed.

Note that, in a case where the condition 2 is $$(d-d')=\lambda r(m+\frac{1}{2})/n,$$

lights intensify each other and ripples are emphasized. Therefore, setting of a value that satisfies this condition is avoided.

As described above, even in the case of configuring the plasmon filters 121 to be different in height among the plurality of pixels 51, ripples can be reduced. Furthermore, in the case of configuring the plasmon filters 121 to be different in height among the plurality of pixels 51, minute processing is not required at the manufacturing and the pixels 51 can be easily manufactured, as compared with the case of configuring the plasmon filters 121 to be different in height in one pixel 51.

Note that, here, the example of two pixels has been described as an example of the plurality of pixels 51. However, the present technology can be applied to another number of pixels than two pixels. For example, as illustrated in FIG. 34, the height of the plasmon filter 121 may be made different among three pixels 51.

Figure 34:
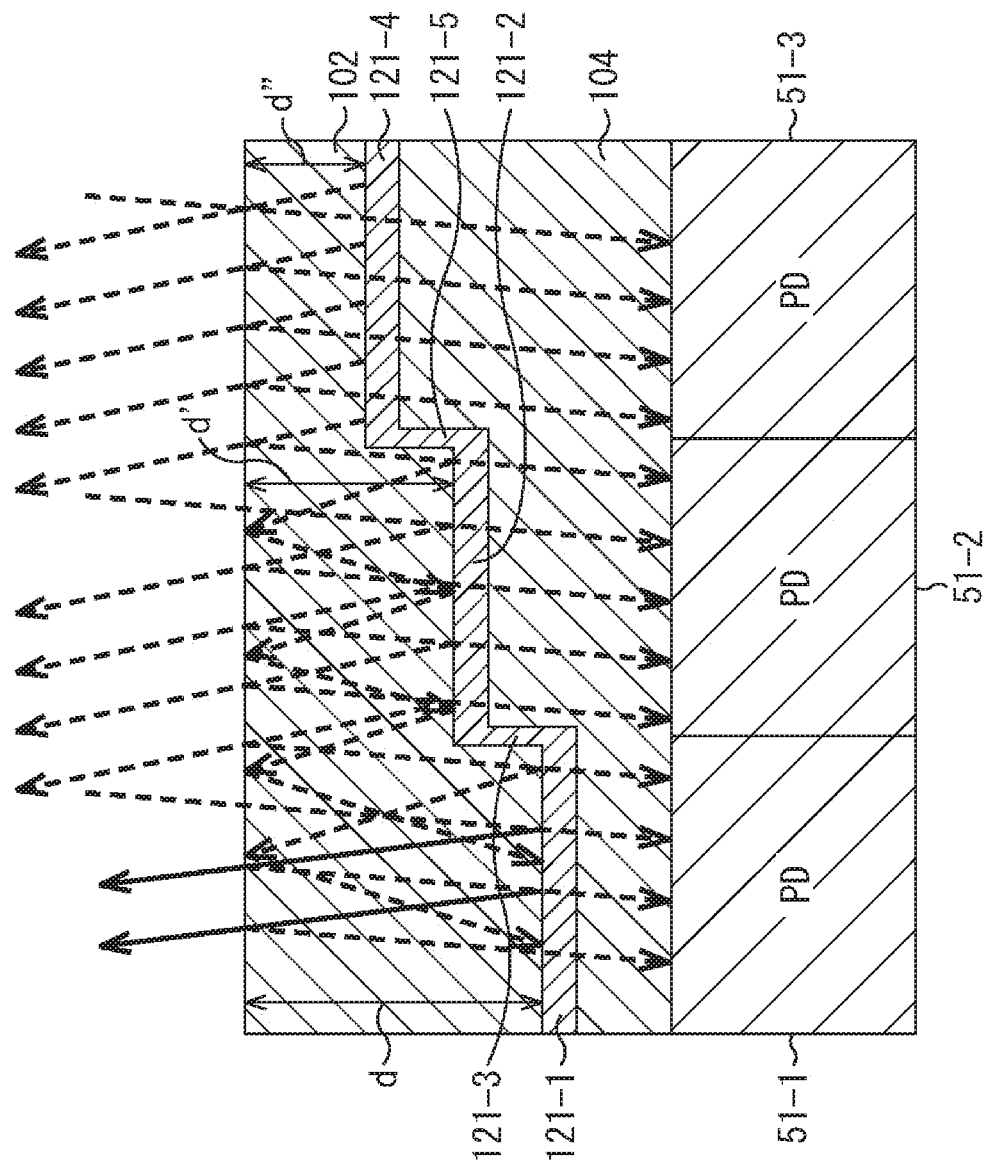
FIG. 34 is a view illustrating a configuration example of a case where the first embodiment is applied to a plurality of pixels.

The plasmon filters 121 are respectively formed in pixels 51-1 to 51-3 illustrated in FIG. 34. In the pixel 51-1, a plasmon filter 121-1 is formed at a position where the film thickness of the interlayer film 102 is the film thickness d. In the pixel 51-2, a plasmon filter 121-2 is formed at a position where the film thickness of the interlayer film 102 is the film thickness d'. In the pixel 51-3, a plasmon filter 121-4 is formed at a position where the film thickness of the interlayer film 102 is a film thickness d".

The film thickness d, the film thickness d', and the film thickness d" satisfy the relationship of:

the film thickness d>the film thickness d'>the film thickness d".

Furthermore, the plasmon filter 121-3 is formed in the vertical direction in the boundary portion between the pixel 51-1 and the pixel 51-2, and the plasmon filter 121-6 is formed in the vertical direction in the boundary portion between the pixel 51-2 and the pixel 51-3.

As described above, even in the case where the heights of the plasmon filters 121 are changed among the three pixels 51, ripples can be reduced. Furthermore, with the increase in the types of the size of the level difference, measures for a plurality of wavelengths can be taken and ripples can be further reduced, as in the case described with reference to FIG. 31.

<Configuration Added with Antireflection Film>

As described above, in the case of the pixel 51 including the plasmon filters 121 having different heights, the plasmon filter 121 is also formed at the level difference portion of the plasmon filter 121, and reflection may occur at the portion.

Figure 35:
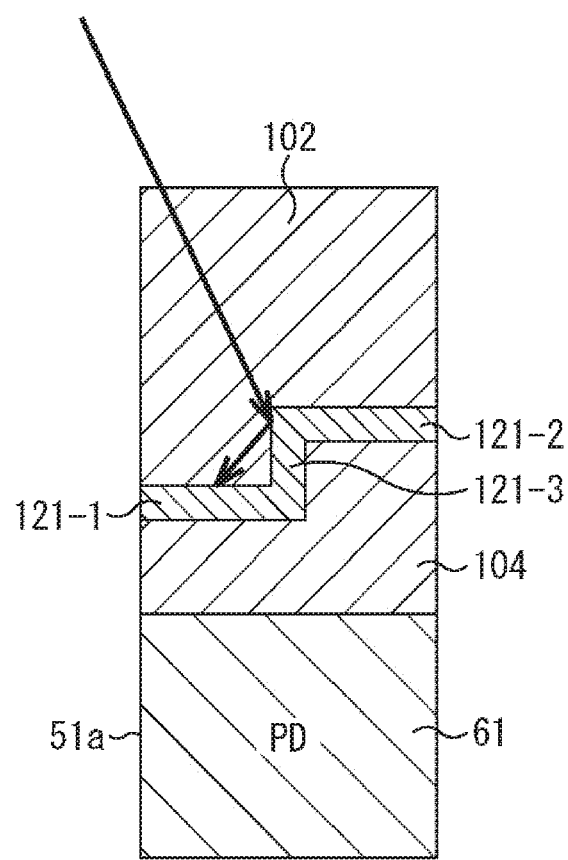
FIG. 35 is a view for describing a reason for including an antireflection film.

FIG. 35 is a view illustrating the pixel 51a illustrated in FIG. 20, and illustrating the reflected light by the plasmon filter 121-3 of the pixel 51a. Since the plasmon filter 121-3 is a metal thin film filter, the plasmon filter 121-3 has a structure that easily reflects light. Therefore, as illustrated in FIG. 35, it can be assumed that the incident light hits the plasmon filter 121-3, is reflected, and hits the plasmon filter 121-1. In other words, irregular reflection by the plasmon filter 121-3 may occur.

Figure 36:
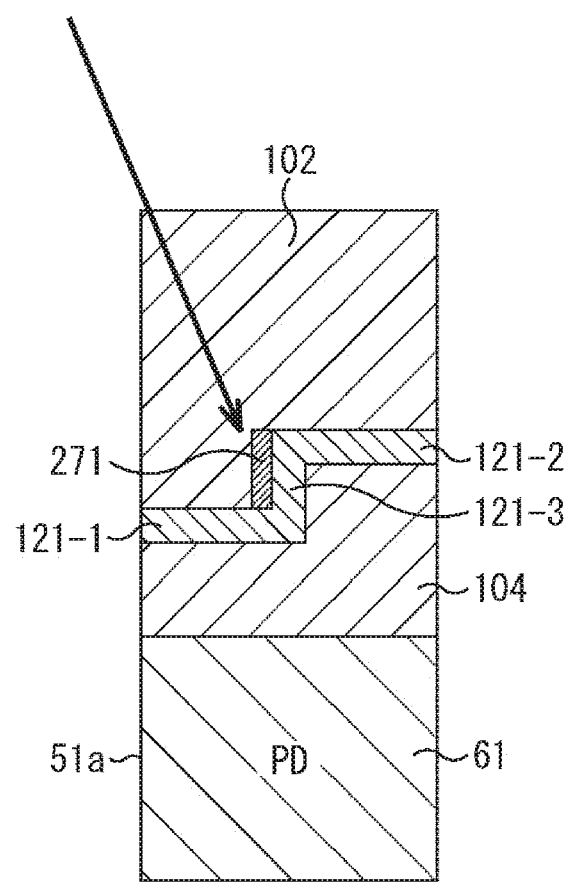
FIG. 36 is a view illustrating a configuration example of a pixel in a case of including an antireflection film.

To prevent such irregular reflection, an antireflection film 271 may be formed on a side surface of the plasmon filter 121-3, as illustrated in FIG. 36. By forming the antireflection film 271 on the side surface of the plasmon filter 121-3, irregular reflection can be prevented by the antireflection film 271.

The antireflection film 271 can be formed using, for example, tungsten (W), titanium (Ti), titanium nitride (TiN), silicon carbide (SiC), carbon, black resist, or the like. The material of the antireflection film 271 is not limited to these materials, and any material may be used as long as the material has lower reflectance than the reflectance of the material configuring the plasmon filter 121-3.

Pixel in Second Embodiment

Figure 37:
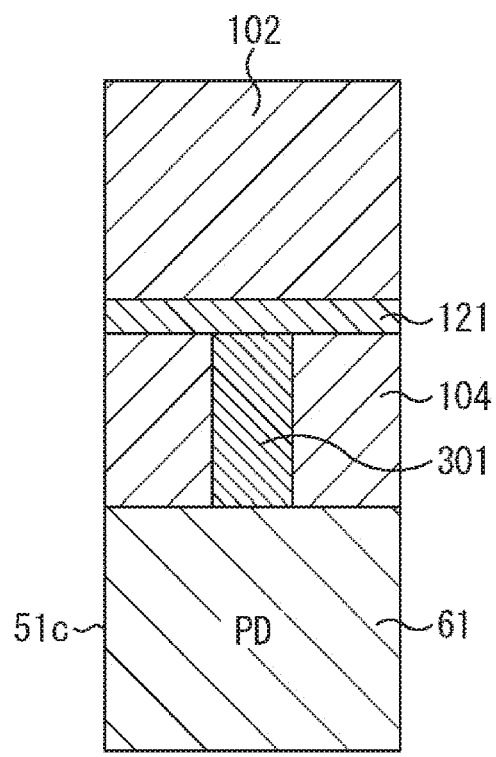
FIG. 37 is a view illustrating a configuration of a pixel in the second embodiment.

FIG. 37 is a view illustrating a configuration of a pixel 51c in a second embodiment. The pixel 51c illustrated in FIG. 37 has a configuration provided with a waveguide in the pixel.

In the pixel 51c illustrated in FIG. 37, a waveguide 301 is formed in an interlayer film 104. The waveguide 301 is formed between a plasmon filter 121 and a photodiode 61. An interlayer film 102 is formed on the plasmon filter 121.

Figure 38:
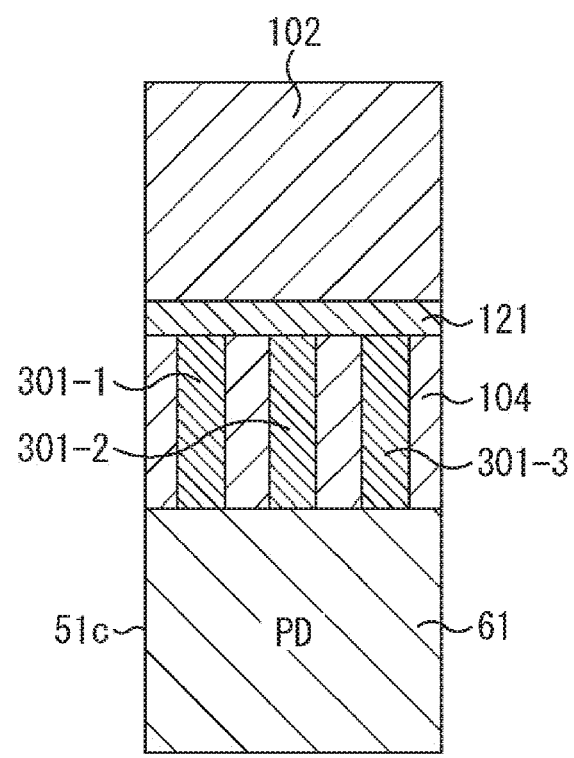
FIG. 38 is a view illustrating another configuration of the pixel in the second embodiment.

In the pixel 51c illustrated in FIG. 37, a case where the number of the waveguides 301 is one is illustrated. However, three waveguides 301-1 to 301-3 may be formed as illustrated in FIG. 38. That is, the number of waveguides 301 is not limited when applying the present technology. In the following description, the case where the number of waveguides 301 illustrated in FIG. 37 is one will be described as an example.

FIGS. 39A, 30B, 40A, and 40B are views illustrating a region where the waveguide 301 is formed when the plasmon filter 121 is viewed from an incident surface side. As illustrated in FIGS. 39A, 30B, 40A, and 40B, a plurality of holes 132 is formed in the plasmon filter 121 when the pixel 51c is viewed from the incident surface side, for example. This has already been described with reference to FIG. 4. Furthermore, in FIGS. 39A, 39B, 40A, and 40B, hatched regions represent the regions where the waveguide 301 is formed.

Figure 39A:
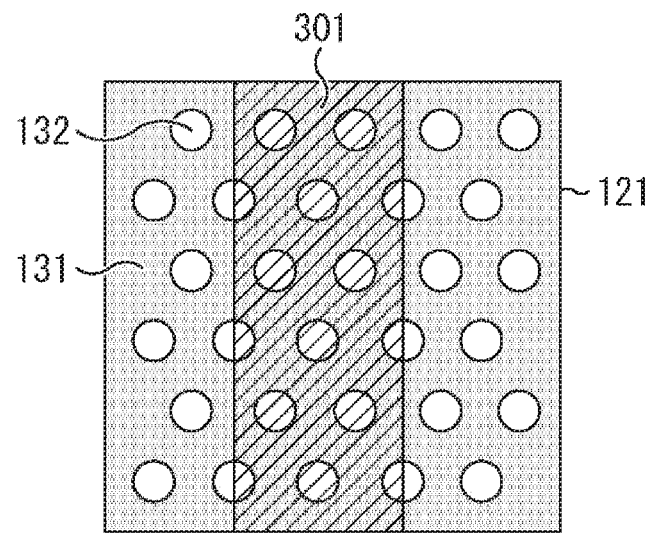
FIGS. 39A and 39B are views for describing a waveguide formation region.

FIG. 39A illustrates a case where one waveguide 301 is formed in a center portion, as in the pixel 51c illustrated in FIG. 37. The holes 132 formed in the plasmon filter 121 are divided into holes 132 existing in the region where the waveguide 301 is formed and holes 132 existing in a region where the waveguide 301 is not formed.

The waveguide 301 is only required to be formed such that the holes 132 existing in the region where the waveguide 301 is formed and the holes 132 existing in a region where the waveguide 301 is not formed are mixed in one pixel 51 as described above.

Figure 39B:
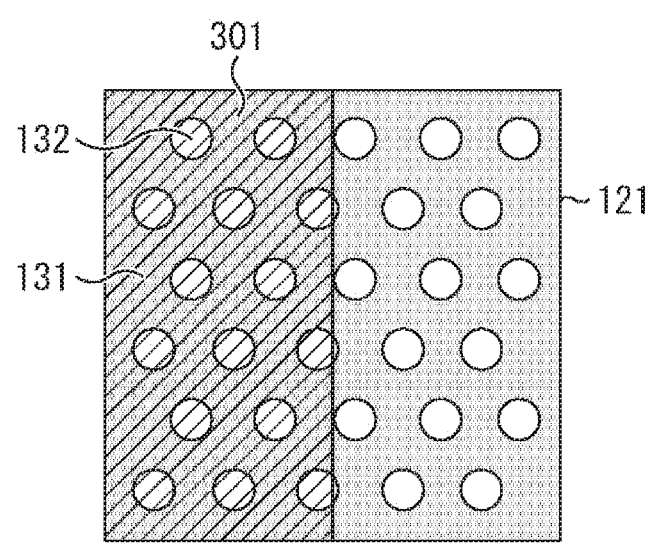

The waveguide 301 illustrated in FIG. 39B may be formed in a half region in a region where the plasmon filter 121 of the pixel 51c is provided.

Figure 40A:
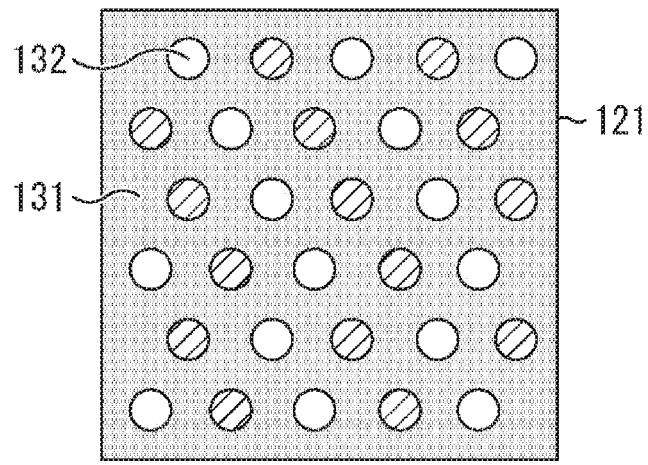
FIGS. 40A and 40B are views for describing a waveguide formation region.

Furthermore, as illustrated in FIG. 40A, the waveguide 301 may be formed for every other hole 132 in the holes 132 formed in the plasmon filter 121.

Figure 40B:
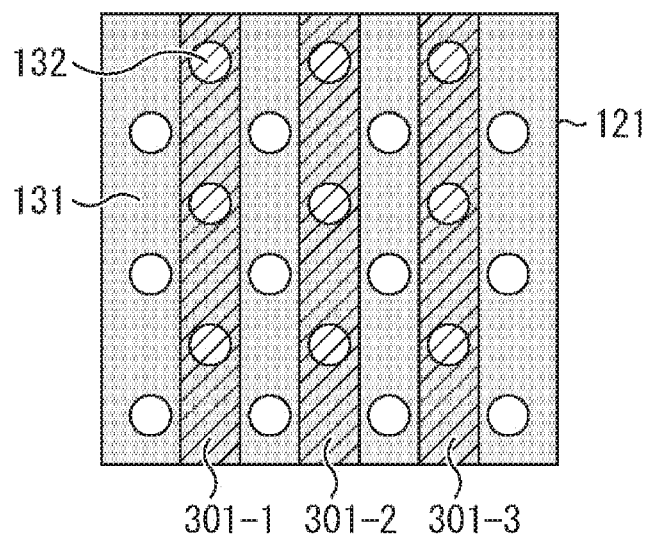

Furthermore, in the case where three waveguides 301 are formed as illustrated in FIG. 38, each of the waveguides 301-1 to 301-3 may be formed in a line manner, as illustrated in FIG. 40B, as viewed in plane.

Furthermore, the shape of the waveguide 301 may be a square or a circle as illustrated in FIGS. 39A, 39B, 40A, and 40B or may be a polygon, a star, or the like and may be a regular shape or an irregular shape, although not illustrated. Furthermore, the shape is not limited to one shape, and the waveguides 301 having different shapes may be mixed in one pixel 51.

By forming the waveguide 301 in the interlayer film 104 as described above, ripples can be reduced. The waveguide 301 is formed using a material having a higher refractive index than a refractive index of the interlayer film 104 formed around the waveguide 301. Therefore, by forming the waveguide 301 in the interlayer film 104, a layer in which materials having different refractive indexes are mixed is obtained.

When the refractive indexes of the interlayer film 104 and the waveguide 301 are different, a wavelength $\lambda$ (waveguide) of light passing through the waveguide 301 becomes the wavelength $\lambda$ (waveguide)=$\lambda$/n, where the wavelength of the incident light is $\lambda$ and the refractive index of the waveguide 301 is n. Therefore, the apparent wavelength of the light passing through the waveguide 301 changes, and the light enters a photodiode 61.

A light having the wavelength $\lambda$ that is incident without passing through the waveguide 301 and the light having the wavelength $\lambda$ (the waveguide)=$\lambda$/n that is incident after passing through the waveguide 301 enter the photodiode 61. As described above, the lights having apparently different wavelengths enter the photodiode 61.

In other words, lights having different phase differences enter the photodiode 61. Therefore, an interference occurs between the lights having different phase differences, and thus ripples to occur can be reduced.

Pixel in Third Embodiment

Figure 41:
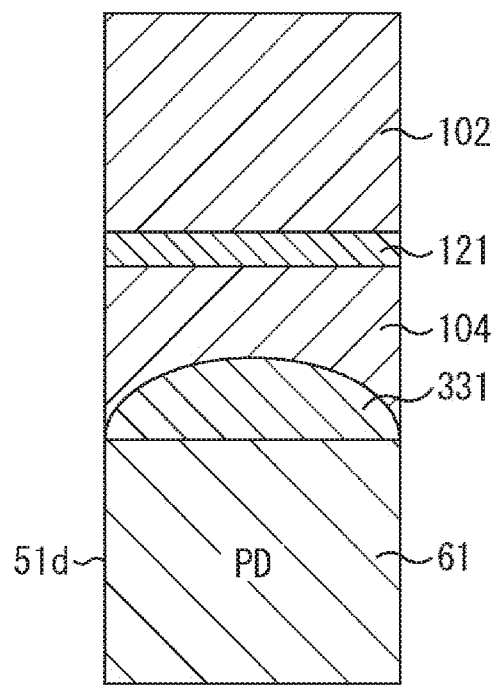

FIG. 41 is a view illustrating a configuration of a pixel 51d in a third embodiment. The pixel 51d illustrated in FIG. 41 has a configuration provided with an intra-layer lens in the pixel.

In the pixel 51d illustrated in FIG. 41, an intra-layer lens 331 is formed in an interlayer film 104. The intra-layer lens 331 is formed between a plasmon filter 121 and a photodiode 61, and is formed on the photodiode 61. An interlayer film 102 is formed on the plasmon filter 121.

The intra-layer lens 331 is formed using a material having a higher refractive index than a refractive index of the interlayer film 104 formed around the intra-layer lens 331, similarly to the waveguide 301 in the pixel 51c in the second embodiment. Therefore, by forming the intra-layer lens 331 in the interlayer film 104, a layer in which materials having different refractive indexes are mixed is obtained.

Figure 42:
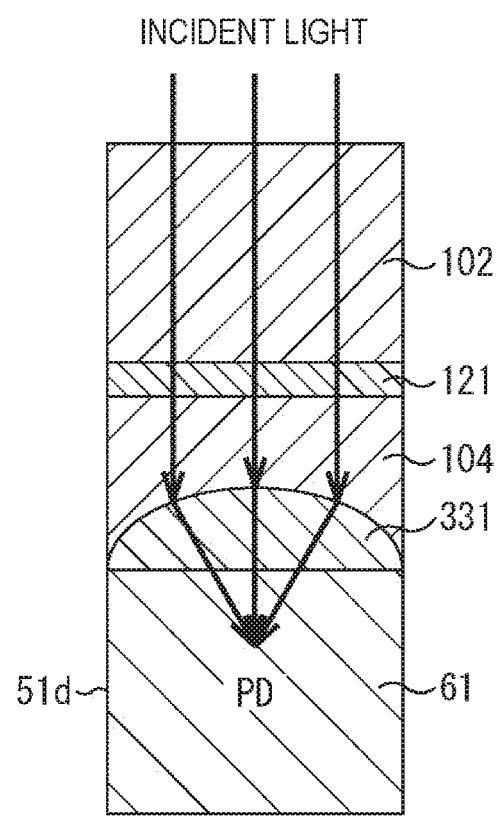

The intra-layer lens 331 functions as a lens and has a function to condense light. As illustrated in FIG. 42, incident light that has entered the pixel 51d passes through the plasmon filter 121, passes through the interlayer film 104, and reaches the intra-layer lens 331. The light arriving at the intra-layer lens 331 is condensed and reaches the photodiode 61. As described above, the light is condensed by the intra-layer lens 331, so that an interference between lights occurs and ripples are reduced.

Pixel in Fourth Embodiment

Figure 43:
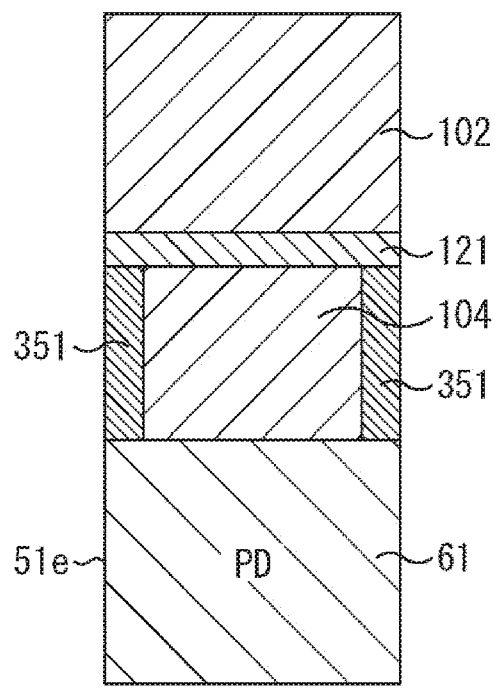

FIG. 43 is a view illustrating a configuration of a pixel 51e in a fourth embodiment. The pixel 51e illustrated in FIG. 43 has a configuration provided with a metal wall in the pixel.

In the pixel 51e illustrated in FIG. 43, a metal wall 351 is formed between the pixels 51e in the interlayer film 104. The metal wall 351 is formed between a plasmon filter 121 and a photodiode 61 and between the pixels 51e. An interlayer film 102 is formed on the plasmon filter 121.

Figure 44:
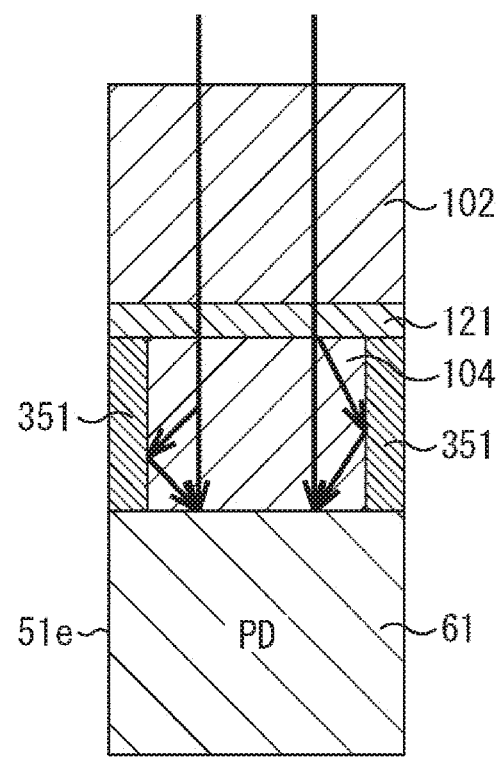

By forming the metal wall 351 in the interlayer film 104, incident light is transmitted through the plasmon filter 121 and reaches the interlayer film 104, as illustrated in FIG. 44. Some light having reached the interlayer film 104 travels straight and enters the photodiode 61 and some light is reflected by the metal wall 351 and enters the photodiode 61.

As described above, the reflected light reflected by the metal wall 351 and the light having traveled straight without being reflected by the metal wall 351 are supplied to the photodiode 61. The reflected light reflected by the metal wall 351 and the light having traveled straight without being reflected by the metal wall 351, in other words, the lights having different optical path lengths cause an interference, so that ripples are reduced.

Figure 45:
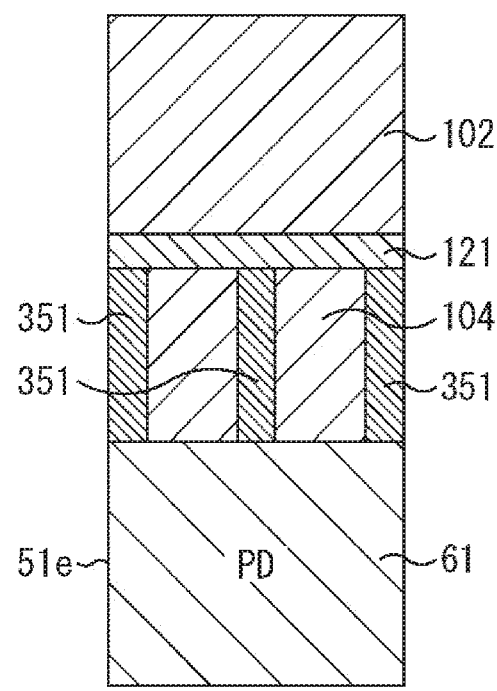

The metal wall 351 may be formed in a place other than between the pixels 51e. For example, as illustrated in FIG. 45, the metal wall 351 may be formed in a center portion of the pixel 51e, in addition to between the pixels 51e. The number and size of the metal walls 351 provided in portions other than between the pixels 51e may be other number and size than those illustrated here. When the number of metal walls 351 formed in the interlayer film 104 increases, the light to be reflected increases. Therefore, an effect of suppressing ripples can be enhanced.

The characteristics of the plasmon filter 121 change depending on the type of metal used. For example, as illustrated in FIG. 43, in a case where the plasmon filter 121 and the metal wall 351 are formed in contact with each other, the characteristics of the plasmon filter 121 may change due to the metal wall 351. To prevent such a change in the characteristics, the same metal is used for the plasmon filter 121 and the metal wall 351 in the case of forming the plasmon filter 121 and the metal wall 351 in contact with each other.

In a case of forming the plasmon filter 121 and the metal wall 351 using different metals, the plasmon filter 121 and the metal wall 351 are configured not in contact with each other. For example, the plasmon filter 121 and the metal wall 351 are formed at positions separated by about several hundred nm.

Note that, in a case where the characteristics of the plasmon filter 121 do not change or a change range of the characteristics is acceptable even if the characteristics change, the plasmon filter 121 and the metal wall 351 may be formed using different metals and in contact with each other.

Furthermore, a film having a lower refractive index than the interlayer film 104 in contact may be used as the metal wall 351. By using the film having a lower refractive index than the interlayer film 104, total reflection or a condition close to total reflection can be achieved, and color mixture can be suppressed. The film here is typically, but not limited to, a SiO2, a low-k film, or the like. Any film can be used as long as the film has a lower refractive index than the interlayer film 104. Furthermore, the structure is not necessarily a single-layer structure, and a stacked structure may be used.

Figure 46:
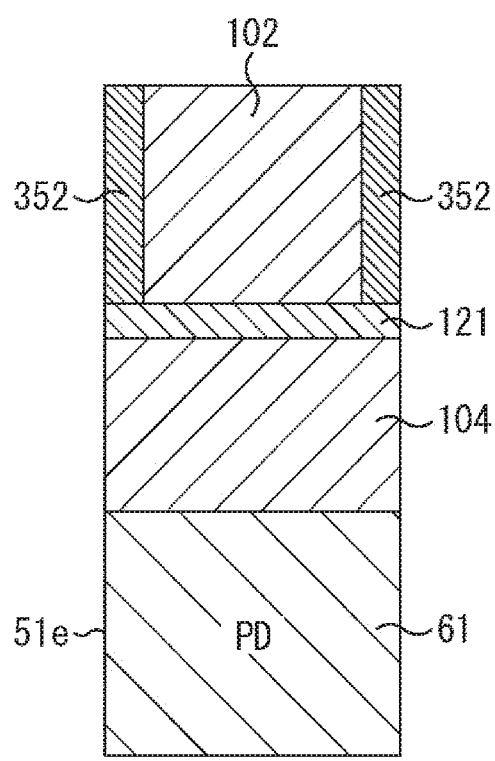

In FIGS. 43 to 45, the case where the metal wall 351 is formed in the interlayer film 104, in other words, the case where the metal wall 351 is formed on the lower side of the plasmon filter 121 has been described as an example. As illustrated in FIG. 46, the metal wall 351 (a metal wall 352 in FIG. 46) may be formed in the interlayer film 102, in other words, on an upper side of the plasmon filter 121.

Figure 47:
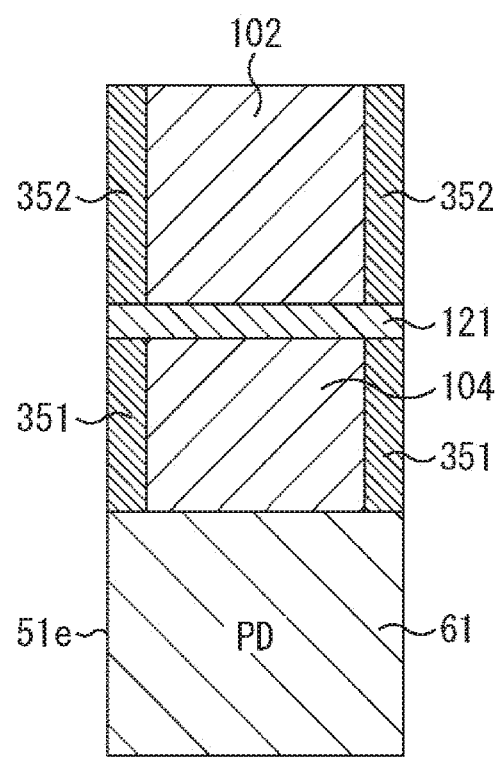

Furthermore, as illustrated in FIG. 47, the metal wall 351 may be formed in the interlayer film 104 and the metal wall 352 may be formed in the interlayer film 102. That is, the metal walls 351 (352) may be formed on the upper side and the lower side of the plasmon filter 121, respectively.

Even in the case of forming the metal wall 352 on the upper side of the plasmon filter 121, the light traveling straight and incident and the reflected light reflected by the metal wall 352 can be supplied to the plasmon filter 121. Therefore, ripples can be reduced as in the above-described case.

Note that the metal wall 352 formed on the upper side of the plasmon filter 121 may be formed to have the same size as a film thickness of the interlayer film 102, as illustrated in FIG. 46 (FIG. 47). However, when the metal wall 352 is formed on the upper side of the plasmon filter 121, the path of the incident light is obstructed by the metal wall 352, and there is a possibility of occurrence of so-called vignetting. Therefore, the metal wall 352 is only required to be formed with a size not causing vignetting, and may not be formed with the same size as the film thickness of the interlayer film 102, as illustrated in FIG. 46 (FIG. 47).

Furthermore, in the case of forming the metal wall 352 on the upper side of the plasmon filter 121, conditions that the metal wall 352 is formed using a similar metal to the plasmon filter 121, the metal wall 352 is formed using a different type of metal from the plasmon filter 121 and formed at a separated position, or the like are the same as the above-described metal wall 351.

Furthermore, a film having a lower refractive index than the interlayer film 102 in contact may be used as the metal wall 352. By using the film having a lower refractive index than the interlayer film 102, total reflection or a condition close to total reflection can be achieved, and color mixture can be suppressed. The film here is typically, but not limited to, a SiO2, a low-k film, or the like. Any film can be used as long as the film has a lower refractive index than the interlayer film 102. Furthermore, the structure is not necessarily a single-layer structure, and a stacked structure may be used.

Pixel in Fifth Embodiment

Figure 48:
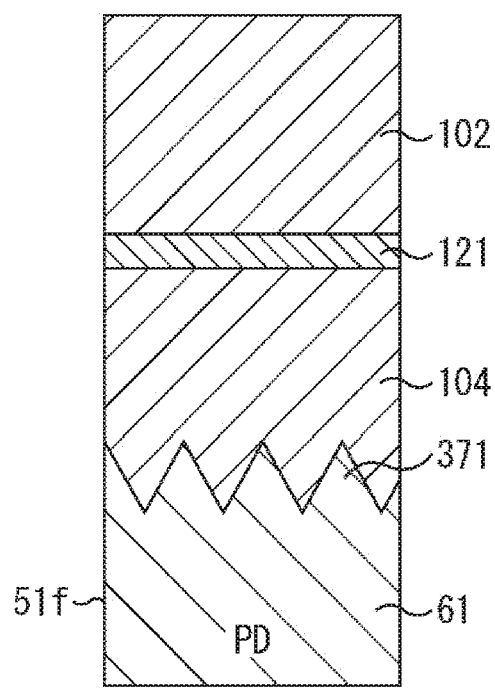

FIG. 48 is a view illustrating a configuration of a pixel 51*f* in a fifth embodiment. In the pixel 51*f* illustrated in FIG. 48, a part of a photodiode 61 in the pixel has a moth-eye structure.

In the pixel 51*f* illustrated in FIG. 48, the photodiode 61 has an uneven shape on an interlayer film 104 side. This uneven portion is hereinafter described as moth-eye structure portion. The moth-eye structure portion 371 is formed in the photodiode 61 on a plasmon filter 121 side. An interlayer film 102 is formed on the plasmon filter 121.

Figure 49:
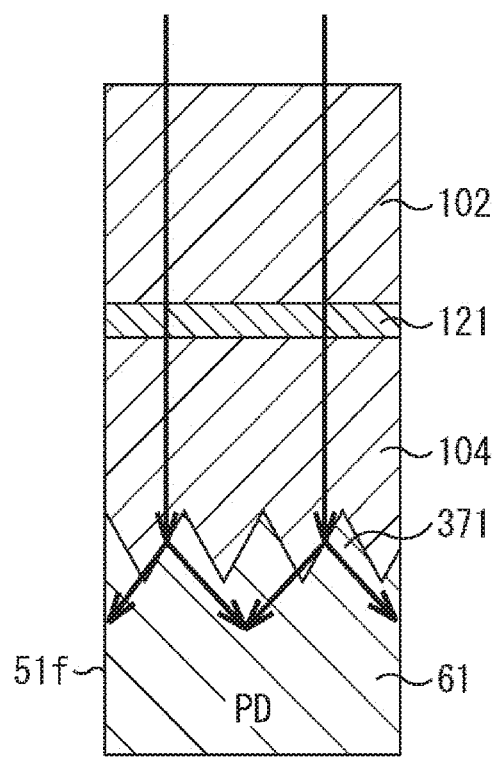

With the moth-eye structure 371, light having passed through the plasmon filter 121 and arrived at the photodiode 61 is scattered by the moth-eye structure portion 371 as illustrated in FIG. 49. The scattering of light causes an interference between lights having different optical path lengths and can suppress ripples.

The moth-eye structure portion 371 has the uneven structure. A period of the unevenness (a distance from an apex of a protrusion to an apex of an adjacent protrusion) is set to a wavelength about equal to the wavelength of light or a wavelength slightly shorter than the wavelength of light, for example, about several hundred nm. Note that the setting to the wavelength about equal to the wavelength of light or the wavelength slightly shorter than the wavelength of light, for example, about several hundred nm, is an example and is not description indicating a limitation. For example, the period may be about several um.

Furthermore, the shape of the moth-eye structure portion 371 is a cone. Alternatively, the shape of the moth-eye structure portion 371 may be a polygonal pyramid such as a triangular pyramid or a quadrangular pyramid, or a polygonal column such as a triangular prism or a quadrangular prism. Any shape may be used as long as a refractive index gradually changes from a protrusion to a recess by the moth-eye structure portion 371.

Figure 50:
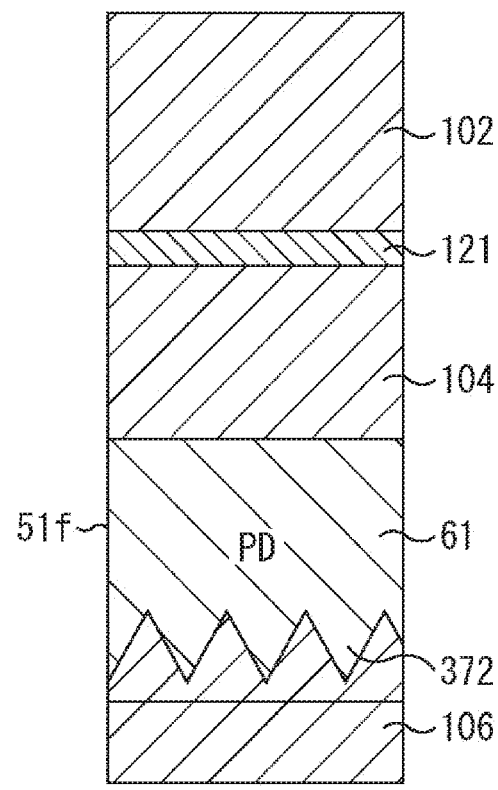

The moth-eye structure portion 371 may be formed in the photodiode 61 on a lower side (a wiring layer 106 side), as illustrated in FIG. 50, instead of being formed in the photodiode 61 on the upper side (plasmon filter 121 side).

In the pixel 51*f* illustrated in FIG. 50, a moth-eye structure portion 372 is formed in the photodiode 61 on the lower side. A wiring layer 106 is stacked on the photodiode 61 on the lower side in FIG. 50 (on a surface opposite to an incident surface). By forming the moth-eye structure portion 372 in the photodiode 61 on the lower side, ripples by reflected light reflected on the wiring layer 106, reflected light reflected at an interface between the photodiode 61 and the wiring layer 106, reflected light by multiple reflection of the reflected light reflected at an interface between the photodiode 61 and the interlayer film 104, and the like can be reduced.

The moth-eye structure portion 372 of the pixel 51*f* illustrated in FIG. 50 has an unevenness period (a distance from an apex of a protrusion to an apex of an adjacent protrusion) that is about a several hundred nm or a several um and has a shape formed into a cone, a polygonal pyramid, a polygonal column, or the like, as in the moth-eye structure portion 371 of the pixel 51*f* illustrated in FIG. 49.

Figure 51:
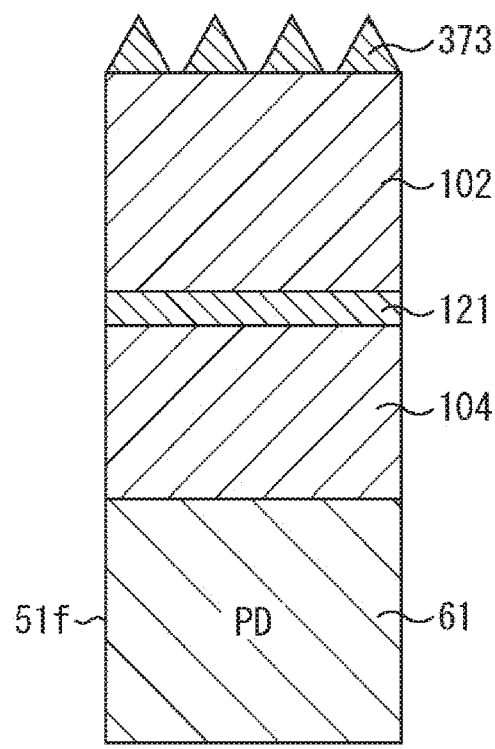

The pixel 51*f* having still another configuration including a moth-eye structure portion is illustrated in FIG. 51. In the pixel 51*f* illustrated in FIG. 51, a moth-eye structure portion 373 is formed on the interlayer film 102. Even in this case, incident light is scattered by the moth-eye structure portion 373, as in the above-described case. Therefore, the scattered light and the incident light cause an interference and suppress occurrence of ripples.

In the case of forming the moth-eye structure portion 373 on the interlayer film 102, the interlayer film 102 may be formed using the same material as the moth-eye structure portion 373 or may be formed using a different material. In a case where a space above the interlayer film 102 (above the interface) is the air, when the moth-eye structure portion 373 is formed using a material having a refractive index having a large difference from the refractive index (=1) of the air, the incident light becomes more easily scattered, and an effect of suppressing ripples can be increased.

The moth-eye structure portion 373 of the pixel 51*f* illustrated in FIG. 51 has an unevenness period (a distance from an apex of a protrusion to an apex of an adjacent protrusion) that is about a several hundred nm or a several um and has a shape formed into a cone, a polygonal pyramid, a polygonal column, or the like, as in the moth-eye structure portion 371 of the pixel 51*f* illustrated in FIG. 49.

In the case of forming the moth-eye structure portion 373 on the interlayer film 102 as in the pixel 51*f* illustrated in FIG. 51, the incident light is scattered and occurrence of ripples can be suppressed, as described above. However, there is also a possibility that the scattered light enters an adjacent pixel 51*f* and causes color mixture, as illustrated in FIG. 52.

Figure 52:
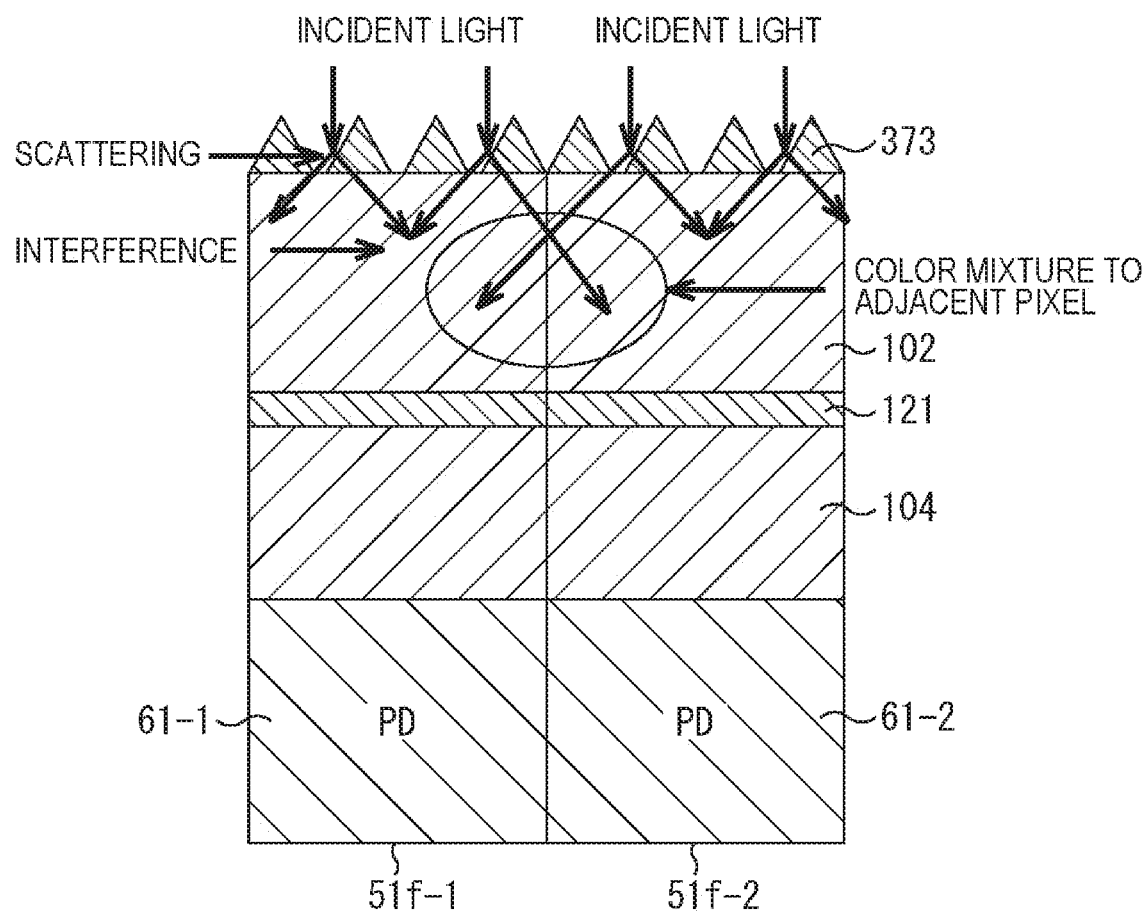

In FIG. 52, a pixel 51*f*-1 and a pixel 51*f*-2 are arranged adjacent to each other, and the moth-eye structure portion 373 is formed on each of the pixels 51*f*. The incident light is scattered by the moth-eye structure portion 373. There is a possibility that some of the scattered light enters the adjacent pixel 51*f*, as illustrated by the arrows surrounded by the circle in FIG. 52.

To prevent the incidence of the scattered light on the adjacent pixel 51*f* as described above, the configuration illustrated in FIG. 53 can be adopted. The pixel 51*f* illustrated in FIG. 53 has a similar basic configuration to the pixel 51*f* illustrated in FIG. 52 (FIG. 51) but is different in including a light-shielding wall 381. The light-shielding wall 381 is formed between the pixels 51*f* and in the interlayer film 102.

The light-shielding wall 381 can have a similar configuration to the metal wall 352 of the pixel 51*e* illustrated in FIG. 46, and can be formed using, for example, a metal. Furthermore, a film having a lower refractive index than the interlayer film 102 in contact may be used as the light-shielding wall 381. By using the film having a lower refractive index than the interlayer film 102, total reflection or a condition close to total reflection can be achieved, and color mixture can be suppressed. The film here is typically, but not limited to, a SiO2, a low-k film, or the like. Any film can be used as long as the film has a lower refractive index than the interlayer film 102. Furthermore, the structure is not necessarily a single-layer structure, and a stacked structure may be used.

Figure 54:
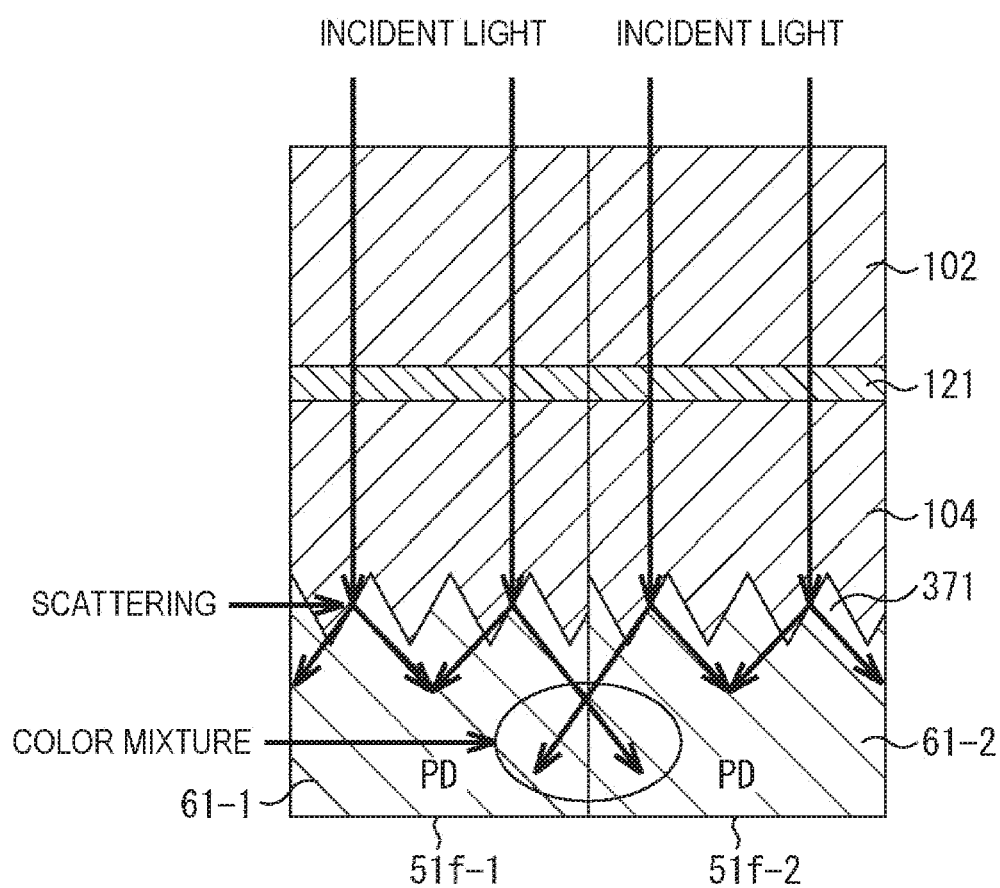

The pixel 51*f* illustrated in FIG. 48 has a possibility that the scattered light enters the adjacent pixel 51*f*. This possibility will be described with reference to FIG. 54. In FIG. 54, a pixel 51*f*-1 and a pixel 51*f*-2 are arranged adjacent to each other, and the moth-eye structure portion 371 is formed in each photodiode 61. The incident light is scattered by the moth-eye structure portion 371. There is a possibility that some of the scattered light enters the adjacent pixel 51*f*, as illustrated by the arrows surrounded by the circle in FIG. 54.

Figure 55:
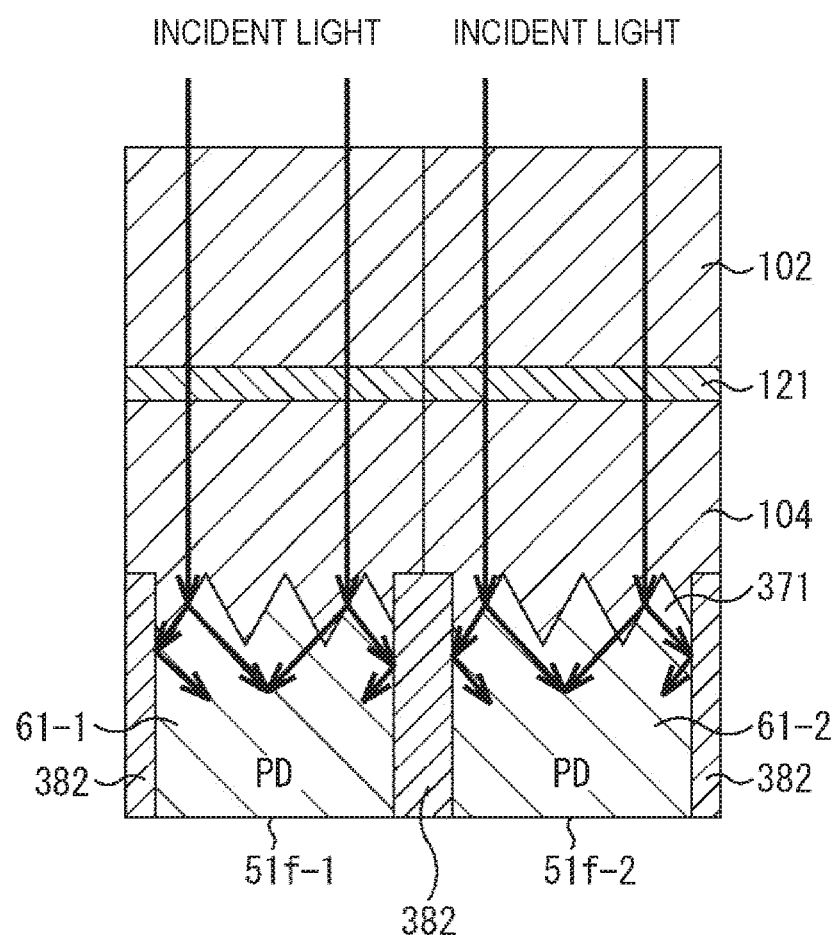

To prevent the incidence of the scattered light on the adjacent pixel 51*f* as described above, the configuration illustrated in FIG. 55 can be adopted. The pixel 51*f* illustrated in FIG. 55 has a similar basic configuration to the pixel 51*f* illustrated in FIG. 54 (FIG. 48) but is different in including an insulating film 382. The insulating film 382 is formed between the pixels 51*f* and between the photodiodes 61.

The insulating film 382 is formed between the photodiodes 61, so that color mixture can be suppressed. The insulating film 382 can be formed using, but is not limited to, SiO2 and the like, and is not particularly limited as long as the film has a lower refractive index than the photodiode 61, in other words, a film has a lower refractive index than silicon (Si). Furthermore, the structure is not necessarily a single-layer structure, and a stacked structure may be used. Furthermore, a stacked structure having a metal film or a semiconductor film formed in the insulating film 382 may be used.

By combining the configurations according to an application, more efficient reflection can be achieved and the color mixture can be suppressed. Furthermore, although not illustrated, even in a case of forming the moth-eye structure 372 in the photodiode 61 on the wiring layer 106 side, as in the pixel 51*f* illustrated in FIG. 50, the configuration including the insulating film 382 can be adopted, as in the pixel 51*f* illustrated in FIG. 55. With the configuration including the insulating film 385, the color mixture can be reduced.

Pixel in Sixth Embodiment

Figure 56:
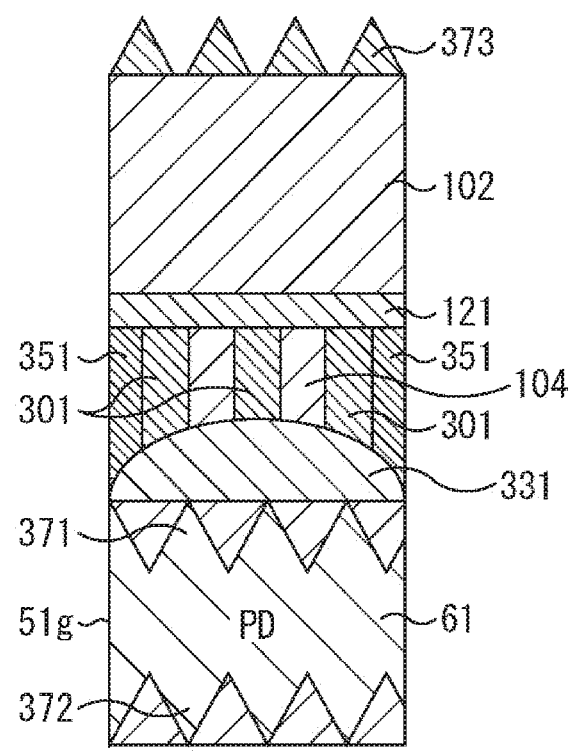

FIG. 56 is a view illustrating a configuration of a pixel 51*g* in a sixth embodiment.

The above-described embodiments can be applied in combination. As the sixth embodiment, an example of a pixel 51 obtained by combining the second to fifth embodiments is illustrated in FIG. 56.

In the pixel 51*g* illustrated in FIG. 56, waveguides 301 are formed in an interlayer film 104 by applying the second embodiment. The example in FIG. 56 illustrates a configuration of the pixel 51*g* in a case of applying the embodiment in which three waveguides 301 of waveguides 301-1 to 301-3 illustrated in FIG. 38 are formed. However, a configuration obtained by applying the embodiment in which one waveguide 301 illustrated in FIG. 37 is formed can be adopted.

In the pixel 51*g* illustrated in FIG. 56, an intra-layer lens 331 is formed in the interlayer film 104 by applying the third embodiment. Furthermore, in the pixel 51*g* illustrated in FIG. 56, a metal wall 351 is formed between the pixels 51*g* in the interlayer film 104 by applying the fourth embodiment.

Moreover, in the pixel 51*g* illustrated in FIG. 56, moth-eye structure portions 371 to 373 are formed by applying the fifth embodiment. The example in FIG. 56 illustrates the configuration of the pixel 51*g* in the case where all the moth-eye structure portion 371 in FIG. 48, the moth-eye structure portion 372 in FIG. 50, and the moth-eye structure portion 373 in FIG. 51 are formed. However, a configuration in which one or two of the moth-eye structure portions 371 to 373 are formed can be adopted. Furthermore, a configuration provided with the light-shielding wall 381 or the insulating film 382 can be adopted, as in the pixel 51*f* illustrated in FIG. 53 or 55.

As described above, the effect of suppressing ripples can be obtained by only each of the second to fifth embodiments. However, a synergistic effect can be expected and ripples can be further suppressed by combining the second to fifth embodiments.

Note that, here, the example in which the four embodiments of the second to fifth embodiments are combined has been described. However, two or three of the second to fifth embodiments can be combined. The effect of suppressing ripples can be similarly obtained by even such a combination. Moreover, the second to fifth embodiments can be combined with the first embodiment. Therefore, a case of combining the first embodiment with another embodiment will be described below.

Pixel in Seventh Embodiment

Figure 57:
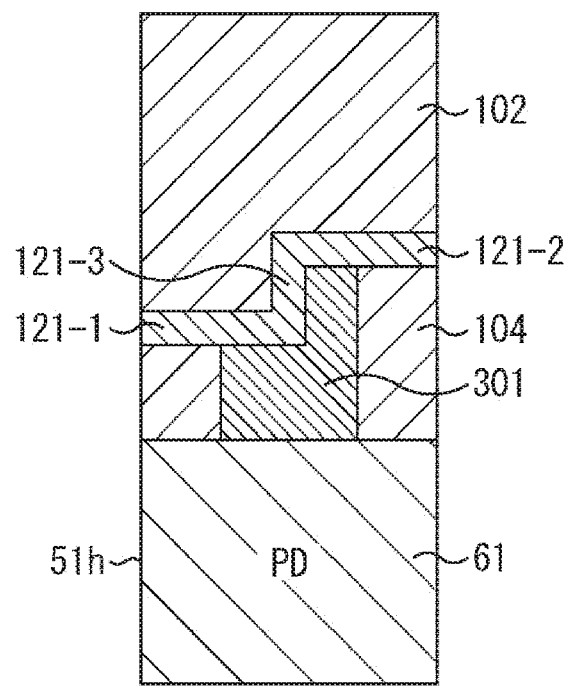

FIG. 57 is a view illustrating a configuration of a pixel 51*h* in a seventh embodiment.

As the seventh embodiment, an example of a pixel 51 obtained by combining the first and second embodiments is illustrated in FIG. 57.

In a pixel 51*h* illustrated in FIG. 57, a plasmon filter 121-1 and a plasmon filter 121-2 having different heights are formed by applying the first embodiment. Furthermore, in the pixel 51*h* illustrated in FIG. 57, a waveguide 301 is formed in an interlayer film 104 and in a center portion of the pixel 51*h* by applying the second embodiment.

The example in FIG. 57 illustrates the configuration of the pixel 51*h* in the case of applying the embodiment in which one waveguide 301 illustrated in FIG. 37 is formed. However, a configuration obtained by applying the embodiment in which three waveguides 301 of waveguides 301-1 to 301-3 illustrated in FIG. 38 are formed can be adopted as the pixel 51*h* illustrated in FIG. 58. In the pixel 51*h* illustrated in FIG. 58, the three waveguides 301 of waveguides 301-1 to 301-3 are formed in the interlayer film 104.

Figure 58:
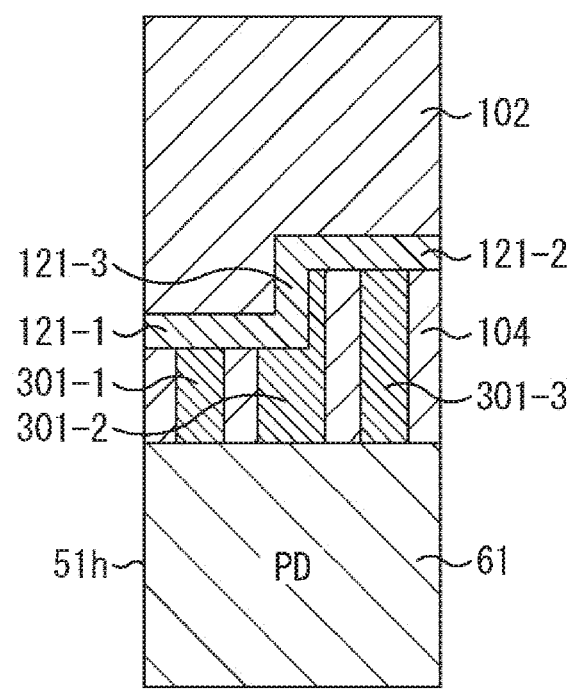
Figure 59:
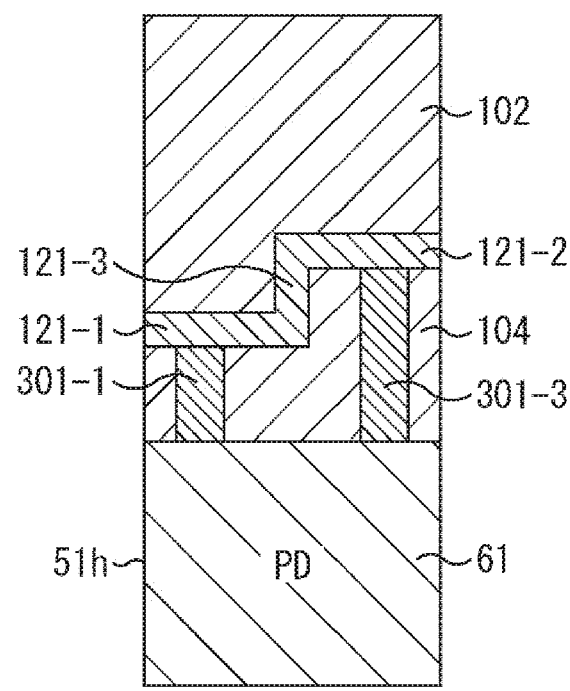

Moreover, in the pixel 51*h* illustrated in FIG. 58, a configuration in which the waveguide 301-2 formed in the center portion is deleted may be adopted. That is, as illustrated in FIG. 59, a pixel 51*h* including two waveguides 301-1 and 301-3 can be adopted.

Referring back to the pixel 51*h* illustrated in FIG. 57. A light having passed through the plasmon filter 121-1, a light having passed through the plasmon filter 121-1 and the waveguide 301, a light having passed through the plasmon filter 121-2 and the waveguide 301, and a light having passed through the plasmon filter 121-4 enter a photodiode 61 of the pixel 51*h* illustrated in FIG. 57. In this case, the lights having passed through the four paths enter the photodiode 61.

Furthermore, the waveguide 301 is formed in a portion of a plasmon filter 121-3 that is a level difference portion between the plasmon filter 121-1 and the plasmon filter 121-2. Therefore, a different path can be produced in this portion.

In the pixel 51*h* illustrated in FIG. 57, the light entering the photodiode 61 can be the lights having passed through the four or more types of paths, and an effect of suppressing ripples can be enhanced.

Similarly, a light having passed through the plasmon filter 121-1, a light having passed through the plasmon filter 121-1 and the waveguide 301, a light having passed through the plasmon filter 121-2 and the waveguide 301, and a light having passed through the plasmon filter 121-4 enter the photodiode 61 of the pixel 51*h* illustrated in FIG. 58. Furthermore, the waveguide 301 is formed in the portion of the plasmon filter 121-3, a different path can be produced in this portion.

Even in the pixel 51*h* illustrated in FIG. 58, the light entering the photodiode 61 can be the lights having passed through the four or more types of paths, and an effect of suppressing ripples can be enhanced.

A light having passed through the plasmon filter 121-1, a light having passed through the plasmon filter 121-1 and the waveguide 301, a light having passed through the plasmon filter 121-2 and the waveguide 301, and a light having passed through the plasmon filter 121-4 enter the photodiode 61 of the pixel 51*h* illustrated in FIG. 59.

Even in the pixel 51*h* illustrated in FIG. 59, the light entering the photodiode 61 can be the lights having passed through the four types of paths, and an effect of suppressing ripples can be enhanced.

In a case of comparing the case where the waveguide 301 is formed in the portion of the plasmon filter 121-3 that is the level difference portion as in the pixel 51*h* illustrated in FIG. 57 or 58, and the case where the waveguide 301 is not formed in the portion of the plasmon filter 121-3 as in the pixel 51*h* illustrated in FIG. 59, the former case has a higher effect of suppressing ripples. On the other hand, in the latter case, processing of the level difference portion is easier, in other words, processing for forming the waveguide 301 in the level difference portion is not necessary. Therefore, the cost at the time of manufacturing can be reduced.

As described above, the effect of suppressing ripples can be obtained by only each of the first and second embodiments. However, a synergistic effect can be expected and ripples can be further suppressed by combining the first and second embodiments.

Pixel in Eighth Embodiment

Figure 60:
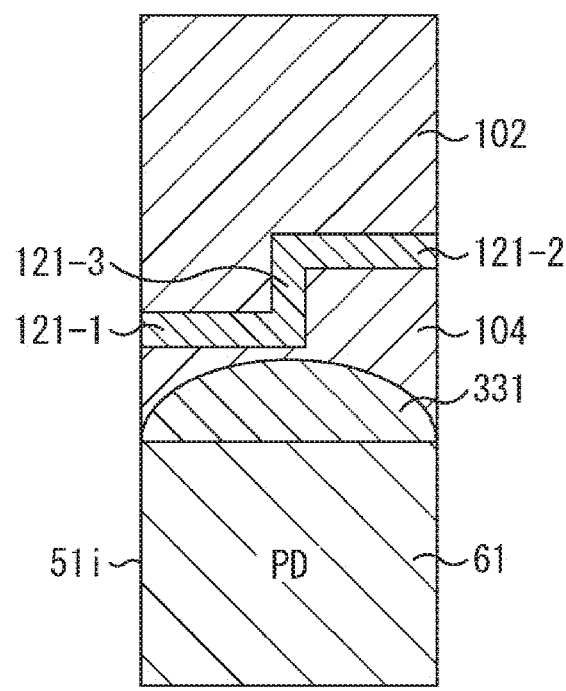

FIG. 60 is a view illustrating a configuration of a pixel 51*i* in an eighth embodiment.

As the eighth embodiment, an example of a pixel 51 obtained by combining the first and third embodiments is illustrated in FIG. 60.

In the pixel 51*h* illustrated in FIG. 60, a plasmon filter 121-1 and a plasmon filter 121-2 having different heights are formed by applying the first embodiment. Furthermore, in the pixel 51*i* illustrated in FIG. 60, an intra-layer lens 331 is formed in an interlayer film 104 by applying the third embodiment.

As described above, the effect of suppressing ripples can be obtained by only each of the first and third embodiments. However, a synergistic effect can be expected and ripples can be further suppressed by combining the first and third embodiments.

Pixel in Ninth Embodiment

Figure 61:
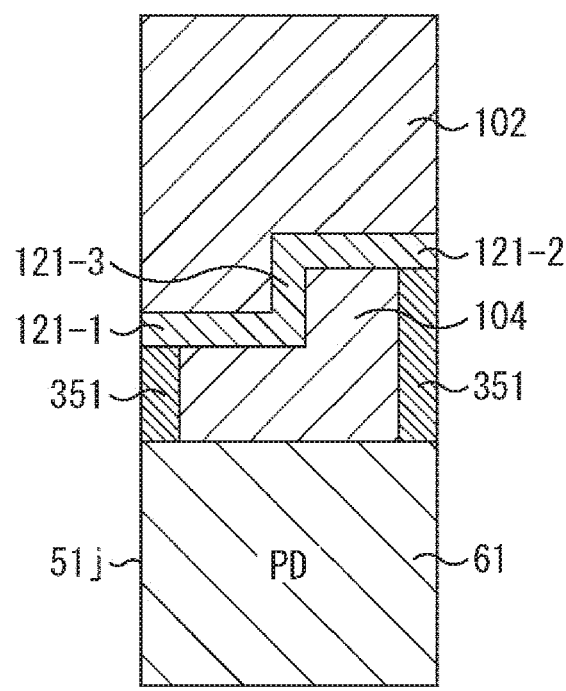

FIG. 61 is a view illustrating a configuration of a pixel 51*j* in a ninth embodiment.

As the ninth embodiment, an example of a pixel 51 obtained by combining the first and fourth embodiments is illustrated in FIG. 61.

In a pixel 51*j* illustrated in FIG. 61, a plasmon filter 121-1 and a plasmon filter 121-2 having different heights are formed by applying the first embodiment. Furthermore, in the pixel 51*j* illustrated in FIG. 61, a metal wall 351 is formed in an interlayer film 104 and between the pixels 51*j* by applying the fourth embodiment.

Figure 62:
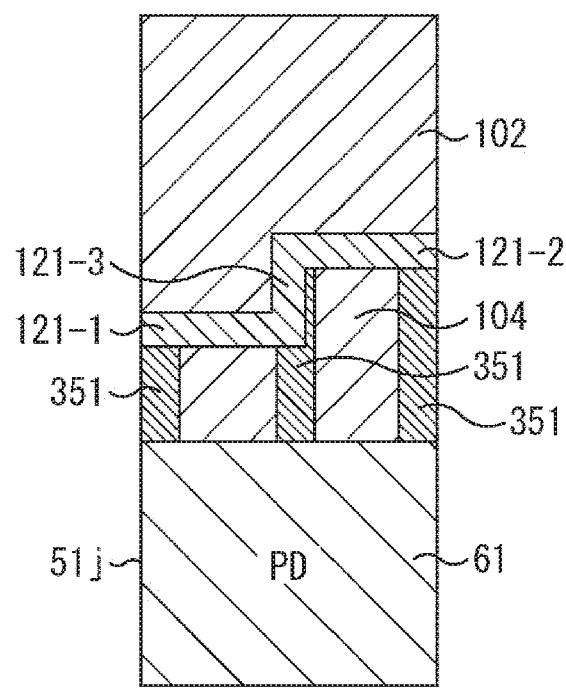

The example in FIG. 61 illustrates the configuration of the pixel 51*j* in the case of applying the embodiment in which the metal wall 351 is formed between the pixels illustrated in FIG. 43. However, a configuration obtained by applying the embodiment in which three metal walls 351 illustrated in FIG. 45 are formed can be adopted as the configuration of the pixel 51*j* illustrated in FIG. 62. In the pixel 51*j* illustrated in FIG. 62, the metal wall 351 is formed between the pixels 51*j* and in a substantially center portion (a level difference portion of the plasmon filter 121) of the pixel 51*j*.

Moreover, a pixel 51*h* obtained by combining the first and fourth embodiments may be adopted by applying the embodiment in which the metal wall 352 is formed in the interlayer film 102 that is on the upper side of the plasmon filter 121 illustrated in FIG. 46.

Moreover, a pixel 51*h* obtained by combining the first and fourth embodiments may be adopted by applying the embodiment in which the metal wall 352 is formed in the interlayer film 102 that is on the upper side of the plasmon filter 121 illustrated in FIG. 47, and the metal wall 351 is formed in the interlayer film 104 that is on the lower side of the plasmon filter 121.

As described above, the effect of suppressing ripples can be obtained by only each of the first and fourth embodiments. However, a synergistic effect can be expected and ripples can be further suppressed by combining the first and fourth embodiments.

Pixel in Tenth Embodiment

Figure 63:
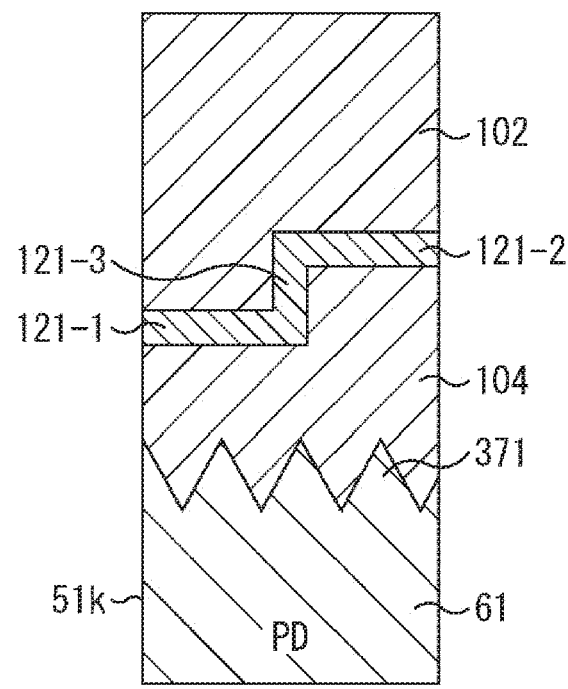

FIG. 63 is a view illustrating a configuration of a pixel 51*k* in a tenth embodiment.

As the tenth embodiment, an example of a pixel 51 obtained by combining the first and fifth embodiments is illustrated in FIG. 63.

In the pixel 51*k* illustrated in FIG. 63, a plasmon filter 121-1 and a plasmon filter 121-2 having different heights are formed by applying the first embodiment. Furthermore, in the pixel 51*k* illustrated in FIG. 63, a moth-eye structure portion 371 is formed in a photodiode 61 on a light incident surface side by applying the fifth embodiment.

Figure 64:
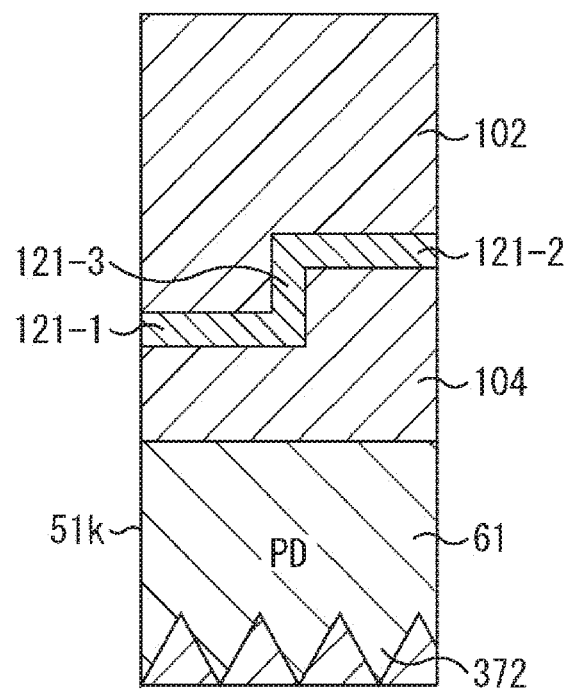

The example in FIG. 63 illustrates the configuration of the pixel 51*k* in the case of applying the embodiment in which the moth-eye structure portion 371 is formed in the photodiode 61 on the light incident surface side illustrated in FIG. 48. However, a configuration obtained by applying the embodiment in which the moth-eye structure portion 372 is formed in the photodiode 61 on the wiring layer 106 side (not illustrated) illustrated in FIG. 50 can be adopted as the configuration of the pixel 51*k* illustrated in FIG. 64. In the pixel 51*k* illustrated in FIG. 64, a moth-eye structure portion 372 is formed in a wiring layer 106 of the photodiode 61.

Figure 65:
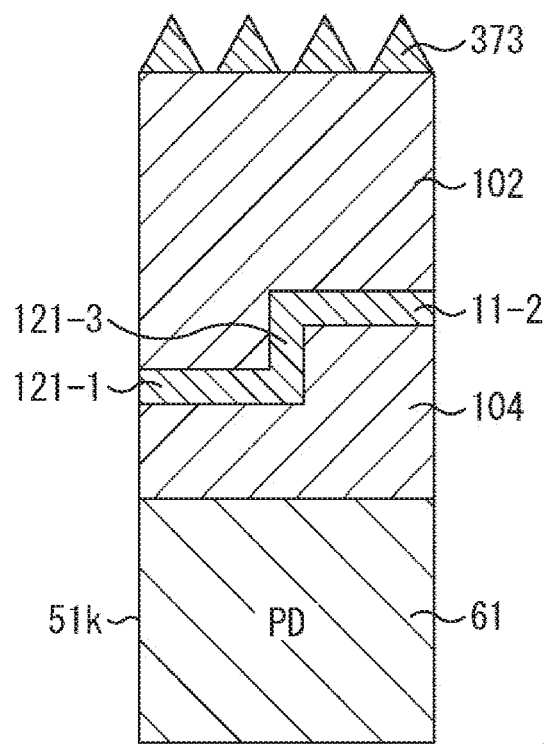

Furthermore, a configuration obtained by applying the embodiment in which the moth-eye structure portion 373 is formed on the interlayer film 102 illustrated in FIG. 51 can be adopted as the configuration of the pixel 51*k* illustrated in FIG. 65. In the pixel 51*k* illustrated in FIG. 65, a moth-eye structure portion 372 is formed on an interlayer film 102.

Moreover, a pixel 51*h* obtained by applying two or three of the embodiment in which the moth-eye structure portion 371 is formed in the photodiode 61 on the light incident surface side illustrated in FIG. 48, the embodiment in which the moth-eye structure portion 372 is formed in the photodiode 61 on the wiring layer 106 (not illustrated) side illustrated in FIG. 50, and the embodiment in which the moth-eye structure portion 373 is formed on the interlayer film 102 illustrated in FIG. 51 can be adopted although not illustrated. Furthermore, a pixel 51*h* provided with a light-shielding wall 381 or an insulating film 382 can be adopted, as in the pixel 51*f* illustrated in FIG. 53 or 55.

As described above, the effect of suppressing ripples can be obtained by only each of the first and fifth embodiments. However, a synergistic effect can be expected and ripples can be further suppressed by combining the first and fifth embodiments.

Pixel in Eleventh Embodiment

Figure 66:
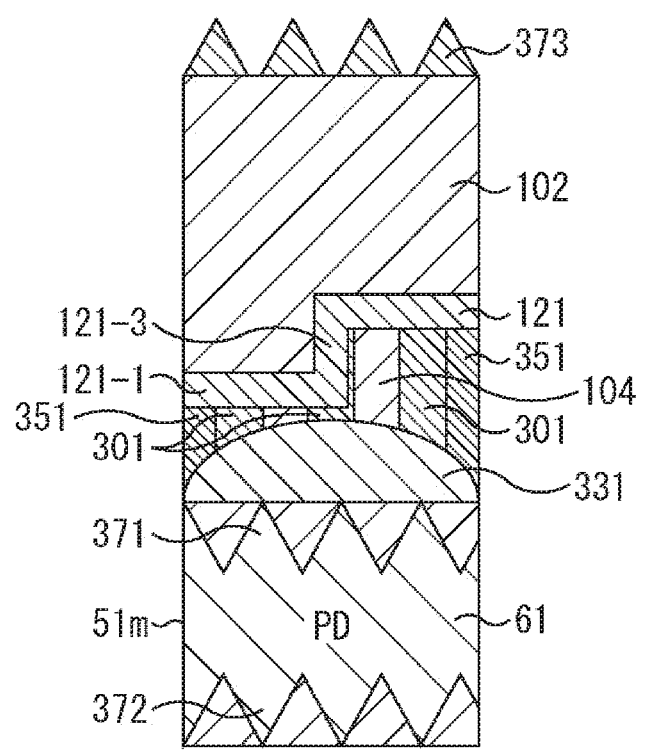

FIG. 66 is a view illustrating a configuration of a pixel 51*m* in an eleventh embodiment.

As the eleventh embodiment, an example of a pixel 51 obtained by combining the first to fifth embodiments is illustrated in FIG. 66. The pixel 51*m* illustrated in FIG. 66 has a configuration of the pixel 51 obtained by combining the first and sixth embodiments.

In the pixel 51*m* illustrated in FIG. 66, a plasmon filter 121-1 and a plasmon filter 121-2 having different heights are formed by applying the first embodiment. Furthermore, in the pixel 51*m* illustrated in FIG. 66, waveguides 301 are formed in an interlayer film 104 by applying the second embodiment. The example in FIG. 66 illustrates a configuration of the pixel 51*m* in the case of applying the embodiment in which three waveguides 301 of waveguides 301-1 to 301-3 illustrated in FIG. 38 are formed. However, a configuration obtained by applying the embodiment in which one waveguide 301 illustrated in FIG. 37 is formed can be adopted.

Furthermore, in the pixel 51*m* illustrated in FIG. 66, an intra-layer lens 331 is formed in the interlayer film 104 by applying the third embodiment. Furthermore, in the pixel 51*m* illustrated in FIG. 66, a metal wall 351 is formed between the pixels 51*m* in the interlayer film 104 by applying the fourth embodiment.

Moreover, in the pixel 51*m* illustrated in FIG. 66, moth-eye structure portions 371 to 373 are formed by applying the fifth embodiment. The example in FIG. 66 illustrates the configuration of the pixel 51*m* in the case where all the moth-eye structure portion 371 in FIG. 48, the moth-eye structure portion 372 in FIG. 50, and the moth-eye structure portion 373 in FIG. 51 are formed. However, a configuration in which one or two of the moth-eye structure portions 371 to 373 are formed can be adopted. Furthermore, a configuration provided with a light-shielding wall 381 or an insulating film 382 can be adopted, as in the pixel 51*f* illustrated in FIG. 53 or 55.

As described above, the effect of suppressing ripples can be obtained by only each of the first to fifth embodiments. However, a synergistic effect can be expected and ripples can be further suppressed by combining the first to fifth embodiments.

The above-described first to eleventh embodiments have been described using the plasmon filter 121 having the hole array structure as an example. However, as the narrow band filter NB applicable to an imaging device to which the present technology is applied, the plasmon filters having, for example, the dot array structure, GMR, and the bullseye structure, and the Fabry-Perot interferometer can be used in addition to the plasmon filter having the hole array structure.

Even in the case of using the Fabry-Perot interferometer, there are some cases where an interlayer film is present in an upper portion of the Fabry-Perot interferometer. In such a configuration, unintended reflection may be present. By applying the present technology, ripples can be suppressed even in the case of using the Fabry-Perot interferometer. Note that, in the case of applying the first embodiment, using the Fabry-Perot interferometer as the narrow band filter NB, for example, a configuration capable of suppressing ripples can be obtained by changing the height of the main body of the Fabry-Perot interferometer.

Note that the above-described embodiments have been described using the imaging device as an example. However, the description of the present technology is not description limiting the application range to the imaging device, and the present technology can be applied to devices other than the imaging device.

For example, the present technology can be applied to a sensor provided with the plasmon filter or the Fabry-Perot interferometer. For example, the present technology can be applied to a measuring device that receives light having a predetermined wavelength and measures a received light amount. The present technology can be widely applied to electromagnetic wave processing devices that process electromagnetic waves.

According to the present technology, lights having different optical path lengths can be created, and the lights having the different optical path lengths can be caused to interfere with each other, and ripples can be suppressed.

Application Example to Endoscopic Surgical System

Furthermore, for example, the technology (present technology) according to the present disclosure may be applied to an endoscopic surgical system.

Figure 67:
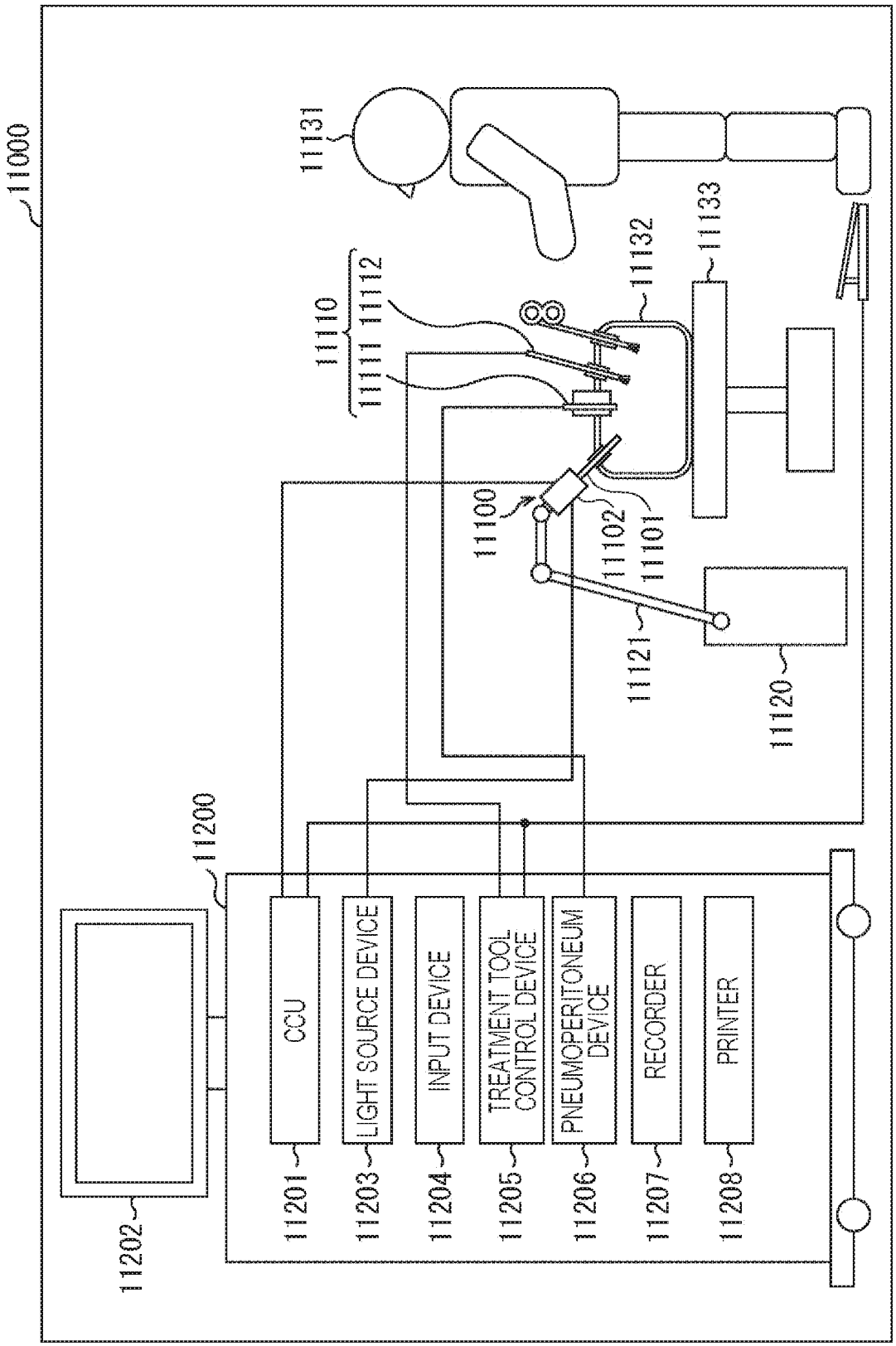

FIG. 67 is a diagram illustrating an example of a schematic configuration of an endoscopic surgical system to which the technology according to the present disclosure (present technology) is applicable.

Figure 53:
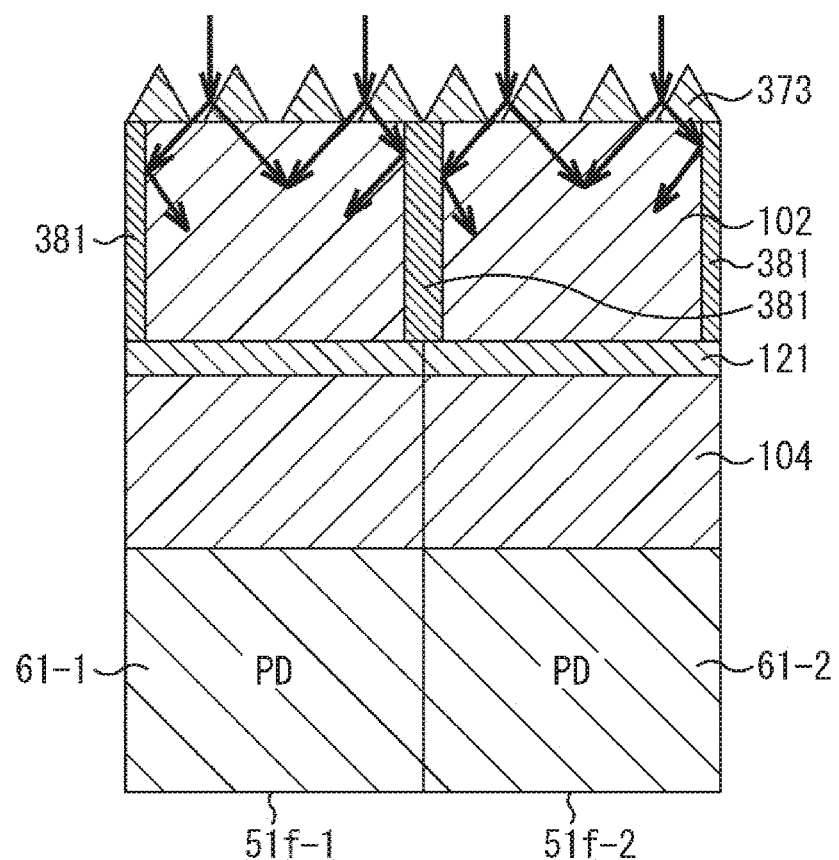

FIG. 67 illustrates a state in which an operator (surgeon) 11131 is performing surgery for a patient 11132 on a patient bed 11133, using the endoscopic surgical system 11000. As illustrated in FIG. 53, the endoscopic surgical system 11000 includes an endoscope 11100, other surgical instruments 11110 such as a pneumoperitoneum tube 11111 and an energy treatment tool 11112, a support arm device 11120 that supports the endoscope 11100, and a cart 11200 on which various devices for endoscope surgery are mounted.

The endoscope 11100 includes a lens-barrel 11101 and a camera head 11102. A region having a predetermined length from a distal end of the lens-barrel 11101 is inserted into a body cavity of the patient 11132. The camera head 11102 is connected to a proximal end of the lens-barrel 11101. FIG. 37 illustrates the endoscope 11100 configured as so-called a hard endoscope including the hard lens-barrel 11101. However, the endoscope 11100 may be configured as so-called a soft endoscope including a soft lens-barrel.

An opening portion in which an object lens is fit is provided in the distal end of the lens-barrel 11101. A light source device 11203 is connected to the endoscope 11100, and light generated by the light source device 11203 is guided to the distal end of the lens-barrel 11101 by a light guide extending inside the lens-barrel 11101 and an observation target in the body cavity of the patient 11132 is irradiated with the light through the object lens. Note that the endoscope 11100 may be a forward-viewing endoscope, may be an oblique-viewing endoscope, or may be a side-viewing endoscope.

An optical system and an imaging element are provided inside the camera head 11102, and reflected light (observation light) from the observation target is condensed to the imaging element by the optical system. The observation light is photoelectrically converted by the imaging element, and an electrical signal corresponding to the observation light, in other words, an image signal corresponding to an observed image is generated. The image signal is transmitted to a camera control unit (CCU) 11201 as raw data.

The CCU 11201 includes a central processing unit (CPU), a graphics processing unit (GPU), and the like, and generally controls an operation of the endoscope 11100 and a display device 11202. Moreover, the CCU 11201 receives the image signal from the camera head 11102, and applies various types of image processing for displaying an image based on the image signal, such as developing processing (demosaicing processing) or the like, to the image signal.

The display device 11202 displays the image based on the image signal to which the image processing has been applied by the CCU 11201, by control of the CCU 11201.

The light source device 11203 includes a light source such as a light emitting diode (LED) for example, and supplies irradiation light to the endoscope 11100 in capturing an operation portion or the like.

An input device 11204 is an input interface for the endoscopic surgical system 11000. A user can input various types of information and instructions to the endoscopic surgical system 11000 through the input device 11204. For example, the user inputs an instruction to change imaging conditions (a type of irradiation light, a magnification, a focal length, and the like) by the endoscope 11100, and the like.

A treatment tool control device 11205 controls drive of the energy treatment tool 11112, for cauterizing or incising a tissue, sealing a blood vessel, and the like. A pneumoperitoneum device 11206 sends a gas into the body cavity of the patient 11132 through the pneumoperitoneum tube 11111 to expand the body cavity for the purpose of securing a field of vision by the endoscope 11100 and a work space for the operator. A recorder 11207 is a device that can record various types of information regarding the surgery. A printer 11208 is a device that can print the various types of information regarding the surgery in various formats such as a text, an image, and a graph.

Note that the light source device 11203 that supplies the irradiation light in capturing the operation portion to the endoscope 11100 can be configured from a white light source configured from an LED, a laser light source, or a combination of the LED and the laser light source, for example. In a case where the white light source is configured from a combination of RGB laser light sources, output intensity and output timing of the respective colors (wavelengths) can be controlled with high accuracy. Therefore, adjustment of white balance of the captured image can be performed in the light source device 11203. Furthermore, in this case, the observation target is irradiated with the laser light from each of the RGB laser light sources in a time division manner, and the drive of the imaging element of the camera head 11102 is controlled in synchronization with the irradiation timing, so that images respectively corresponding to RGB can be captured in a time division manner. According to the method, a color image can be obtained without providing a color filter to the imaging element.

Furthermore, drive of the light source device 11203 may be controlled to change intensity of light to be output every predetermined time. The drive of the imaging element of the camera head 11102 is controlled in synchronization with change timing of the intensity of light and images are acquired in a time division manner, and the images are synthesized, so that a high-dynamic range image without so-called clipped blacks and flared highlights can be generated.

Furthermore, the light source device 11203 may be configured to be able to supply light in a predetermined wavelength band corresponding to special light observation. In the special light observation, for example, so-called narrow band imaging is performed by radiating light in a narrower band than the irradiation light (in other words, white light) at the time of normal observation, using wavelength dependence of absorption of light in a body tissue, to capture a predetermined tissue such as a blood vessel in a mucosal surface layer at high contrast. Alternatively, in the special light observation, fluorescence imaging may be performed to obtain an image by fluorescence generated by radiation of exciting light. In the fluorescence imaging, irradiating the body tissue with exciting light to observe fluorescence from the body tissue (self-fluorescence observation), or injecting a reagent such as indocyanine green (ICG) into the body tissue and irradiating the body tissue with exciting light corresponding to a fluorescence wavelength of the reagent to obtain a fluorescence image, for example, can be performed. The light source device 11203 can be configured to be able to supply narrow band light and/or exciting light corresponding to such special light observation.

Figure 68:
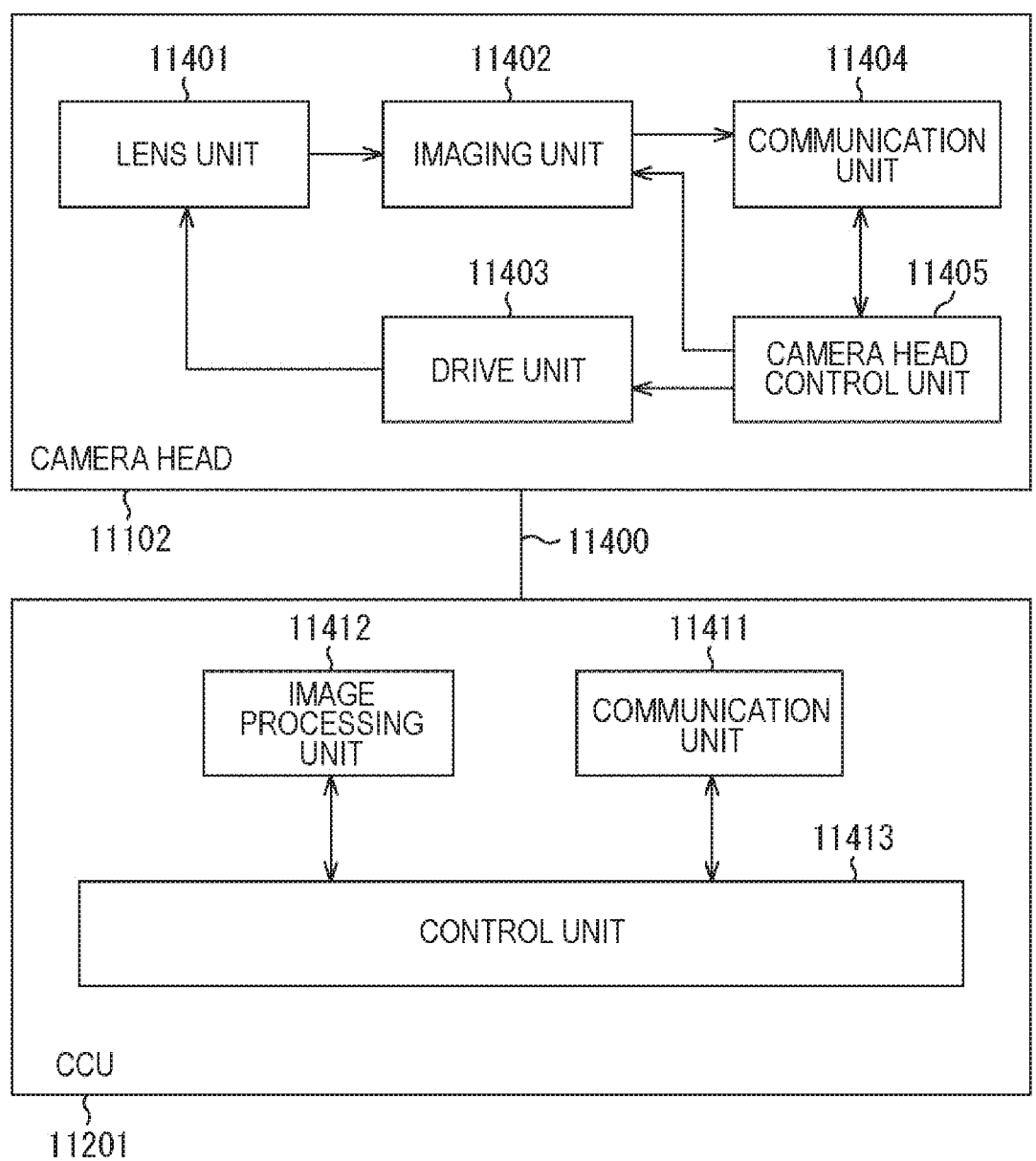

FIG. 68 is a block diagram illustrating an example of functional configurations of the camera head 11102 and the CCU 11201 illustrated in FIG. 67.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicatively connected with each other by a transmission cable 11400.

The lens unit 11401 is an optical system provided in a connection portion between the camera head 11102 and the lens-barrel 11101. Observation light taken through the distal end of the lens-barrel 11101 is guided to the camera head 11102 and enters the lens unit 11401. The lens unit 11401 is configured by a combination of a plurality of lenses including a zoom lens and a focus lens.

The imaging element that configures the imaging unit 11402 may be one imaging element (so-called single imaging element) or may be a plurality of imaging elements (so-called multiple imaging elements). In a case where the imaging unit 11402 is configured by multiple imaging elements, for example, a color image may be obtained by generating image signals respectively corresponding to RGB by the imaging elements and synthesizing the image signals. Alternatively, the imaging unit 11402 may be configured by a pair of imaging elements for respectively obtaining image signals for right eye and for left eye corresponding to three-dimensional (3D) display. With the 3D display, the operator 11131 can more accurately grasp the depth of a biological tissue in the operation portion. Note that, in a case where the imaging unit 11402 is configured by the multiple imaging elements, a plurality of systems of the lens units 11401 may be provided corresponding to the imaging elements.

Furthermore, the imaging unit 11402 may not be necessarily provided in the camera head 11102. For example, the imaging unit 11402 may be provided immediately after the object lens inside the lens-barrel 11101.

The drive unit 11403 is configured by an actuator, and moves the zoom lens and the focus lens of the lens unit 11401 by a predetermined distance along an optical axis by control of the camera head control unit 11405. With the movement, a magnification and a focal point of a captured image by the imaging unit 11402 can be appropriately adjusted.

The communication unit 11404 is configured by a communication device for transmitting or receiving various types of information to or from the CCU 11201. The communication unit 11404 transmits the image signal obtained from the imaging unit 11402 to the CCU 11201 through the transmission cable 11400 as raw data.

Furthermore, the communication unit 11404 receives a control signal for controlling drive of the camera head 11102 from the CCU 11201 and supplies the control signal to the camera head control unit 11405. The control signal includes information regarding the imaging conditions such as information for specifying a frame rate of the captured image, information for specifying an exposure value at the time of imaging, and/or information for specifying the magnification and the focal point of the captured image, for example.

Note that the imaging conditions such as the frame rate, the exposure value, the magnification, and the focal point may be appropriately specified by the user or may be automatically set by the control unit 11413 of the CCU 11201 on the basis of the acquired image signal. In the latter case, so-called an auto exposure (AE) function, an auto focus (AF) function, and an auto white balance (AWB) function are incorporated in the endoscope 11100.

The camera head control unit 11405 controls drive of the camera head 11102 on the basis of the control signal received through the communication unit 11404 from the CCU 11201.

The communication unit 11411 is configured from a communication device for transmitting or receiving various types of information to or from the camera head 11102. The communication unit 11411 receives the image signal transmitted from the camera head 11102 through the transmission cable 11400.

Furthermore, the communication unit 11411 transmits a control signal for controlling drive of the camera head 11102 to the camera head 11102. The image signal and the control signal can be transmitted through telecommunication, optical communication, or the like.

The image processing unit 11412 applies various types of image processing to the image signal as a raw data transmitted from the camera head 11102.

The control unit 11413 performs various types of control regarding imaging of the operation portion and the like by the endoscope 11100 and display of the captured image obtained through imaging of the operation portion and the like. For example, the control unit 11413 generates a control signal for controlling drive of the camera head 11102.

Furthermore, the control unit 11413 displays the captured image of the operation portion or the like in the display device 11202 on the basis of the image signal to which the image processing has been applied by the image processing unit 11412. At this time, the control unit 11413 may recognize various objects in the captured image, using various image recognition technologies. For example, the control unit 11413 can recognize a surgical instrument such as forceps, a specific living body portion, blood, mist at the time of use of the energy treatment tool 11112, or the like, by detecting a shape of an edge, a color, or the like of an object included in the captured image. The control unit 11413 may superimpose and display various types of surgery support information on the image of the operation portion, in displaying the captured image in the display device 11202. The superimposition and display, and presentation of the surgery support information to the operator 11131 can reduce a burden on the operator 11131 and enables the operator 11131 to reliably proceed with the operation.

The transmission cable 11400 that connects the camera head 11102 and the CCU 11201 is an electrical signal cable corresponding to communication of electrical signals, an optical fiber corresponding to optical communication, or a composite cable thereof.

Here, in the illustrated example, the communication has been performed in a wired manner using the transmission cable 11400. However, the communication between the camera head 11102 and the CCU 11201 may be wirelessly performed.

An example of an endoscopic surgical system to which the technology according to the present disclosure is applicable has been described. The technology according to the present disclosure is applicable to the camera head 11102 or the imaging unit 11402 of the camera head 11102, for example, of the above-described configurations. Specifically, for example, the imaging element 12 in FIG. 1 can be applied to the imaging unit 11402. By applying the technology according to the present disclosure to the imaging unit 11402, a more detailed and more precise operation portion image can be obtained. Therefore, the operator can reliably confirm the operation portion.

Note that, here, the endoscopic surgical system has been described as an example. However, the technology according to the present disclosure may be applied to microsurgery or the like, for example.

Application Example To Moving Bodies

Furthermore, for example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 69:
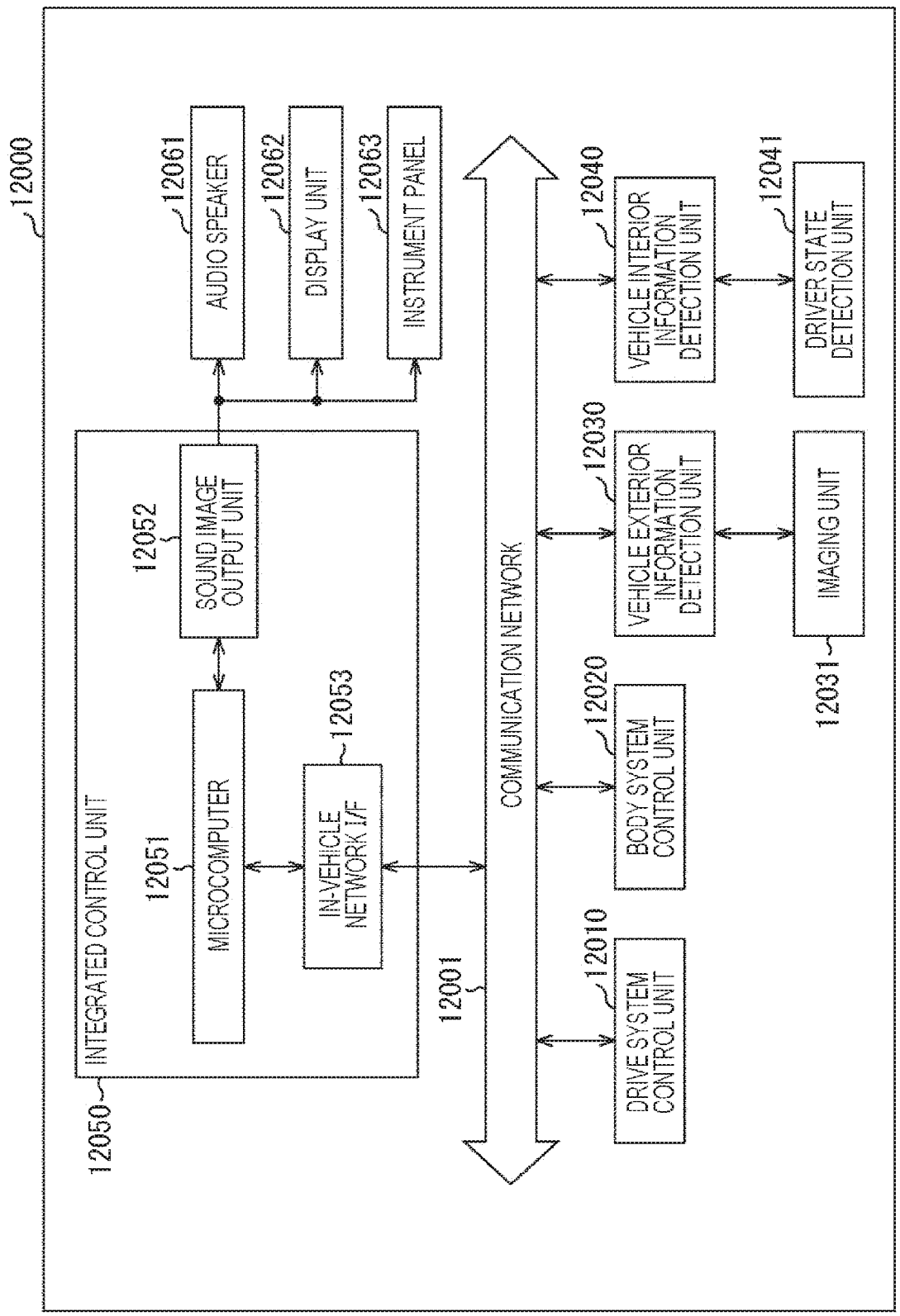

FIG. 69 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 69, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to the amount of received light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive power generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realizing the function of an advanced driver assistance system (ADAS) function including collision avoidance or shock mitigation of the vehicle, following travel based on an inter-vehicle distance, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic drive of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare such as by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 69, as the output device, an audio speaker 12061, a display unit 12062, and an instrument panel 12063 are exemplarily illustrated. The display unit 12062 may include, for example, at least one of an on-board display or a head-up display.

Figure 70:
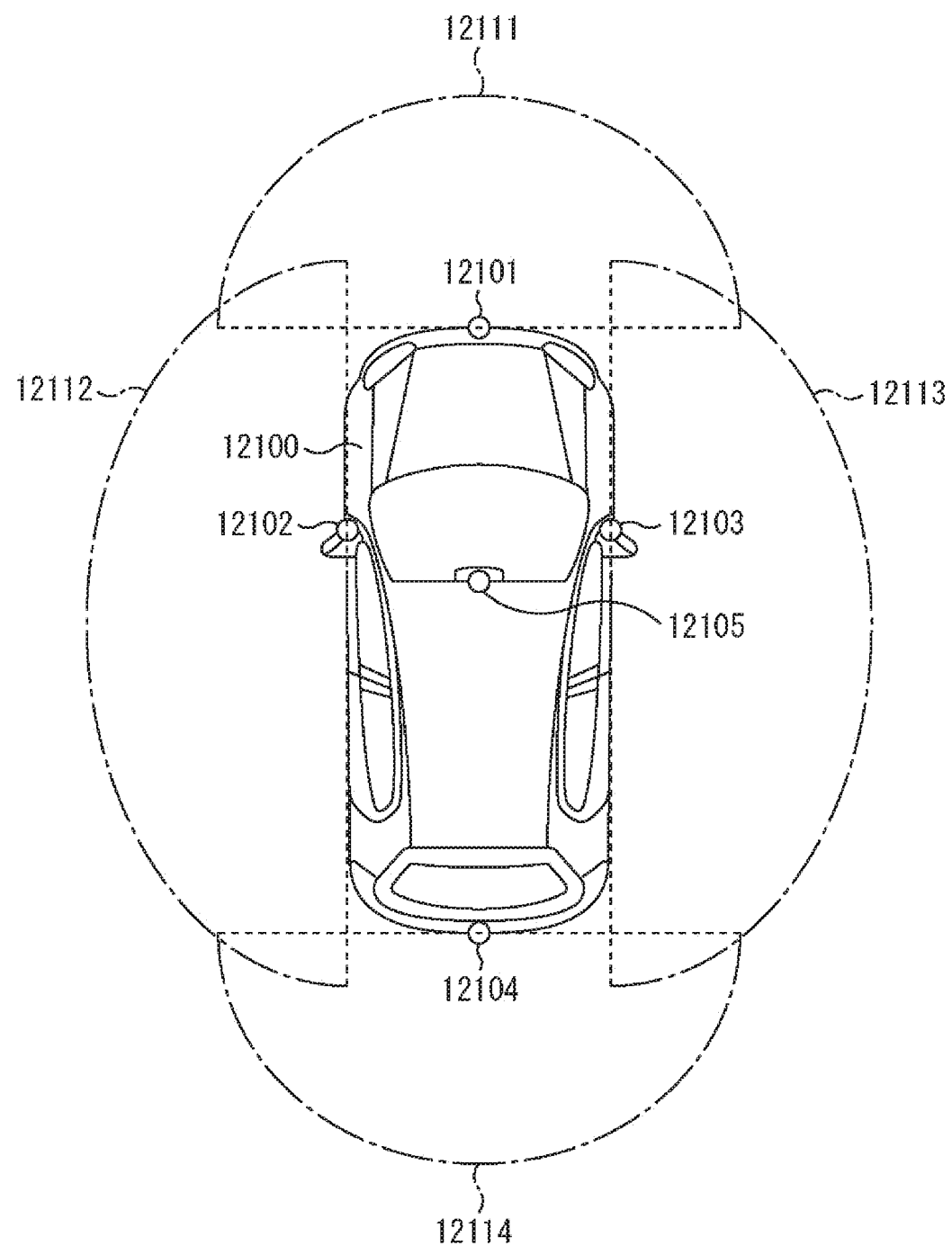

FIG. 70 is a diagram illustrating an example of an installation position of the imaging unit 12031.

In FIG. 70, imaging units 12101, 12102, 12103, 12104, and 12105 are included as the imaging unit 12031.

The imaging units 12101, 12102, 12103, 12104, and 12105 are provided at positions such as a front nose, side mirrors, a rear bumper, a back door, and an upper portion of a windshield in an interior of the vehicle 12100, for example. The imaging unit 12101 provided at the front nose and the imaging unit 12105 provided at an upper portion of the windshield in an interior of the vehicle mainly acquire front images of the vehicle 12100. The imaging units 12102 and 12103 provided at the side mirrors mainly acquire side images of the vehicle 12100. The imaging unit 12104 provided at the rear bumper or the back door mainly acquires a rear image of the vehicle 12100. The imaging unit 12105 provided at the upper portion of the windshield in the interior of the vehicle is mainly used for detecting a preceding vehicle, a pedestrian, an obstacle, a traffic signal, a traffic sign, a lane, or the like.

Note that FIG. 70 illustrates an example of capture ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of imaging elements or may be an imaging element having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract particularly a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic drive of autonomous travel without depending on an operation of the driver or the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. Then, the microcomputer 12051 determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. Such recognition of a pedestrian is performed by a process of extracting characteristic points in the captured images of the imaging units 12101 to 12104, as the infrared camera, for example, and by a process of performing pattern matching processing for the series of characteristic points indicating a contour of an object and determining whether or not the object is a pedestrian. When the microcomputer 12051 determines that a pedestrian exists in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like representing the pedestrian at a desired position.

An example of a vehicle control system to which the technology according to the present disclosure is applicable has been described. The technology according to the present disclosure is applicable to the imaging unit 12031, of the above-described configurations, for example. Specifically, for example, the imaging device 10 in FIG. 1 can be applied to the imaging unit 12031. By applying the technology according to the present disclosure to the imaging unit 12031, the information outside the vehicle can be obtained in more detail and precise manner, and improvement of safety of automatic drive and the like can be implemented, for example.

Note that the effects described in the present specification are merely examples and are not limited, and other effects may be exhibited.

Note that embodiments of the present technology are not limited to the above-described embodiments, and various modifications can be made without departing from the gist of the present technology.

Note that the present technology can also have the following configurations.

(1)
An electromagnetic wave processing device including:
a photoelectric conversion element;
a narrow band filter stacked on a light incident surface side of the photoelectric conversion element and configured to transmit an electromagnetic wave having a desired wavelength; and
interlayer films respectively formed above and below the narrow band filter, in which
the narrow band filter is formed in a shape with a level difference.

(2)
The electromagnetic wave processing device according to (1), in which
the level difference is formed for each photoelectric conversion element.

(3)
The electromagnetic wave processing device according to (1), in which
the level difference is formed between photoelectric conversion elements and in the interlayer film.

(4)
The electromagnetic wave processing device according to any one of (1) to (3), in which
a size of the level difference is set to ¼ of a wavelength of interest.

(5)
The electromagnetic wave processing device according to any one of (1) to (3), in which
the level differences having different sizes are formed in one photoelectric conversion element.

(6)
The electromagnetic wave processing device according to any one of (1) to (5), in which
an antireflection film for suppressing reflection is formed on the level difference.

(7)
An electromagnetic wave processing device including:
a photoelectric conversion element;
a narrow band filter stacked on a light incident surface side of the photoelectric conversion element and configured to transmit an electromagnetic wave having a desired wavelength;
an interlayer film formed between the photoelectric conversion element and the narrow band filter; and
a waveguide formed in the interlayer film.

(8)
An electromagnetic wave processing device including:
a photoelectric conversion element;
a narrow band filter stacked on a light incident surface side of the photoelectric conversion element and configured to transmit an electromagnetic wave having a desired wavelength;
an interlayer film formed between the photoelectric conversion element and the narrow band filter; and
a lens formed in the interlayer film.

(9)
An electromagnetic wave processing device including:
a photoelectric conversion element;
a narrow band filter stacked on a light incident surface side of the photoelectric conversion element and configured to transmit an electromagnetic wave having a desired wavelength;
an interlayer film formed between the photoelectric conversion element and the narrow band filter; and
a metal wall formed between the photoelectric conversion element and the narrow band filter, and in the interlayer film between the photoelectric conversion elements.

(10)
An electromagnetic wave processing device including:
a photoelectric conversion element;
a narrow band filter stacked on a light incident surface side of the photoelectric conversion element and configured to transmit an electromagnetic wave having a desired wavelength; and
an interlayer film formed on a light incident side of the narrow band filter, in which
an uneven shape is formed in at least one surface of the light incident surface side of the photoelectric conversion element, a surface facing the light incident surface, and an interface of the interlayer film.

(11)
The electromagnetic wave processing device according to any one of (1) to (10), in which
the narrow band filter is a hole array-type plasmon filter.

(12)
The electromagnetic wave processing device according to any one of (1) to (10), in which
the narrow band filter is a dot array-type plasmon filter.

(13)
The electromagnetic wave processing device according to any one of (1) to (10), in which
the narrow band filter is a plasmon filter using guided mode resonant (GMR).

(14)
The electromagnetic wave processing device according to any one of (1) to (10), in which
the narrow band filter is a plasmon filter having a bullseye structure.

(15)
The electromagnetic wave processing device according to any one of (1) to (10), in which
the narrow band filter is a Fabry-Perot interferometer.

REFERENCE SIGNS LIST

10 Imaging device
11 Optical system
12 Imaging element
13 Memory
14 Signal processing unit
15 Output unit
16 Control unit
21 Plasmon filter
31 Pixel array unit
32 Row scanning circuit
33 PLL
335 Column ADC circuit
36 Column scanning circuit
37 Sense amplifier
51 Pixel
61 Photodiode
62 Transfer transistor
63 Floating diffusion
64 Amplification transistor
65 Selection transistor
66 Reset transistor
71 Comparator
72 Counter
101 On-chip microlens
102 Interlayer film
103 Narrow band filter layer 104 Interlayer film
105 Photoelectric conversion element layer
106 Wiring layer
121 Plasmon filter
131 Conductive thin film
132 Hole
133 Dot
134 Dielectric layer
151 Plasmon filter
161 Conductive layer
162 SiO2 film
163 SiN film
164 SiO2 substrate
171 Plasmon filter
181 Through hole
182 Protrusion
201 Fabry-Perot interferometer
202 Semi-transparent mirror
203 Semi-transparent mirror
251 Lens
271 Antireflection film
301 Waveguide
331 Intra-layer lens
351, 352 Metal wall
371 to
373 Moth-eye structure portion

The invention claimed is:

1. An electromagnetic wave processing device, comprising:
   a photoelectric conversion element;
   a narrow band filter on a light incident surface side of the photoelectric conversion element, wherein the narrow band filter is configured to transmit a narrow band light; and
   interlayer films respectively disposed above and below the narrow band filter, wherein
      the narrow band filter includes a metal,
      the narrow band filter is disposed in a shape with a level difference,
      the narrow band filter includes a first part and a second part,
      the first part of the narrow band filter is at a first position in the interlayer films,
      the second part of the narrow band filter is at a second position in the interlayer films,
      the first position is deeper than the second position from an interface of one of the interlayer films,
      the one of the interlayer films at a position corresponding to the first position has a first thickness,
      the one of the interlayer films at a position corresponding to the second position has a second thickness, and
      the first thickness is greater than the second thickness.

2. The electromagnetic wave processing device according to claim 1, wherein the level difference is for each photoelectric conversion element.

3. The electromagnetic wave processing device according to claim 1, wherein the level difference is between photoelectric conversion elements and in the interlayer films.

4. The electromagnetic wave processing device according to claim 1, wherein the narrow band filter includes level differences having different sizes for one photoelectric conversion element.

5. The electromagnetic wave processing device according to claim 1, further comprising an antireflection film configured to suppress reflection, wherein the antireflection film is on the level difference.

6. An electromagnetic wave processing device, comprising:
   a photoelectric conversion element;
   a narrow band filter on a light incident surface side of the photoelectric conversion element, wherein
      the narrow band filter is configured to transmit a narrow band light,
      the narrow band filter includes a plurality of holes, and
      the narrow band filter includes a metal;
   an interlayer film between the photoelectric conversion element and the narrow band filter; and
   a plurality of waveguides in the interlayer film, wherein
      the plurality of holes comprises a first group of holes and a second group of holes,
      the first group of holes corresponds to holes that are in a region of the plurality of waveguides, and
      the second group of holes corresponds to holes that are not in the region of the plurality of waveguides.

7. An electromagnetic wave processing device, comprising:
   a photoelectric conversion element;
   a narrow band filter on a light incident surface side of the photoelectric conversion element, wherein
      the narrow band filter is configured to transmit a narrow band light, and
      the narrow band filter includes a metal;
   interlayer films disposed above and below the narrow band filter; and
   an uneven structure on one of the interlayer films that is above the narrow band filter, wherein the one of the interlayer films is in contact with the uneven structure.

8. The electromagnetic wave processing device according to claim 1, wherein the narrow band filter comprises a hole array-type plasmon filter.

9. The electromagnetic wave processing device according to claim 1, wherein the narrow band filter comprises a dot array-type plasmon filter.

10. The electromagnetic wave processing device according to claim 1, wherein the narrow band filter comprises a plasmon filter using guided mode resonant (GMR).

11. The electromagnetic wave processing device according to claim 1, wherein the narrow band filter comprises a plasmon filter having a bullseye structure.

12. The electromagnetic wave processing device according to claim 1, wherein the narrow band filter comprises a Fabry-Perot interferometer.

* * * * *